(12) United States Patent
Li et al.

(10) Patent No.: US 12,328,189 B2
(45) Date of Patent: Jun. 10, 2025

(54) DATA PROCESSING METHOD, APPARATUS, AND DEVICE

(71) Applicant: HUAWEI TECHNOLOGIES CO., LTD., Shenzhen (CN)

(72) Inventors: Bin Li, Shenzhen (CN); Jiaqi Gu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 430 days.

(21) Appl. No.: 17/964,193

(22) Filed: Oct. 12, 2022

(65) Prior Publication Data

US 2023/0030044 A1 Feb. 2, 2023

Related U.S. Application Data

(63) Continuation of application No. PCT/CN2021/082208, filed on Mar. 22, 2021.

(30) Foreign Application Priority Data

Apr. 14, 2020 (CN) .......................... 202010291986.8

(51) Int. Cl.
*H04L 1/00* (2006.01)
*H03M 13/05* (2006.01)

(52) U.S. Cl.
CPC .......... *H04L 1/0057* (2013.01); *H03M 13/05* (2013.01); *H04L 1/0045* (2013.01)

(58) Field of Classification Search
CPC ... H04L 1/0057; H04L 1/0045; H04L 1/0042; H04L 1/0048; H04L 1/0036; H03M 13/05; H03M 13/27; H03M 13/13; H04K 1/06; H04K 1/10; H04B 7/0413
See application file for complete search history.

(56) References Cited

U.S. PATENT DOCUMENTS

| | | | |
|---|---|---|---|
| 11,165,445 B2 * | 11/2021 | Blankenship | H03M 13/098 |
| 12,176,916 B2 * | 12/2024 | Wu | H04W 72/20 |
| 2018/0054218 A1 | 2/2018 | Qian et al. | |
| 2019/0394673 A1 * | 12/2019 | Hwang | H04W 28/06 |
| 2020/0228236 A1 * | 7/2020 | Xi | H04L 1/0057 |
| 2020/0321986 A1 * | 10/2020 | Hui | H03M 13/6362 |

FOREIGN PATENT DOCUMENTS

| | | |
|---|---|---|
| CN | 101741517 A | 6/2010 |
| CN | 102377518 A | 3/2012 |
| CN | 104782070 B | 5/2018 |
| CN | 108242968 A | 7/2018 |
| CN | 108270509 A | 7/2018 |
| CN | 108270515 A | 7/2018 |
| CN | 109586858 A | 4/2019 |
| CN | 109728877 A | 5/2019 |

* cited by examiner

Primary Examiner — Jung H Park
(74) Attorney, Agent, or Firm — Maier & Maier, PLLC

(57) ABSTRACT

A data processing method, an apparatus, and a device. The data processing method may be performed by a first communication device, and the first communication device is a transmit end of encoded data. When simultaneously sending one or more data streams, the first communication device places information bits in a data stream in a specified order. A plurality of data streams may be arranged in a specified order, so that joint encoding without feeding back information can be implemented, and transmission close to a channel capacity can be implemented.

20 Claims, 21 Drawing Sheets

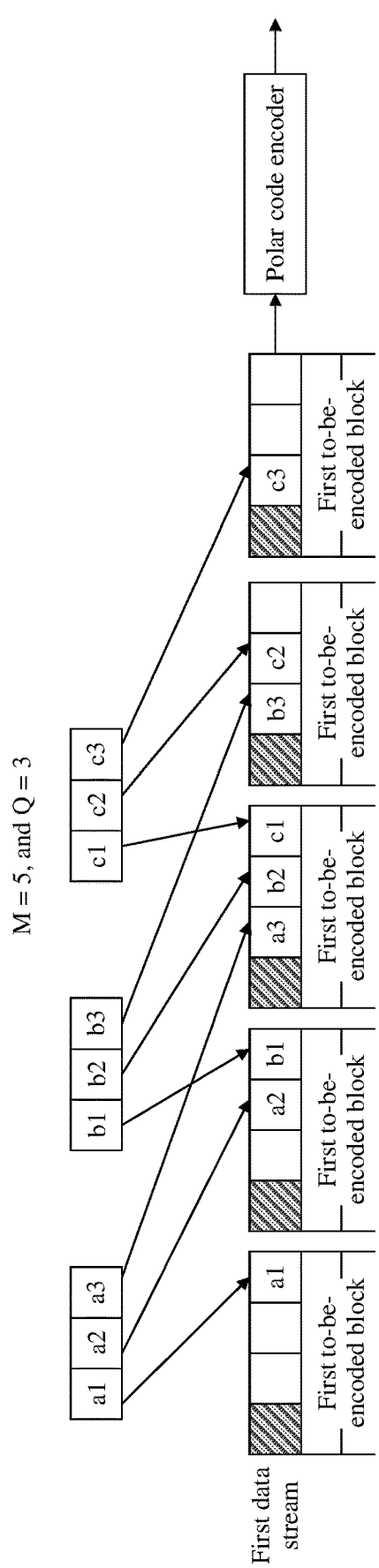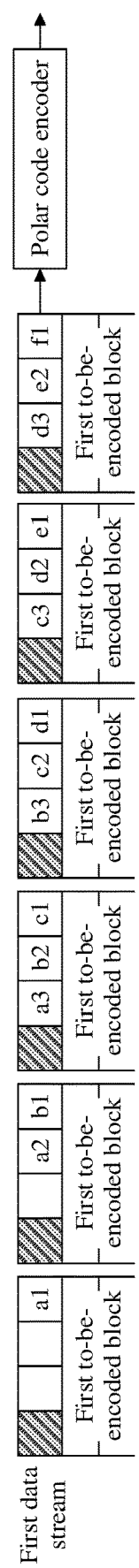
FIG. 6a
FIG. 6b

DATA PROCESSING METHOD, APPARATUS, AND DEVICE

CROSS-REFERENCE TO RELATED APPLICATIONS

This application is a continuation of International Patent Application No. PCT/CN2021/082208, filed on Mar. 22, 2021, which claims priority to Chinese Patent Application No. 202010291986.8, filed on Apr. 14, 2020. The disclosures of the aforementioned applications are hereby incorporated by reference in their entireties.

TECHNICAL FIELD

The embodiments relate to the field of communication technologies, a data processing method, an apparatus, and a device.

BACKGROUND

In a communication system, because a radio channel has a problem of signal fading, a receive end of a radio signal may fail to correctly decode received information, and therefore cannot obtain accurate information. In a multiple-input multiple-output (MIMO) technology, a plurality of antennas is disposed at both a transmit end and a receive end. The plurality of antennas is used to separately and independently transmit a signal at the transmit end and receive and restore original information at the receive end. The MIMO technology can greatly improve a channel capacity and effectively improve spectral efficiency. However, to achieve the MIMO channel capacity, the receive end needs to feed back information (such as code rate information and signal-to-noise ratio information) about each information stream to the transmit end. However, the feedback information may have an error, and an amount of MIMO feedback is also very large.

SUMMARY

The embodiments may provide a data processing method, an apparatus, and a device. The data processing method helps implement transmission close to a channel capacity and does not need to feed back information of each information stream.

According to a first aspect, an embodiment may provide a data processing method. The data processing method may be performed by a first communication device. The first communication device may be a transmit end of encoded data. The first communication device may obtain X information bit blocks. One information bit block includes K information bits, one information bit block is divided into Q information bit subblocks, and one information bit subblock is a binary sequence whose length is K/Q. The first communication device places the Q information bit subblocks in each of the information bit blocks into Q first to-be-encoded blocks of M first to-be-encoded blocks in a first order. The first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located. The first communication device separately performs polar code encoding on the M first to-be-encoded blocks, to obtain M first encoded blocks. The M first encoded blocks form a first data stream.

The first communication device places the Q information bit subblocks in each of the information bit blocks into Q second to-be-encoded blocks of M second to-be-encoded blocks in a second order. The second order and the first order meet a mapping relationship. A second communication device separately performs polar code encoding on the M second to-be-encoded blocks, to obtain M second encoded blocks. The M second encoded blocks form a second data stream. After obtaining the first data stream and the second data stream, the first communication device may simultaneously send the first data stream and the second data stream to the second communication device.

The first communication device may simultaneously send the first data stream and the second data stream to the second communication device. A plurality of information bit subblocks in the M first encoded blocks in the first data stream are arranged in the first order. A plurality of information bit subblocks in the M second encoded blocks in the second data stream are arranged in the second order. The second order and the first order meet a mapping relationship.

The second order may be that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located. It may be understood that for an information bit subblock in each information bit block, the second order is a reverse order of the first order. The information bit subblocks in the second to-be-encoded block are arranged in the second order, so that the first communication device can implement joint encoding between the first data stream and the second data stream, and feedback can be removed.

the first order and the second order may meet the following mapping relationship:

$$[A_1, A_2, \ldots, A_{2^P}] = [0, 0, \ldots, 0, a_1, a_2, \ldots, a_Q] F^{\otimes(J+P)},$$

where $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q=2^J$, P is a positive integer and meets $2^{P-1} \leq Q \leq 2^P$, and t meets $1 \leq t \leq 2^P$.

For an order of information bit subblocks in each information bit block, the second order is obtained by mapping the first order based on the mapping relationship. The mapping relationship may be obtained by mapping the first order based on a polar code generator matrix, to implement joint encoding between the first data stream and the second data stream and remove feedback.

The first communication device may further place the Q information bit subblocks in each of the information bit blocks into Q third to-be-encoded blocks of M third to-be-encoded blocks in a second order. The second order used for the third to-be-encoded blocks is different from the second order used for the second to-be-encoded blocks. Then, the first communication device separately performs polar code encoding on the M third to-be-encoded blocks, to obtain M third encoded blocks. The M third encoded blocks form a third data stream. The first communication device may simultaneously send the first data stream, the second data stream, and the third data stream to the second communication device.

When the first communication device simultaneously sends three data streams to the second communication device, information bit subblocks in the three data streams are sorted. The first communication device may implement joint encoding between the first data stream, the second data stream, and the third data stream, and may remove feedback.

The first communication device may further map the Q information bit subblocks in each information bit block from a binary field to a $2^w$ number system field, and obtain any mapped information bit block $[\bar{a}_1, \bar{a}_2, \ldots, \bar{a}_Q]$. $\bar{a}^q$ is any information bit subblock in the any mapped information bit block, $\bar{a}^q$ is a sequence whose length is K/wQ, and w is a positive integer greater than 1.

The first communication device converts Q information bit subblocks in each mapped information bit block. Q information bit subblocks in any mapped information bit block and corresponding Q information bit subblocks after conversion meet the following relationship:

$$[\bar{A}_{n,1}, \bar{A}_{n,2}, \ldots, \bar{A}_{n,Q}] = [\bar{a}_1, \bar{a}_2, \ldots, \bar{a}_Q] * H_n, \text{ where}$$

$\bar{A}_{n,q}$ is an information bit subblock corresponding to $\bar{a}_q$ after conversion, $H_n$ is a universal decoding matrix UDM of K/w×K/w in the $2^w$ number system field, n indicates an $n^{th}$ data stream, n meets n∈[1, 2, ..., N], N is a total quantity of data streams sent by the first communication device, and N is a positive integer greater than 3.

The first communication device performs demapping on $[\bar{A}_{n,1}, \bar{A}_{n,2}, \ldots, \bar{A}_{n,Q}]$, to obtain an information bit block that is $[A_{n,1}, A_{n,2}, \ldots, A_{n,Q}]$ and that corresponds to $[\bar{A}_{n,1}, \bar{A}_{n,2}, \ldots, \bar{A}_{n,Q}]$ after demapping. $A_{n,Q}$ is a binary sequence whose length is K/Q.

The first communication device places Q information bit subblocks in any demapped information bit block into M $n^{th}$ to-be-encoded blocks in the first order.

The first communication device separately performs polar code encoding on the M $n^{th}$ to-be-encoded blocks, to obtain M $n^{th}$ encoded blocks. The M $n^{th}$ encoded blocks form an $n^{th}$ data stream. The first communication device may simultaneously send the first data stream and the second data stream to the $n^{th}$ data stream to the second communication device.

When the first communication device simultaneously sends more than three data streams, because the more than three data streams need to be simultaneously sent in a multi number system field, the first communication device needs to correspondingly process a plurality of information bit subblocks in the M $n^{th}$ to-be-encoded blocks, and then encode the M $n^{th}$ to-be-encoded blocks, to obtain the $n^{th}$ data stream.

Any encoded block may carry at least one information bit subblock and at most Q information bit subblocks and the encoded block may include the first encoded block and the second encoded block.

Each of the encoded blocks may be sequentially arranged based on identifiers of the encoded blocks and a $1^{st}$ encoded block may carry one information bit subblock. A quantity of information bit blocks carried in the $1^{st}$ encoded block to a $Q^{th}$ encoded block increases by one in an arrangement order of the encoded blocks, and the $Q^{th}$ encoded block carries Q information bit subblocks. A quantity of information bit subblocks carried in a $(Q+1)^{th}$ encoded block to an $M^{th}$ encoded block decreases by one in the arrangement order of the encoded blocks, and the $M^{th}$ encoded block carries one information bit subblock.

When a code rate loss is not considered, a quantity of information bit subblocks carried in an encoded block sequentially increases from 1 to Q, and then decreases from Q to 1. In this arrangement manner, the M encoded blocks may carry the complete X information bit blocks.

Q may be a quantization order of a code rate R and Q may be a positive integer. A code rate of an $i^{th}$ encoded block is $r_i = i \times R/Q$, and i meets $1 \le i \le Q$. A code rate of a $j^{th}$ encoded block is $r_j = (M-j+1) \times R/Q$, and j meets $Q+1 \le j \le M$. It can be understood that when a code rate loss is not considered, the code rate of the encoded block gradually increases from R/Q to R and then gradually decreases from R to R/Q.

According to a second aspect, an embodiment may provide a data processing method. The method may be performed by a second communication device. The second communication device may be a receive end of encoded data. The second communication device receives a first data stream and a second data stream that are simultaneously sent by a first communication device. The first data stream includes M first encoded blocks, and the second data stream includes M second encoded blocks. The second communication device may perform combined decoding on the first data stream and the second data stream that are received, to obtain decoded data.

The M first encoded blocks are obtained by performing polar code encoding on M first to-be-encoded blocks. The M first to-be-encoded blocks carry X information bit blocks, and each of the information bit blocks is divided into Q information bit subblocks. The Q information bit subblocks in each of the information bit blocks are placed into Q first to-be-encoded blocks of the M first to-be-encoded blocks in a first order. The first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located.

The M second encoded blocks are obtained by performing polar code encoding on M second to-be-encoded blocks. The Q information bit subblocks in each of the information bit blocks are placed into Q second to-be-encoded blocks of the M second to-be-encoded blocks in a second order. The second order and the first order meet a mapping relationship.

The second communication device may simultaneously receive the first data stream and the second data stream that are sent by the first communication device. A plurality of information bit subblocks in the first data stream are arranged in the first order. A plurality of information bit subblocks in the second data stream are arranged in the second order. The second order and the first order meet a mapping relationship. This helps the second communication device correctly decode the first data stream and the second data stream.

The second order may be that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

The first order and the second order may meet the following mapping relationship:

$$[A_1, A_2, \ldots, A_{2^P}] = [0, 0, \ldots, 0, a_1, a_2, \ldots, a_Q] F^{\otimes (J+P)},$$
where $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q=2^J$, P is a positive integer and meets $2^{P-1} \le Q \le 2^P$, and t meets $1 \le t \le 2^P$.

The second communication device may be configured to perform combined decoding on the first data stream and the second data stream to obtain decoded data and may include:

The second communication device obtains a first target data stream if a sum of channel capacities of the first data stream and the second data stream is greater than or equal to a code rate R. The first target data stream is a data stream with a highest signal-to-noise ratio in a first to-be-decoded data stream, and the first to-be-decoded data stream includes the first data stream and the second data stream.

The second communication device obtains, through decoding, $k_1$ information bit subblocks $[a_1, a_2, \ldots, a_{k_1}]$ in one information bit block included in the first target data stream, where $k_1$ meets $1 \leq k_1 \leq Q$.

The second communication device obtains first reconstructed information obtained after encoding and reconstructing the $k_1$ information bit subblocks $[a_1, a_2, \ldots, a_{k_1}]$.

The second communication device removes the first reconstructed information from the first to-be-decoded data stream.

The second communication device obtains, through decoding, $k_2$ information bit subblocks $[a_{Q-k_2}, a_{Q-k_2+1}, \ldots, a_Q]$ in the information bit block included in a second target data stream, where $k_1$ and $k_2$ meet $1 \leq k_2 \leq Q$ and $k_1 + k_2 \geq Q$. The second target data stream is a data stream with a lowest signal-to-noise ratio in the first to-be-decoded data stream.

The second communication device obtains Q information bit subblocks that are $[a_1, a_2, \ldots, a_Q]$ and that are included in the information bit block.

When performing combined decoding on the first data stream and the second data stream that are received simultaneously, the second communication device needs to detect and sort the two data streams, and preferentially process a data stream with a higher signal-to-noise ratio. Because the first encoded block and the second encoded block are arranged in the first order and the second order respectively, the second communication device can implement correct decoding by performing decoding twice.

The second communication device may be configured to receive the first data stream and the second data stream that are simultaneously sent by the first communication device and may include:

receiving the first data stream, the second data stream, and a third data stream that are simultaneously sent by the first communication device, where the third data stream includes M third encoded blocks, the M third encoded blocks are obtained by performing polar code encoding on M third to-be-encoded blocks, the Q information bit subblocks in each of the information bit blocks are placed into Q third to-be-encoded blocks of the M third to-be-encoded blocks in a second order, and the second order used for the third to-be-encoded blocks is different from the second order used for the second to-be-encoded blocks.

The second communication device may be configured to perform combined decoding on the first data stream and the second data stream to obtain decoded data and may include:

obtaining a first target data stream if a sum of channel capacities of the first data stream, the second data stream, and the third data stream is greater than or equal to a code rate R, where the first target data stream is a data stream with a highest signal-to-noise ratio in a first to-be-decoded data stream, and the first to-be-decoded data stream includes the first data stream, the second data stream, and the third data stream;

obtaining, through decoding, $k_1$ information bit subblocks $[a_1, a_2, \ldots, a_{k_1}]$ in one information bit block included in the first target data stream, where $k_1$ meets $1 \leq k < Q$;

obtaining first reconstructed information obtained after encoding and reconstructing the $k_1$ information bit subblocks $[a_1, a_2, \ldots, a_{k_1}]$;

obtaining a second to-be-decoded data stream, where the second to-be-decoded data stream is a data stream obtained after the first reconstructed information is removed from the first to-be-decoded data stream;

obtaining, through decoding, $k_2$ information bit subblocks $[a_Q, a_{Q-1}, \ldots, a_{Q-k_2+1}]$ in the information bit block included in a second target data stream, where $k_1$ and $k_2$ meet $k_1 + k_2 < Q$, and the second target data stream is a data stream with a second highest signal-to-noise ratio in the first to-be-decoded data stream;

obtaining second reconstructed information obtained after encoding and reconstructing the $k_2$ information bit subblocks $[a_Q, a_{Q-1}, \ldots, a_{Q-k_2+1}]$;

removing the second reconstructed information from the second to-be-decoded data stream;

obtaining, through decoding, $k_3$ information bit subblocks $[A_1, A_2, \ldots, A_k]$ in the information bit block included in a third target data stream, where $k_1$, $k_2$, and $k_3$ meet $k_1 + k_2 + k_3 \geq Q$, and the third target data stream is a data stream with a lowest signal-to-noise ratio in the first to-be-decoded data stream;

obtaining, based on the mapping relationship between the first order and the second order, $k_3$ information bit subblocks that are $[a_{k_1+1}, a_{k_1+1}, \ldots, a_{Q-k_2}]$ and that correspond to the $k_3$ information bit subblocks before mapping; and obtaining Q information bit subblocks that are $[a_1, a_2, \ldots, a_Q]$ and that are included in the information bit block.

When performing combined decoding on three data streams received simultaneously, the second communication device needs to detect and sort the three data streams, and preferentially process a data stream with a higher signal-to-noise ratio. When combined decoding is performed, a decoding result obtained each time may be removed from the three data streams as known information. This reduces interference of the known information and helps implement correct decoding.

The second communication device may be configured to receive the first data stream and the second data stream that are simultaneously sent by the first communication device may include:

receiving the first data stream and the second data stream to an $n^{th}$ data stream that are simultaneously sent by the first communication device, where the $n^{th}$ data stream includes M $n^{th}$ encoded blocks, and the M $n^{th}$ encoded blocks are obtained by performing polar code encoding on M $n^{th}$ to-be-encoded blocks, Q information bit subblocks in each processed information bit block are placed into Q $n^{th}$ to-be-encoded blocks of the M $n^{th}$ to-be-encoded blocks in the first order.

Processing on each of the information bit blocks meets the following condition:

Q information bit subblocks in each of the information bit blocks are mapped from a binary field to a $2^w$ number system field, any mapped information bit block meets $[\bar{a}_1, \bar{a}_2, \ldots, \bar{a}_Q]$, where $\bar{a}_q$ is any information bit subblock in the any mapped information bit block, $\bar{a}_q$ is a $2^w$ number system sequence whose length is K/wQ, and w is a positive integer greater than 1.

The any mapped information bit block and a corresponding information bit block after conversion meet the following relationship:

$$[\bar{A}_{n,1}, \bar{A}_{n,2}, \ldots, \bar{A}_{n,Q}] = [\bar{a}_1, \bar{a}_2, \ldots, \bar{a}_Q] * H_n, \text{ where}$$

$\bar{A}_{n,q}$ is an information bit subblock corresponding to $\bar{a}_q$ after conversion, $H_n$ is a universal decoding matrix UDM of K/w×K/w in the $2^w$ number system field, n indicates an $n^{th}$ data stream, n meets $n \in [1, 2, \ldots, N]$, N is a total quantity of data streams sent by the first communication device, and N is a positive integer greater than 3.

A corresponding information bit block after $[\overline{A}_{n,1}, \overline{A}_{n,2}, \ldots, \overline{A}_{n,Q}]$ is demapped meets $[A_{n,1}, A_{n,2}, \ldots, A_{n,Q}]$, where $A_{n,Q}$ is a binary sequence whose length is K/Q.

When the first communication device simultaneously sends more than three data streams, because the more than three data streams need to be simultaneously sent in a multi number system field, the first communication device needs to correspondingly process a plurality of information bit subblocks in the M $n^{th}$ to-be-encoded blocks, and then encode the M $n^{th}$ to-be-encoded blocks, to obtain the $n^{th}$ data stream.

Any encoded block may carry at least one information bit subblock and at most Q information bit subblocks and the encoded block may include the first encoded block and the second encoded block.

Each of the encoded blocks may be sequentially arranged based on identifiers of the encoded blocks and a $1^{st}$ encoded block may carry one information bit subblock. A quantity of information bit blocks carried in the $1^{st}$ encoded block to a $Q^{th}$ encoded block increases by one in an arrangement order of the encoded blocks, and the $Q^{th}$ encoded block carries Q information bit subblocks. A quantity of information bit subblocks carried in a $(Q+1)^{th}$ encoded block to an $M^{th}$ encoded block decreases by one in the arrangement order of the encoded blocks, and the $M^{th}$ encoded block carries one information bit subblock.

Q may be a quantization order of a code rate R and Q may be a positive integer. A code rate of an $i^{th}$ encoded block is $r_i = i \times R/Q$, and i meets $1 \leq i \leq Q$. A code rate of a $j^{th}$ encoded block is $r_j = (M-j+1) \times R/Q$, and j meets $Q+1 \leq j \leq M$.

According to a third aspect, an embodiment may provide a communication device. The communication device includes a transceiver and a processor.

The transceiver is configured to obtain X information bit blocks. One information bit block includes K information bits, one information bit block is divided into Q information bit subblocks, and one information bit subblock is a binary sequence whose length is K/Q.

The processor is configured to place Q information bit subblocks in each of the information bit blocks into Q first to-be-encoded blocks of M first to-be-encoded blocks in a first order. The first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located, q meets $1 \leq q \leq Q$, and M meets M=X+Q−1.

The processor is further configured to separately perform polar code encoding on the M first to-be-encoded blocks, to obtain M first encoded blocks.

The processor is further configured to place the Q information bit subblocks in each of the information bit blocks into Q second to-be-encoded blocks of M second to-be-encoded blocks in a second order. The second order and the first order meet a mapping relationship.

The processor is further configured to separately perform polar code encoding on the M second to-be-encoded blocks, to obtain M second encoded blocks.

The transceiver is further configured to simultaneously send a first data stream and a second data stream to a second communication device. The first data stream includes the M first encoded blocks, and the second data stream includes the M second encoded blocks.

The second order may be that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

The first order and the second order may meet the following mapping relationship:

$$[A_1, A_2, \ldots, A_{2^P}] = [0,0, \ldots, 0, a_1, a_2, \ldots, a_Q] F^{\otimes(J+P)},$$
where $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q = 2^J$, P is a positive integer and meets $2^{P-1} \leq Q \leq 2^P$, and t meets $1 \leq t \leq 2^P$.

The processor may be further configured to:
place the Q information bit subblocks in each of the information bit blocks into Q third to-be-encoded blocks of M third to-be-encoded blocks in a second order, where the second order used for the third to-be-encoded blocks is different from the second order used for the second to-be-encoded blocks; and separately perform polar code encoding on the M third to-be-encoded blocks, to obtain M third encoded blocks.

That the transceiver is configured to simultaneously send a first data stream and a second data stream to a second communication device may include:
simultaneously sending the first data stream, the second data stream, and a third data stream to the second communication device, where the third data stream includes the M third encoded blocks.

The processor may be further configured to:
map the Q information bit subblocks in each of the information bit blocks from a binary field to a $2^w$ number system field, to obtain any mapped information bit block $[\bar{a}_1, \bar{a}_2, \ldots, \bar{a}_Q]$, where $\bar{a}_q$ is any information bit subblock in the any mapped information bit block, $\bar{a}_q$ is a sequence whose length is K/wQ, and w is a positive integer greater than 1;

convert Q information bit subblocks in each mapped information bit block, where Q information bit subblocks in any mapped information bit block and corresponding Q information bit subblocks after conversion meet the following relationship:

$$[\overline{A}_{n,1}, \overline{A}_{n,2}, \ldots, \overline{A}_{n,Q}] = [\bar{a}_1, \bar{a}_2, \ldots, \bar{a}_Q] * H_n, \text{ where}$$

$\overline{A}_{n,q}$ is an information bit subblock corresponding to $\bar{a}_q$ after conversion, $H_n$ is a universal decoding matrix UDM of K/w×K/w in the $2^w$ number system field, and n indicates an $n^{th}$ data stream;

perform demapping on $[\overline{A}_{n,1}, \overline{A}_{n,2}, \ldots, \overline{A}_{n,Q}]$, to obtain an information bit block that is $[A_{n,1}, A_{n,2}, \ldots, A_{n,Q}]$ and that corresponds to $[\overline{A}_{n,1}, \overline{A}_{n,2}, \ldots, \overline{A}_{n,Q}]$ after demapping, where $A_{n,Q}$ is a binary sequence whose length is K/Q;

place Q information bit subblocks in any demapped information bit block into M $n^{th}$ to-be-encoded blocks in the first order, where n meets $n \in [1, 2, \ldots, N]$, N is a total quantity of data streams sent by the first communication device, and N is a positive integer greater than 3; and separately perform polar code encoding on the M $n^{th}$ to-be-encoded blocks, to obtain M $n^{th}$ encoded blocks.

The transceiver may be configured to simultaneously send a first data stream and a second data stream to a second communication device and may include:
simultaneously sending the first data stream and the second data stream to the $n^{th}$ data stream to the second communication device, where the $n^{th}$ data stream includes the M $n^{th}$ encoded blocks.

Any encoded block may carry at least one information bit subblock and at most Q information bit subblocks, and the encoded block may include the first encoded block and the second encoded block.

Each of the encoded blocks may be sequentially arranged based on identifiers of the encoded blocks and a $1^{st}$ encoded block may carry one information bit subblock. A quantity of information bit blocks carried in the $1^{st}$ encoded block to a $Q^{th}$ encoded block increases by one in an arrangement order of the encoded blocks, and the $Q^{th}$ encoded block carries Q information bit subblocks. A quantity of information bit subblocks carried in a $(Q+1)^{th}$ encoded block to an $M^{th}$ encoded block decreases by one in the arrangement order of the encoded blocks, and the $M^{th}$ encoded block carries one information bit subblock.

Q may be a quantization order of a code rate R and Q may be a positive integer. A code rate of an $i^{th}$ encoded block is $r_i=i \times R/Q$, and i meets $1 \leq i \leq Q$. A code rate of a $j^{th}$ encoded block is $r_j=(M-j+1) \times R/Q$, and j meets $Q+1 \leq j \leq M$.

According to a fourth aspect, an embodiment may provide a communication device. The communication device includes a transceiver and a processor.

The transceiver is configured to receive a first data stream and a second data stream that are simultaneously sent by a first communication device. The first data stream includes M first encoded blocks, and the second data stream includes M second encoded blocks.

The M first encoded blocks are obtained by performing polar code encoding on M first to-be-encoded blocks. The M first to-be-encoded blocks carry X information bit blocks, and each of the information bit blocks is divided into Q information bit subblocks. The Q information bit subblocks in each of the information bit blocks are placed into Q first to-be-encoded blocks of the M first to-be-encoded blocks in a first order. The first order is that a $q^{th}$ information bit subblock in each of the information bit blocks is located at a $(q-1)*K/Q+1$th reliable location to a $q*K/Q^{th}$ reliable location in a first to-be-encoded block in which the $q^{th}$ information bit subblock is located, q meets $1 \leq q \leq Q$, and M meets $M=X+Q-1$.

The M second encoded blocks are obtained by performing polar code encoding on M second to-be-encoded blocks. The Q information bit subblocks in each of the information bit blocks are placed into Q second to-be-encoded blocks of the M second to-be-encoded blocks in a second order. The second order and the first order meet a mapping relationship.

The processor is configured to perform combined decoding on the first data stream and the second data stream, to obtain decoded data.

The second order may be that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

The first order and the second order may meet the following mapping relationship:

$$[A_1, A_2, \ldots, A_{2^P}] = [0, 0, \ldots, 0, a_1, a_2, \ldots, a_Q] F^{\otimes(J+P)},$$

where $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q=2^J$, P is a positive integer and meets $2^{P-1} \leq Q \leq 2^P$, and t meets $1 \leq t \leq 2^P$.

The processor may be configured to perform combined decoding on the first data stream and the second data stream to obtain decoded data and may include:

obtaining a first target data stream if a sum of channel capacities of the first data stream and the second data stream is greater than or equal to a code rate R, where the first target data stream is a data stream with a highest signal-to-noise ratio in a first to-be-decoded data stream, and the first to-be-decoded data stream includes the first data stream and the second data stream;

obtaining, through decoding, $k_1$ information bit subblocks $[a_1, a_2, \ldots, a_{k_1}]$ in one information bit block included in the first target data stream, where $k_1$ meets $1 \leq k_1 \leq Q$;

obtaining first reconstructed information obtained after encoding and reconstructing the $k_1$ information bit subblocks $[a_1, a_2, \ldots, a_{k_1}]$;

removing the first reconstructed information from the first to-be-decoded data stream;

obtaining, through decoding, $k_2$ information bit subblocks $[a_{Q-k_2}, a_{Q-k_2+1}, \ldots, a_Q]$ in the information bit block included in a second target data stream, where $k_1$ and $k_2$ meet $1 \leq k_2 \leq Q$ and $k_1+k_2 \geq Q$, and the second target data stream is a data stream with a lowest signal-to-noise ratio in the first to-be-decoded data stream; and obtaining Q information bit subblocks that are $[a_1, a_2, \ldots, a_Q]$ and that are included in the information bit block.

The transceiver may be configured to receive the first data stream and the second data stream that are simultaneously sent by the first communication device and may include:

receiving the first data stream, the second data stream, and a third data stream that are simultaneously sent by the first communication device, where the third data stream includes M third encoded blocks, the M third encoded blocks are obtained by performing polar code encoding on M third to-be-encoded blocks, the Q information bit subblocks in each of the information bit blocks are placed into Q third to-be-encoded blocks of the M third to-be-encoded blocks in a second order, and the second order used for the third to-be-encoded blocks is different from the second order used for the second to-be-encoded blocks.

The processor may be configured to perform combined decoding on the first data stream and the second data stream to obtain decoded data and may include:

obtaining a first target data stream if a sum of channel capacities of the first data stream, the second data stream, and the third data stream is greater than or equal to a code rate R, where the first target data stream is a data stream with a highest signal-to-noise ratio in a first to-be-decoded data stream, and the first to-be-decoded data stream includes the first data stream, the second data stream, and the third data stream;

obtaining, through decoding, $k_1$ information bit subblocks $[a_1, a_2, \ldots, a_{k_1}]$ in one information bit block included in the first target data stream, where $k_1$ meets $1 \leq k_1 < Q$;

obtaining first reconstructed information obtained after encoding and reconstructing the $k_1$ information bit subblocks $[a_1, a_2, \ldots, a_{k_1}]$;

obtaining a second to-be-decoded data stream, where the second to-be-decoded data stream is a data stream obtained after the first reconstructed information is removed from the first to-be-decoded data stream;

obtaining, through decoding, $k_2$ information bit subblocks $[a_Q, a_{Q-1}, \ldots, a_{Q-k_2+1}]$ in the information bit block included in a second target data stream, where $k_1$ and $k_2$ meet $k_1+k_2 < Q$, and the second target data stream is a data stream with a second highest signal-to-noise ratio in the first to-be-decoded data stream;

obtaining second reconstructed information obtained after encoding and reconstructing the $k_2$ information bit subblocks $[a_Q, a_{Q-1}, \ldots, a_{Q-k_2+1}]$;

removing the second reconstructed information from the second to-be-decoded data stream;

obtaining, through decoding, $k_3$ information bit subblocks $[A_1, A_2, \ldots, A_{k_3}]$ in the information bit block included in a third target data stream, where $k_1$, $k_2$, and $k_3$ meet $k_1+k_2+k_3 \geq Q$, and the third target data stream is a data stream with a lowest signal-to-noise ratio in the first to-be-decoded data stream;

obtaining, based on the mapping relationship between the first order and the second order, $k_3$ information bit subblocks that are $[a_{k_1+1}, a_{k_1+1}, \ldots, a_{Q-k_2}]$ and that correspond to the $k_3$ information bit subblocks before mapping; and obtaining Q information bit subblocks that are $[a_1, a_2, \ldots, a_Q]$ and that are included in the information bit block.

The transceiver may be configured to receive the first data stream and the second data stream that are simultaneously sent by the first communication device and may include:

receiving the first data stream and the second data stream to an $n^{th}$ data stream that are simultaneously sent by the first communication device, where the $n^{th}$ data stream includes M $n^{th}$ encoded blocks, and the M $n^{th}$ encoded blocks are obtained by performing polar code encoding on M $n^{th}$ to-be-encoded blocks, Q information bit subblocks in each processed information bit block are placed into Q $n^{th}$ to-be-encoded blocks of the M $n^{th}$ to-be-encoded blocks in the first order.

Processing on each of the information bit blocks meets the following condition:

Q information bit subblocks in each of the information bit blocks are mapped from a binary field to a $2^w$ number system field, any mapped information bit block meets $[\bar{a}_1, \bar{a}_2, \ldots, \bar{a}_Q]$, where $\bar{a}_q$ is any information bit subblock in the any mapped information bit block, $\bar{a}_q$ is a $2^w$ number system sequence whose length is K/wQ, and w is a positive integer greater than 1.

The any mapped information bit block and a corresponding information bit block after conversion meet the following relationship:

$[\bar{A}_{n,1}, \bar{A}_{n,2}, \ldots, \bar{A}_{n,Q}] = [\bar{a}_1, \bar{a}_2, \ldots, \bar{a}_Q]*H_n$, where $\bar{A}_{n,q}$ is an information bit subblock corresponding to $\bar{a}_q$ after conversion, $H_n$ is a universal decoding matrix UDM of K/w×K/w in the $2^w$ number system field, n indicates an $n^{th}$ data stream, n meets $n \in [1, 2, \ldots, N]$, N is a total quantity of data streams sent by the first communication device, and N is a positive integer greater than 3.

A corresponding information bit block after $[\bar{A}_{n,1}, \bar{A}_{n,2}, \ldots, \bar{A}_{n,Q}]$ is demapped meets $[A_{n,1}, A_{n,2}, \ldots, A_{n,Q}]$, where $A_{n,Q}$ is a binary sequence whose length is K/Q.

Any encoded block may carry at least one information bit subblock and at most Q information bit subblocks, and the encoded block may include the first encoded block and the second encoded block.

Each of the encoded blocks may be sequentially arranged based on identifiers of the encoded blocks and a $1^{st}$ encoded block may carry one information bit subblock. A quantity of information bit blocks carried in the $1^{st}$ encoded block to a $Q^{th}$ encoded block increases by one in an arrangement order of the encoded blocks, and the $Q^{th}$ encoded block carries Q information bit subblocks. A quantity of information bit subblocks carried in a $(Q+1)^{th}$ encoded block to an $M^{th}$ encoded block decreases by one in the arrangement order of the encoded blocks, and the $M^{th}$ encoded block carries one information bit subblock.

Q may be a quantization order of a code rate R and Q may be a positive integer. A code rate of an $i^{th}$ encoded block is $r_i = i \times R/Q$, and i meets $1 \leq i \leq Q$. A code rate of a $j^{th}$ encoded block is $r_j = (M-j+1) \times R/Q$, and j meets $Q+1 \leq j \leq M$.

According to a fifth aspect, an embodiment may provide a communication device. The device has a function of implementing the data processing method provided in the first aspect. The function may be implemented by hardware or may be implemented by hardware executing corresponding software. The hardware or the software includes one or more modules corresponding to the function.

According to a sixth aspect, an embodiment may provide a communication device. The device has a function of implementing the data processing method provided in the second aspect. The function may be implemented by hardware or may be implemented by hardware executing corresponding software. The hardware or the software includes one or more modules corresponding to the function.

According to a seventh aspect, an embodiment may provide a communication system. The communication system includes the communication device provided in the second aspect or the fifth aspect and the communication device provided in the third aspect or the sixth aspect.

According to an eighth aspect, an embodiment may provide a computer-readable storage medium. The readable storage medium includes a program or instructions. When the program is run or the instructions are run on a computer, the computer is enabled to perform the method in any one of the first aspect or the possible implementations of the first aspect.

According to a ninth aspect, an embodiment may provide a computer-readable storage medium. The readable storage medium includes a program or instructions. When the program is run or the instructions are run on a computer, the computer is enabled to perform the method in any one of the second aspect or the possible implementations of the second aspect.

According to a tenth aspect, an embodiment may provide a chip or a chip system. The chip or the chip system includes at least one processor and an interface. The interface is interconnected to the at least one processor through a line. The at least one processor is configured to run a computer program or instructions, to perform the method described in any one of the first aspect or the possible implementations of the first aspect.

According to an eleventh aspect, an embodiment may provide a chip or a chip system. The chip or the chip system includes at least one processor and an interface. The interface is interconnected to the at least one processor through a line. The at least one processor is configured to run a computer program or instructions, to perform the method described in any one of the second aspect or the possible implementations of the second aspect.

The interface in the chip may be an input/output interface, a pin, a circuit, or the like.

The chip system in the foregoing aspects may be a system-on-chip (SOC), a baseband chip, or the like. The baseband chip may include a processor, a channel encoder, a digital signal processor, a modem, an interface module, and the like.

In a possible implementation, the chip or the chip system may further include at least one memory that may store instructions. The memory may be a storage unit inside the chip, for example, a register or a cache, or may be a storage unit (for example, a read-only memory or a random access memory) of the chip.

According to a twelfth aspect, an embodiment may provide a computer program or a computer program product, including code or instructions. When the code is run or the instructions are run on a computer, the computer is enabled to perform the method in any one of the first aspect or the possible implementations of the first aspect.

According to a thirteenth aspect, an embodiment may provide a computer program or a computer program product, including code or instructions. When the code is run or the instructions are run on a computer, the computer is enabled to perform the method in any one of the second aspect or the possible implementations of the second aspect.

BRIEF DESCRIPTION OF THE DRAWINGS

FIG. 6a to FIG. 6e are a schematic diagram of first to-be-encoded blocks at quantization orders of different code rates according to an embodiment;

DETAILED DESCRIPTION OF THE EMBODIMENTS

The following describes the embodiments with reference to the accompanying drawings.

Polar code is a channel encoding scheme that is strictly proved to reach a channel capacity. The polar code features high performance, low complexity, a flexible matching manner, and the like. Currently, the polar code has been determined as an uplink and/or downlink control channel encoding scheme in a 5th generation mobile communication (5G) control channel enhanced mobile broadband (eMBB) scenario.

Figure 1:
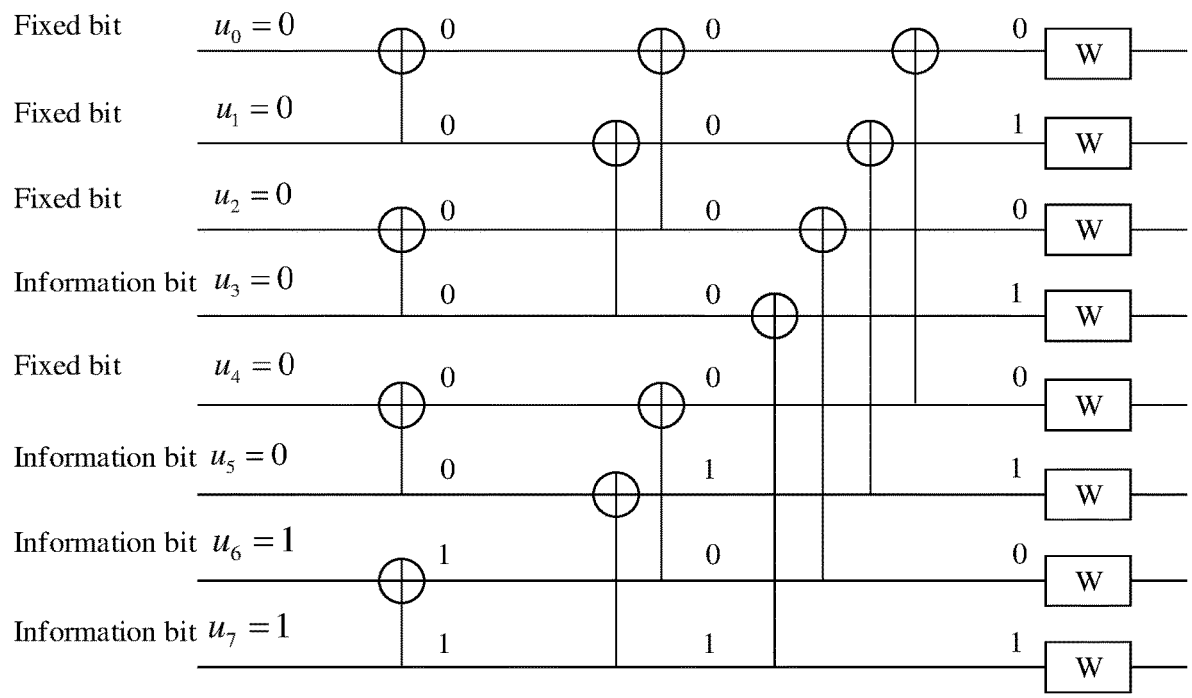
FIG. 1 is a schematic diagram of 8×8 polar code encoding.

FIG. 1 is a schematic diagram of 8×8 polar code encoding. To-be-encoded bits are sorted based on respective reliabilities and are sequentially arranged at different locations in a to-be-encoded block. Generally, a bit with high reliability is set as an information bit (data), and a bit with low reliability is set as a fixed (frozen) bit. A value of the fixed bit is usually set to 0 and is known to both a transmit end and a receive end during actual transmission. As shown in FIG. 1, $u_7$, $u_6$, $u_5$, $u_3$ are four bits with higher reliability and are set as information bits; and $u_4$, $u_2$, $u_1$, $u_0$ are four bits with lower reliability and are set as fixed bits.

Figure 2:
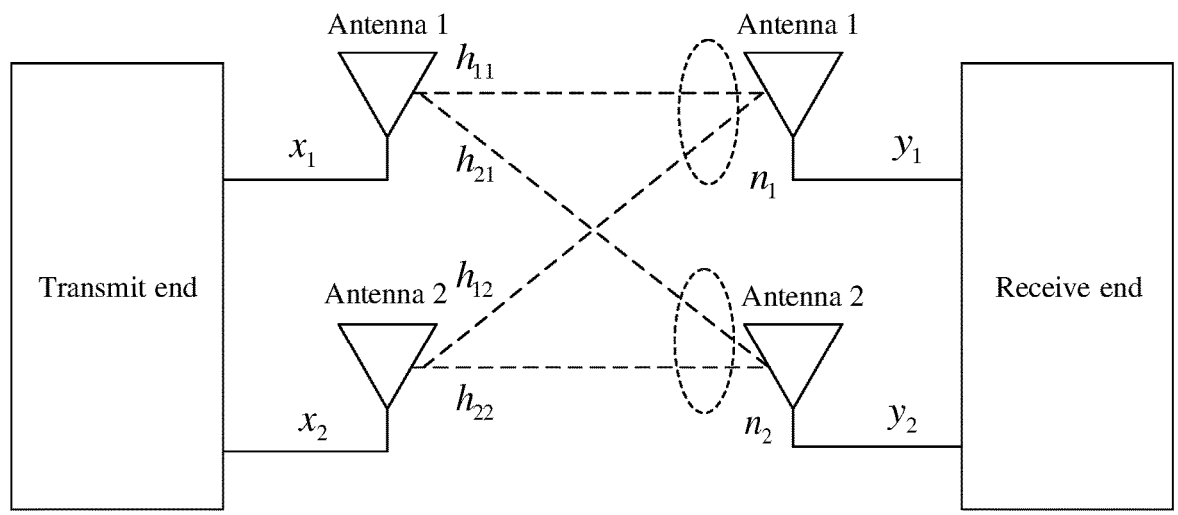
FIG. 2 is a schematic diagram of 2×2 MIMO.

In a MIMO technology, a plurality of antennas is disposed at both a transmit end and a receive end. The plurality of antennas may be used to separately and independently transmit a signal at the transmit end and receive and restore original information at the receive end. The MIMO technology can greatly improve a channel capacity and effectively improve spectral efficiency. FIG. 2 is a schematic diagram of 2×2 MIMO. As shown in FIG. 2, the transmit end (Tx) includes two antennas, and the receive end (Rx) includes two antennas. A mathematical model of the 2×2 MIMO is as follows:

$$\begin{bmatrix} y_1 \\ y_2 \end{bmatrix} = \begin{bmatrix} h_{11} & h_{12} \\ h_{21} & h_{22} \end{bmatrix} \begin{bmatrix} x_1 \\ x_2 \end{bmatrix} + \begin{bmatrix} n_1 \\ n_2 \end{bmatrix},$$

where $$x = \begin{bmatrix} x_1 \\ x_2 \end{bmatrix}$$

is a sending information vector, $$y = \begin{bmatrix} y_1 \\ y_2 \end{bmatrix}$$

is a receiving information vector, $$n = \begin{bmatrix} n_1 \\ n_2 \end{bmatrix}$$

is a noise vector, $$H = \begin{bmatrix} h_{11} & h_{12} \\ h_{21} & h_{22} \end{bmatrix}$$

is a 2×2 channel matrix, and $h_{ij}$ indicates a channel fading coefficient from a transmit antenna i to a receive antenna j. Then, the relationship between the received data and the sent data of the 2×2 MIMO may be represented as:

$$y=Hx+n.$$

It should be noted that the 2×2 MIMO is only an example. A common antenna configuration further includes 1×2, 2×2, 2×4, and 4×4. It is assumed that $M_t$ is a quantity of transmit antennas, and $M_r$ is a quantity of receive antennas. Then, the channel matrix H is a matrix of $M_r \times M_t$.

It should be noted that the MIMO described in this embodiment is a multi-antenna technology used at a transmit end and a receive end. In a broad sense, SISO, SIMO, and MISO are also special cases of MIMO. This is not limited in this embodiment.

Figure 3A:
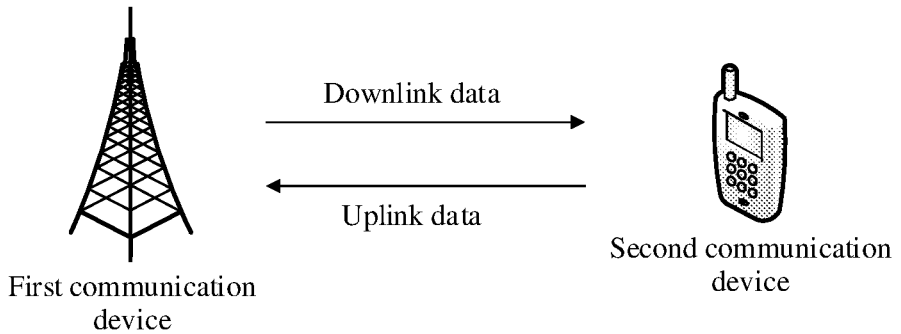
FIG. 3a is a schematic diagram of a communication system according to an embodiment.

FIG. 3a shows a communication system according to an embodiment. The communication system includes a first communication device and a second communication device. The first communication device is a transmit end of encoded data and is configured to send downlink data to the second communication device or receive uplink data from the second communication device. For example, when sending downlink data to the second communication device, the first communication device may perform polar code encoding on a to-be-encoded information bit. After constellation modulation is performed on data obtained after channel encoding, the data may be sent to the second communication device through a downlink data channel.

The second communication device is a receive end of encoded data and is configured to send uplink data to the first communication device or receive downlink data from the first communication device. For example, when sending uplink data to the first communication device, the second communication device may perform polar code encoding on a to-be-encoded information bit. After constellation modulation is performed on data obtained after channel encoding, the data may be sent to the first communication device through an uplink data channel.

The first communication device may be any device having a wireless transceiver function and provides a wireless communication service for the second communication device in a coverage area. The access network device may include, but is not limited to: an evolved NodeB (eNB) in a long-term evolution (LTE) system, a base station (gNB) or a transmission/reception point (TRP) in a new radio access technology (NR), a base station subsequently evolved in 3GPP, an access node in a Wi-Fi system, a wireless relay node, a wireless backhaul node, a device that provides a base station function in Internet of vehicles, D2D communication, and machine-to-machine communication, a satellite, and the like.

The second communication device may be a terminal device having a wireless transceiver function, or the second communication device may be a chip. The terminal device may be user equipment (UE), a mobile phone, a tablet computer (Pad), a computer with a wireless transceiver function, a virtual reality (VR) terminal device, an augmented reality (AR) terminal device, a vehicle-mounted terminal device, a wireless terminal in remote medical, a wireless terminal in a smart grid, a wearable terminal device, or the like.

Figure 3B:
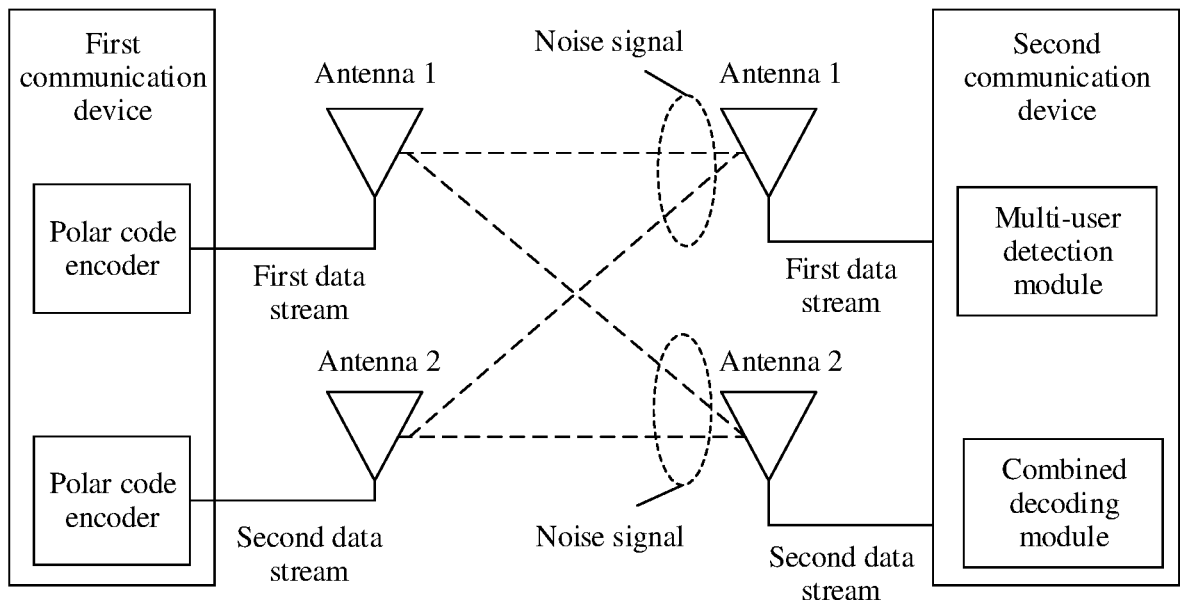
FIG. 3b is a schematic diagram of interaction between a first communication device and a second communication device according to an embodiment.

FIG. 3b is a schematic diagram of interaction of a communication system according to an embodiment. Both a first communication device and a second communication device in this embodiment may use a MIMO technology to simultaneously send or receive a plurality of data streams.

For example, the first communication device simultaneously sends, by using the antenna 1 and the antenna 2, a first data stream and a second data stream to the second communication device. Correspondingly, the second communication device simultaneously receives, by using the antenna 1 and the antenna 2, the first data stream and the second data stream that are sent by the first communication device.

In the communication system shown in FIG. 3b, after receiving the plurality of data streams, the second communication device first needs to detect the plurality of received data streams. For example, a multi-user detection module shown in FIG. 3b is used to detect the plurality of data streams. Then, the detected data streams are decoded. For example, combined decoding is performed by using a combined decoding module shown in FIG. 3b.

A multi-user detection (MUD) technology is a technology that can effectively eliminate multiple access interference (MAI). The technology can resist near-far effect and improve system performance. A principle of the MUD technology includes: based on a conventional detection technology, making full use of information of all users that cause mutual interference, that is, processing a signal of another user other than a specified user as a wanted signal instead of an interference signal, thereby improving performance of detecting the specified user.

A common multi-user detector may include, but is not limited to, a maximum likelihood (ML) detector, a zero forcing (ZF) detector, a minimum mean square error (MMSE) detector, a successive interference cancellation (SIC) detector, a parallel interference cancellation (PIC) detector, an MMSE-SIC detector, an MMSE-PIC detector, and the like.

The MMSE detector can eliminate co-channel interference to a maximum extent without enhancing background noise. A basic principle of the MMSE detector is as follows: A mean square value of an error between a transmit signal of a specified user and an estimated signal of a receive end corresponding to the transmit signal is minimized.

The SIC detector is configured to perform multi-user interference cancellation, and a basic principle includes:

Signal-to-noise ratios (SNR) of signals in the received information are sorted, to obtain information about a user with a highest SNR. In addition, information about other users is used as noise, and the information about the user with the highest SNR is detected by using a detector. Then, the detected information about the user with the highest SNR is reconstructed, to obtain first reconstructed information, and the first reconstructed information is removed from the received information.

Information of a user with a second highest SNR during sorting is obtained, information of other users is used as noise, and the information of the user with the second highest SNR is detected by using the detector. Then, the detected information about the user with the second highest SNR is reconstructed, to obtain second reconstructed information, and the second reconstructed information is removed from the received information. It should be noted that both the first reconstructed information and the second reconstructed information are removed from the received information.

The rest can be deduced by analogy until information about all users is parsed.

It should be noted that the MMSE-SIC detector is used in this embodiment. The MMSE-SIC detector is used based on an SIC algorithm and when each user is detected at each level. According to the principles of an MMSE and SIC, it can be proved that the MMSE-SIC detector can achieve an optimal MIMO channel capacity.

However, a prerequisite for implementing transmission close to a channel capacity by using the MMSE-SIC detector is that the receive end needs to feed back SNR or code rate information for each data stream to the transmit end. In this case, a feedback channel may be needed for the entire system. This increases system complexity, and feedback information of the feedback channel may also have an error.

Based on this, an embodiment may provide a data processing method. A first communication device may simultaneously send one or more data streams to a second communication device by using a MIMO technology. Correspondingly, the second communication device may simultaneously receive one or more data streams by using the MIMO technology. When a plurality of data streams includes a first data stream and a second data stream, a plurality of information bit subblocks in M first encoded blocks in the first data stream are arranged in a first order. A plurality of information bit subblocks in M second encoded blocks in the second data stream are arranged in a second order. The second order and the first order meet a mapping relationship. A plurality of data streams may be arranged in the foregoing orders, so that joint encoding without feeding back information can be implemented, and transmission close to a channel capacity can be implemented.

The following provides descriptions with reference to the embodiments.

Figure 4:
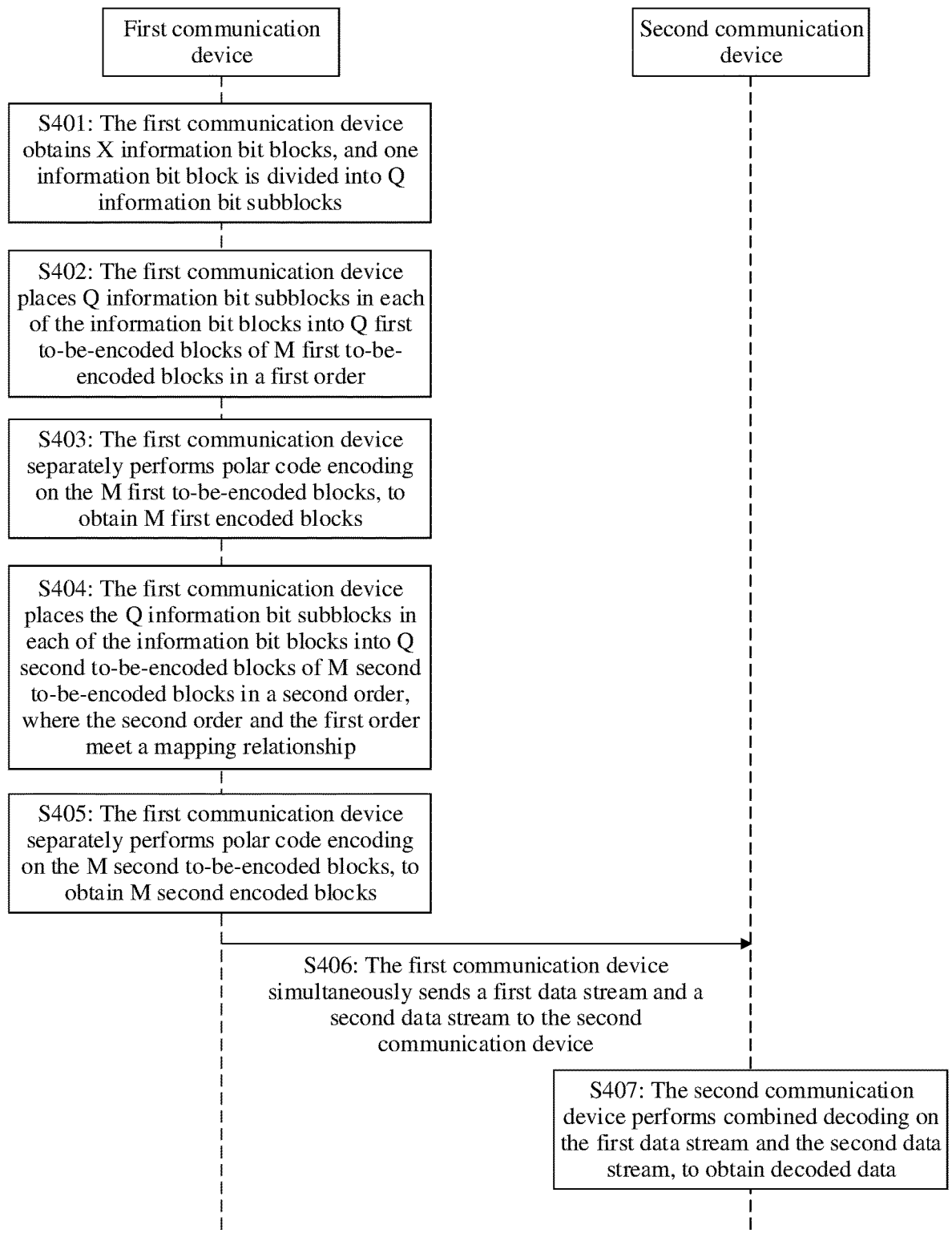
FIG. 4 is a schematic flowchart of a data processing method according to an embodiment.

An embodiment provides a data processing method. Refer to FIG. 4. The data processing method may be performed by a first communication device and a second communication device through interaction and includes the following steps.

S401: The first communication device obtains X information bit blocks, and one information bit block is divided into Q information bit subblocks.

S402: The first communication device places Q information bit subblocks in each of the information bit blocks into Q first to-be-encoded blocks of M first to-be-encoded blocks in a first order.

S403: The first communication device separately performs polar code encoding on the M first to-be-encoded blocks, to obtain M first encoded blocks.

Figure 5A:
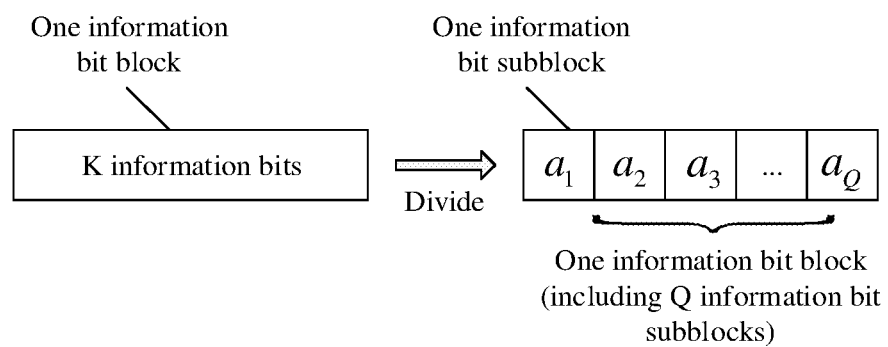
FIG. 5a and FIG. 5b are a schematic diagram of a relationship between an information bit block and an information bit subblock according to an embodiment.

When processing a plurality of to-be-encoded information bits, the first communication device may divide the plurality of to-be-encoded information bits into different information bit blocks. One information bit block includes a plurality of information bits. For example, the first communication device groups every K information bits into one information bit block. In other words, one information bit block includes K information bits, as shown in FIG. 5a.

Each information bit block may be divided into Q information bit subblocks. In other words, the K information bits are divided into the Q information bit subblocks, as shown in FIG. 5a. $a_q$ indicates any information bit subblock, $a_q$ is a binary sequence whose length is K/Q, and q meets $1 \leq q \leq Q$. Q indicates a quantization order of a code rate, and Q is a positive integer. For example, for information bit blocks and information bit subblocks shown in FIG. 5b, a quantization order of a code rate is 3, that is, Q=3.

It should be noted that if K/Q is not an integer, in this embodiment, a maximum of (Q−1) padding bits may be padded when K/Q is determined, to ensure that K/Q is an integer. For example, if K=100 and Q=3, K/Q is not an integer. After two padding bits are padded, K/Q=34. $a_1$ and $a_2$ may each include 34 information bits and $a_3$ may include 32 information bits (the other two are padding bits). Subsequently, when performing encoding on information bit subblocks, a polar code encoder in the first communication device processes only information bits in each information bit subblock and does not process the padding bit.

After obtaining the X information bit blocks, the first communication device may place the X information bit blocks into the M first to-be-encoded blocks. The to-be-encoded block is used to carry to-be-encoded data transmitted from the first communication device to the second communication device. It may be understood that the first to-be-encoded block indicates a to-be-encoded block used by the first communication device to send the first data stream to the second communication device, the second to-be-encoded block indicates a to-be-encoded block used by the first communication device to send the second data stream to the second communication device, and so on. In a possible case, the quantity M of first to-be-encoded blocks meets M=X+Q−1. Any first to-be-encoded block carries at least one information bit subblock and at most Q information bit subblocks.

FIG. 6a is a schematic diagram of a first to-be-encoded block according to an embodiment. If a code rate loss is not considered, an arrangement manner of information bit subblocks in a first to-be-encoded block is shown in FIG. 6a. For example, FIG. 6a shows three information bit blocks and five first to-be-encoded blocks, that is, X=3, and M=5. A quantization order of a code rate is 3, that is, Q=3. Each information bit block includes Q information bit subblocks. It should be noted that Q information bit subblocks of a same information bit block are respectively located in different Q first to-be-encoded blocks, as shown in FIG. 6a.

Each first to-be-encoded block is sequentially arranged, and a $1^{st}$ first to-be-encoded block carries one information bit subblock. A quantity of information bit blocks carried in the $1^{st}$ first to-be-encoded block to a $Q^{th}$ first to-be-encoded block increases by one in an arrangement order, and the $Q^{th}$ first to-be-encoded block carries Q information bit subblocks. A quantity of information bit subblocks carried in a $(Q+1)^{th}$ first to-be-encoded block to an $M^{th}$ first to-be-encoded block decreases by one in the arrangement order, and the $M^{th}$ first to-be-encoded block carries one information bit subblock.

For example, in FIG. 6a, a $1^{st}$ first to-be-encoded block carries one information bit subblock, a $2^{nd}$ first to-be-encoded block carries two information bit subblocks, a $3^{rd}$ first to-be-encoded block carries three information bit subblocks, a $4^{th}$ first to-be-encoded block carries two information bit subblocks, and a $5^{th}$ first to-be-encoded block carries one information bit subblock.

Optionally, to reduce the code rate loss, the first communication device may perform special processing when dividing information data into the X information bit blocks. Each first to-be-encoded block is sequentially arranged, and a $1^{st}$ first to-be-encoded block carries one information bit subblock. A quantity of information bit blocks respectively carried in the $1^{st}$ first to-be-encoded block to an $M^{th}$ first to-be-encoded block increases by one in an arrangement order, and a $Q^{th}$ first to-be-encoded block to the $M^{th}$ first to-be-encoded block respectively carry Q information bit subblocks.

Figure 5B:
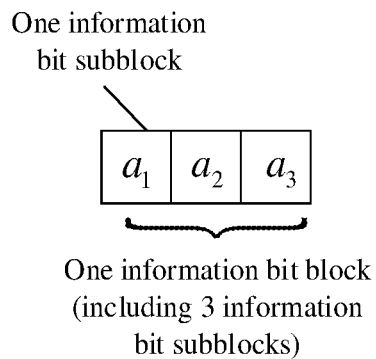

For example, FIG. 6b is a schematic diagram of another first to-be-encoded block according to an embodiment. In FIG. 6b, there are six information bit blocks, six first to-be-encoded blocks, and a quantization order Q of a code rate is 3. A $1^{st}$ information bit block to a $4^{th}$ information bit block each include three information bit subblocks. A $5^{th}$ information bit block includes two information bit subblocks, and a $6^{th}$ information bit block includes one information bit subblock. In other words, special processing is separately performed on the $5^{th}$ information bit block and the $6^{th}$ information bit block. In FIG. 5b, a $1^{st}$ first to-be-encoded block carries one information bit subblock, a $2^{nd}$ first to-be-encoded block carries two information bit subblocks, and a $3^{rd}$ first to-be-encoded block to a $6^{th}$ first to-be-encoded block each carry three information bit subblocks.

Figure 6C:
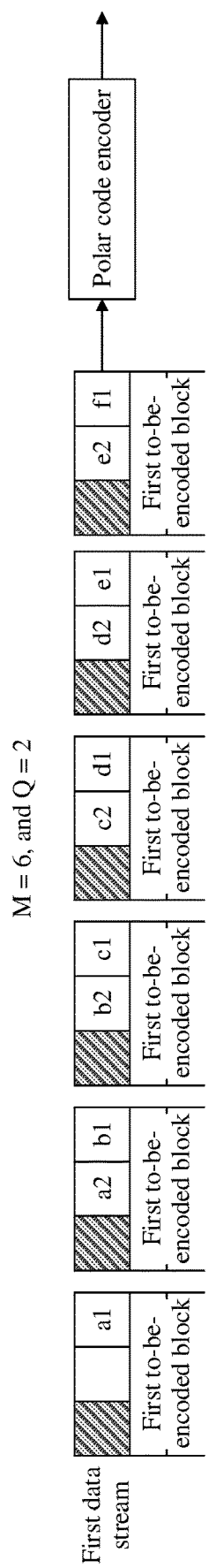

For another example, FIG. 6c is a schematic diagram of still another first to-be-encoded block according to an embodiment. In FIG. 6c, there are six information bit blocks, six first to-be-encoded blocks, and a quantization order Q of a code rate is 2. Compared with the example in FIG. 6b, the quantization order of the code rate in FIG. 6c is 2, and quantities of the information bit blocks the first to-be-encoded blocks are respectively the same as those in FIG. 6b. Special processing is performed on a $6^{th}$ information bit block in FIG. 6c, so that the $6^{th}$ information bit block includes only one information bit subblock. The first communication device separately places the six information bit blocks into six first to-be-encoded blocks, as shown in FIG. 6c.

Figure 6D:
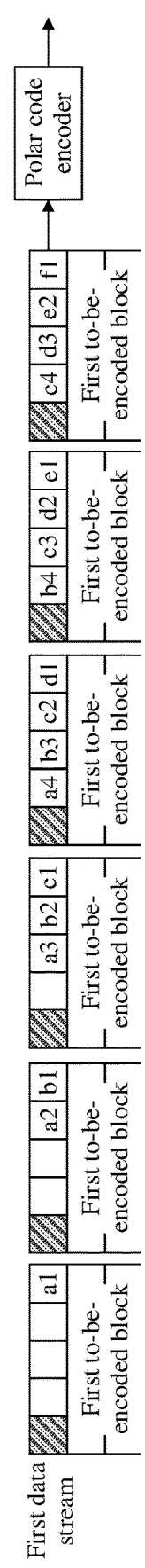

For still another example, FIG. 6d is a schematic diagram of yet another first to-be-encoded block according to an embodiment. In FIG. 6d, there are six information bit blocks, six first to-be-encoded blocks, and a quantization order Q of a code rate is 4. Compared with the example in FIG. 6b, the quantization order of the code rate in FIG. 6d is 4, and quantities of the information bit blocks the first to-be-encoded blocks are respectively the same as those in FIG. 6b. Special processing is performed on a $4^{th}$ information bit block to a $6^{th}$ information bit block in FIG. 6d, so that the $4^{th}$ information bit block includes three information bit subblocks, the $5^{th}$ information bit block includes two information bit subblocks, and the $6^{th}$ information bit block includes one information bit subblock. The first communication device separately places the six information bit blocks into six first to-be-encoded blocks, as shown in FIG. 6d.

It should be noted that the first to-be-encoded blocks shown in FIG. 6a and FIG. 6b are two basic first to-be-encoded blocks, and the first to-be-encoded block may alternatively be between the two basic first to-be-encoded blocks.

Figure 6E:
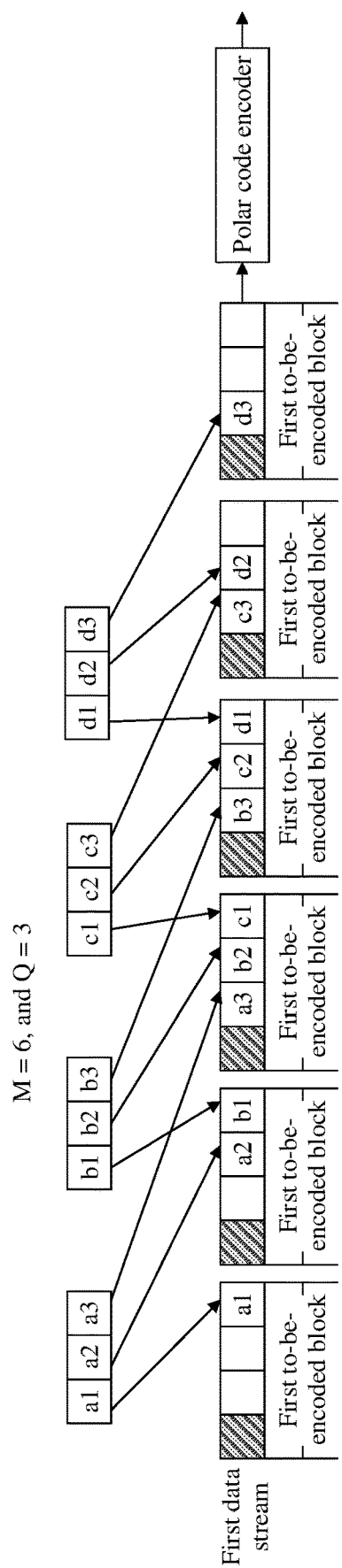

For example, FIG. 6e is a schematic diagram of still yet another first to-be-encoded block. M=6 indicates that there are six first to-be-encoded blocks in total, and X=4 indicates that four information bit blocks are transmitted in total. Four to-be-transmitted information bit blocks shown in FIG. 6e are all complete information bit blocks. The four information bit blocks are placed into the six first to-be-encoded blocks. A $1^{st}$ first to-be-encoded block and a $6^{th}$ first to-be-encoded block each carry one information bit subblock, a $2^{nd}$ first to-be-encoded block and a $5^{th}$ first to-be-encoded block each carry two information bit subblocks, and a $3^{rd}$ first to-be-encoded block and a $4^{th}$ first to-be-encoded block each carry three information bit subblocks, as shown in FIG. 6e. Other similar special processing may also be performed on the first to-be-encoded block. This is not limited in this embodiment.

Any first to-be-encoded block further includes one or more fixed bits, as shown by shadow areas of the information bit blocks in FIG. 6a. A value of the fixed bit is usually set to 0 and is known to both a transmit end and a receive end during actual transmission.

It should be noted that the foregoing descriptions of the first to-be-encoded block are merely examples, and the quantity of first to-be-encoded blocks may alternatively be another value. For example, when the first to-be-encoded blocks shown in FIG. 6b are used, theoretically, the quantity of first to-be-encoded blocks may approach infinite. In other words, M approaches infinite. This is not limited in this embodiment.

The following describes in detail an arrangement manner of Q information bit subblocks of any information bit block. For any information bit block, Q information bit subblocks included in the information bit block may be separately placed into Q first to-be-encoded blocks in a first order. The first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located.

Figure 7:
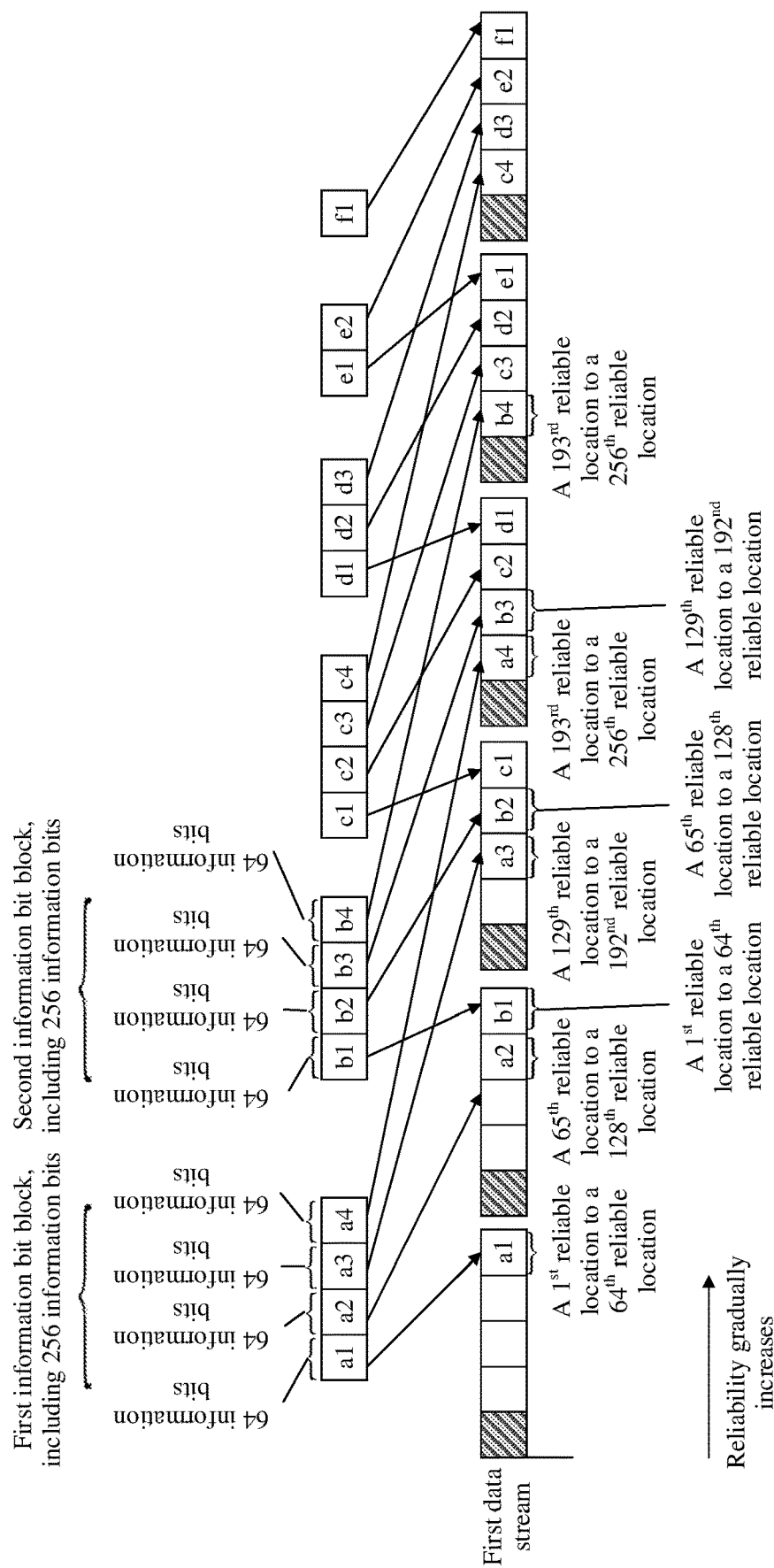
FIG. 7 is a schematic diagram of an arrangement manner of information bit subblocks in a to-be-encoded block according to an embodiment.

The following uses an example in which the first to-be-encoded block in FIG. 6d is used as the first to-be-encoded block for description. Refer to FIG. 7. It is assumed that K=256, Q=4, and M=6. For a $1^{st}$ information bit block in FIG. 7, the information bit block includes 256 information bits. According to the description in the foregoing embodiment, the first communication device may obtain $a_1$, $a_2$, $a_3$, and $a_4$ each including 64 information bits. In this case, in the first order, $a_1$ is placed in a first reliable location to a $64^{th}$ reliable location in a $1^{st}$ first to-be-encoded block, $a_2$ is placed in a $65^{th}$ reliable location to a $128^{th}$ reliable location in a $2^{nd}$ first to-be-encoded block, $a_3$ is placed in a $129^{th}$ reliable location to a $192^{nd}$ reliable location in a $3^{rd}$ first to-be-encoded block, and $a_4$ is placed in a $193^{rd}$ reliable location to a $256^{th}$ reliable location in a $4^{th}$ first to-be-encoded block, as shown in FIG. 7. It should be noted that reliability of a location of each first to-be-encoded block gradually increases from left to right. In other words, a rightmost position is a first reliable position, and reliability decreases sequentially from right to left.

For another example, for a $2^{nd}$ information bit block in FIG. 7, the information bit block also includes 256 information bits. Similarly, the first communication device may obtain 4, $b_2$, $b_3$, and $b_4$ each including 64 information bits. In this case, in the first order, $b_1$ is placed in a first reliable location to a $64^{th}$ reliable location in a $2^{nd}$ first to-be-encoded block, $b_2$ is placed in a $65^{th}$ reliable location to a $128^{th}$ reliable location in a $3^{rd}$ first to-be-encoded block, $b_3$ is placed in a $129^{th}$ reliable location to a $192^{nd}$ reliable location in a $4^{th}$ first to-be-encoded block, and $b_4$ is placed in a $193^{rd}$ reliable location to a $256^{th}$ reliable location in a $5^{th}$ first to-be-encoded block, as shown in FIG. 7. It may be understood that an arrangement manner of 256 information bits in each of a $3^{rd}$ information bit block to a $6^{th}$ information bit block is also similar, and details are not described herein again.

Figure 8A:
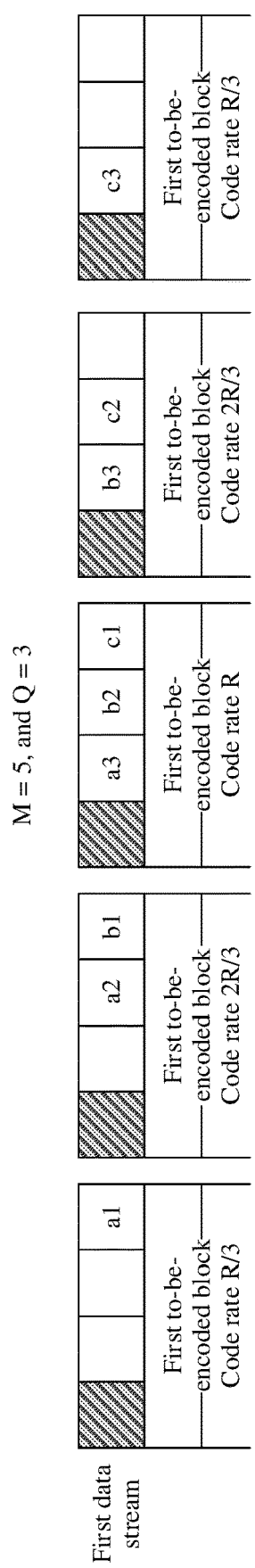
FIG. 8a to FIG. 8d are another schematic diagram of first to-be-encoded blocks at quantization orders of different code rates according to an embodiment.

After sorting the M first to-be-encoded blocks, the first communication device may separately perform polar code encoding on the M first to-be-encoded blocks to obtain M first encoded blocks. The M first encoded blocks that are output after polar code encoding are a plurality of encoded blocks that are cascaded and combined together. For example, when the first communication device sends the first data stream, the first to-be-encoded block in FIG. 6a is used as the first to-be-encoded block. In this case, an order of the five first to-be-encoded blocks and information bit subblocks in the first to-be-encoded blocks is shown in FIG. 8a.

Figure 8B:
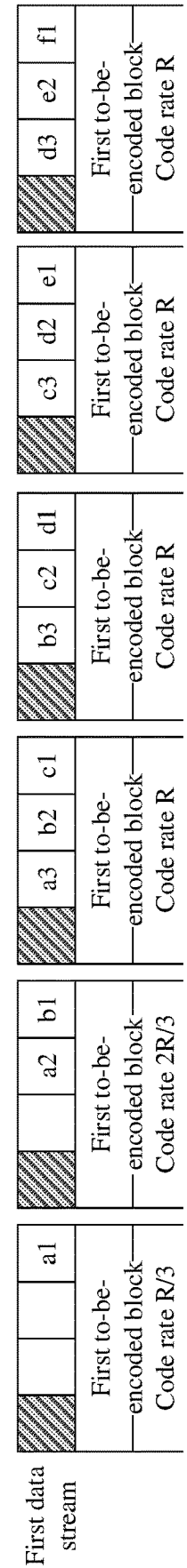
Figure 8C:
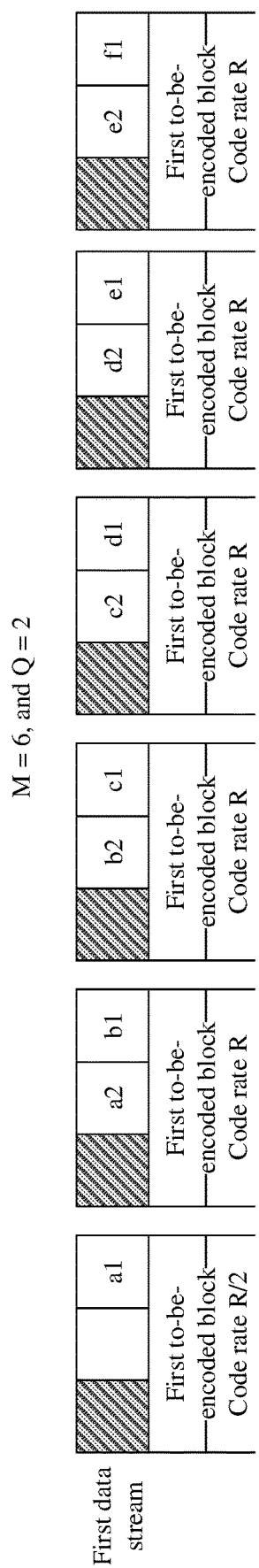

For another example, when the first communication device sends the first data stream, the first to-be-encoded block in FIG. 6b is used as the first to-be-encoded block. In this case, an order of the six first to-be-encoded blocks and information bit subblocks in the first to-be-encoded blocks is shown in FIG. 8b. Similarly, when the first communication device sends the first data stream, the first to-be-encoded block in FIG. 6c is used as the first to-be-encoded block. In this case, an order of the six first to-be-encoded blocks and information bit subblocks in the first to-be-encoded blocks is shown in FIG. 8c. When the first communication device sends the first data stream first to-be-encoded block in FIG. 6d is used as the first to-be-encoded block. In this case, an order of the six first to-be-encoded blocks and information bit subblocks in the first to-be-encoded blocks is shown in FIG. 8d.

The following analyzes the code rate of the first encoded block. For example, the five first to-be-encoded blocks shown in FIG. 8a are encoded into five polar code blocks, where M=5, and Q=3. A total code rate of the five first to-be-encoded blocks is (R/3+2R/3+R+2R/3+R/3)/5=3R/5. For another example, the six first to-be-encoded blocks shown in FIG. 8b are encoded into six polar code blocks. M=6, and Q=3. A total code rate is (R/3+2R/3+R+R+R+R)/6=5R/6. It can be understood that compared with FIG. 8a, a total code rate of a first encoded block corresponding to the first to-be-encoded block in FIG. 8b is higher, that is, closer to a code rate R.

For still another example, the six first to-be-encoded blocks shown in FIG. 8c are encoded into six polar code blocks. M=6, and Q=2. A total code rate is (R/2+R+R+R+R+R)/6=11R/12. It can be understood that compared with FIG. 8b, a total code rate of a first encoded block corresponding to the first to-be-encoded block in FIG. 8c is higher. In other words, when a ratio of M to Q is higher, a total code rate is closer to R.

Figure 8D:
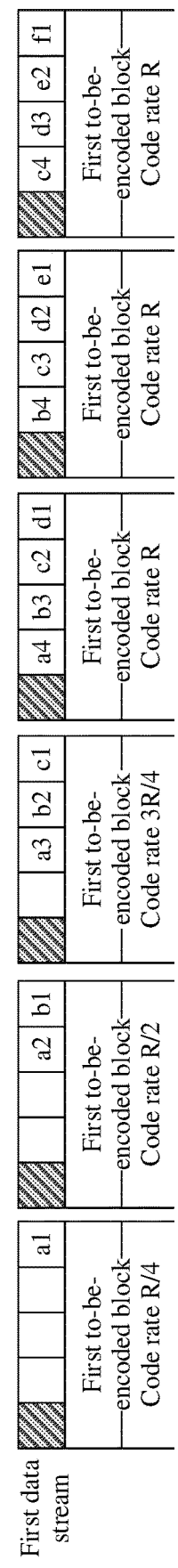

For yet another example, the six first to-be-encoded blocks shown in FIG. 8d are encoded into six polar code blocks. M=6, and Q=4. A total code rate is (R/4+R/2+3R/4+R+R+R)/6=3R/4. It can be understood that compared with FIG. 8a, a total code rate of a first encoded block corresponding to the first to-be-encoded block in FIG. 8d is higher, that is, closer to a code rate R.

S404: The first communication device places the Q information bit subblocks in each of the information bit blocks into Q second to-be-encoded blocks of M second to-be-encoded blocks in a second order, where the second order and the first order meet a mapping relationship.

S405: The first communication device separately performs polar code encoding on the M second to-be-encoded blocks, to obtain M second encoded blocks.

The first communication device may further place the X information bit blocks into the M second to-be-encoded blocks in the second order, to obtain the M second encoded blocks. Similarly, the quantity M of second to-be-encoded blocks meets M=X+Q−1. Any second to-be-encoded block carries at least one information bit subblock and at most Q information bit subblocks.

It should be noted that the second to-be-encoded block and the plurality of information bit subblocks carried in the second to-be-encoded block are arranged in the second order. The second order and the first order meet a mapping relationship. Optionally, the second order is that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

Figure 9A:
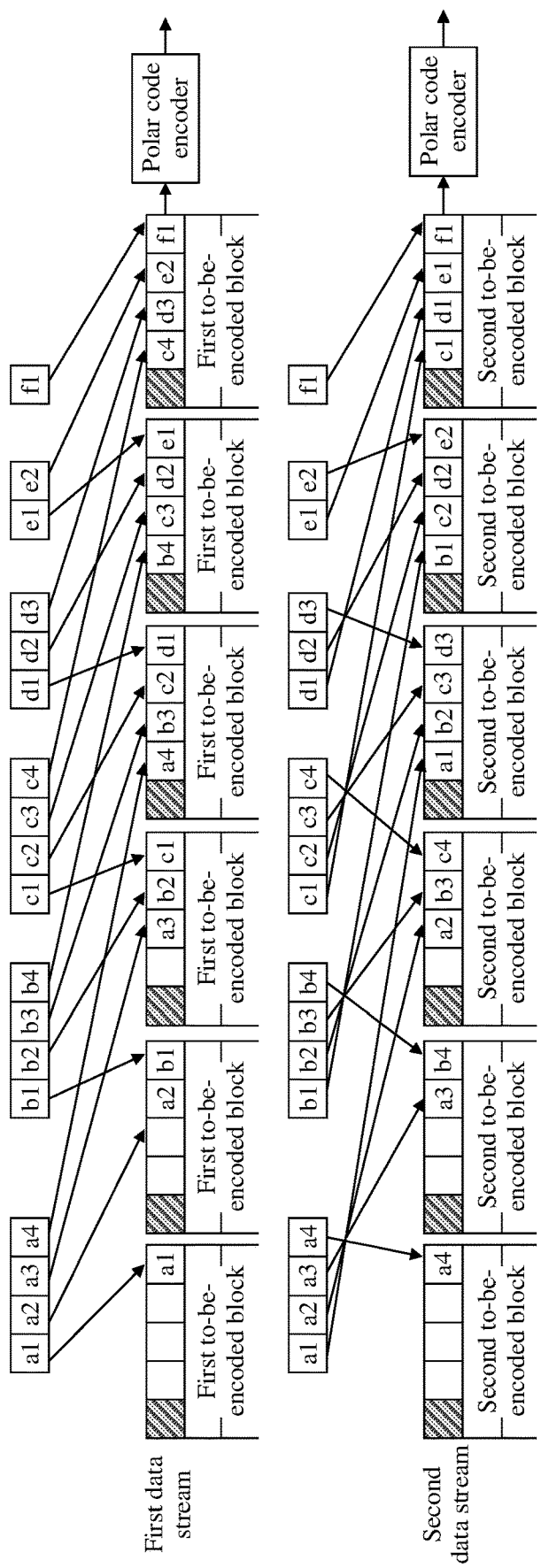
FIG. 9a is a schematic diagram of a first to-be-encoded block and a second to-be-encoded block according to an embodiment.

FIG. 9a is a schematic diagram of a first data stream and a second data stream according to an embodiment. For Q information bit subblocks in each information bit block, an arrangement order of information bit subblocks in second to-be-encoded blocks shown in FIG. 9a is a reverse order to the arrangement order of the information bit subblocks in the first to-be-encoded blocks shown in FIG. 6d. K=256, M=6, and Q=4.

For example, for a $1^{st}$ information bit block ($a_1, a_2, a_3, a_4$), an information bit subblock $a_1$ in the information bit block is located at a $193^{rd}$ reliable location to a $256^{th}$ reliable location in a $4^{th}$ second to-be-encoded block, that is, located at a location corresponding to $a_4$ in the first data stream. $a_2$ is located at a $129^{th}$ reliable location to a $192^{nd}$ reliable location in a $3^{rd}$ second to-be-encoded block, that is, located at a location corresponding to $a_3$ in the first data stream. $a_3$ is located at a $65^{th}$ reliable location to a $128^{th}$ reliable location in a $2^{nd}$ second to-be-encoded block, that is, located at a location corresponding to $a_2$ in the first data stream. $a_4$ is located at a $1^{st}$ reliable location to a $64^{th}$ reliable location in a $1^{st}$ second to-be-encoded block, that is, located at a location corresponding to $a_1$ in the first data stream. It can be understood that for a $1^{st}$ information bit block, an arrangement order of four information bit subblocks in the $1^{st}$ information bit block in the second to-be-encoded blocks is a reverse order to an arrangement order of four information bit subblocks in the information bit block in the first to-be-encoded blocks.

For another example, for a $2^{nd}$ information bit block ($b_1, b_2, b_3, b_4$), an information bit subblock $b_1$ in the information bit block is located at a $193^{rd}$ reliable location to a $256^{th}$ reliable location in a $5^{th}$ first to-be-encoded block, that is, located at a location corresponding to $b_4$ in the first data stream. $b_2$ is located at a $129^{th}$ reliable location to a $192^{nd}$ reliable location in a $4^{th}$ first to-be-encoded block, that is, located at a location corresponding to $b_3$ in the first data stream. $b_3$ is located at a $65^{th}$ reliable location to a $128^{st}$ reliable location in a $3^{rd}$ first to-be-encoded block, that is, located at a location corresponding to $b_2$ in the first data stream. $b_4$ is located at a first reliable location to a $64^{th}$ reliable location in a $2^{nd}$ first to-be-encoded block, that is, located at a location corresponding to $b_1$ in the first data stream. It can be understood that for the $2^{nd}$ information bit block, an arrangement order of four information bit subblocks in the $2^{nd}$ information bit block in the second to-be-encoded blocks is a reverse order to an arrangement order of four information bit subblocks in the information bit block in the first to-be-encoded blocks. It may be understood that an arrangement manner of 256 information bits in each of a $3^{rd}$ information bit block to a $6^{th}$ information bit block is also similar, and details are not described herein again.

Optionally, if a value of K/Q is not an integer or is not a power of 2, rate matching further needs to be performed. It should be noted that the solution is not closely related to which rate matching solution is actually used. Therefore, a general rate matching solution is used.

Optionally, the first order and the second order meet the following mapping relationship:

$$[A_1, A_2, \ldots, A_{2^P}] = [0, 0, \ldots, 0, a_1, a_2, \ldots, a_Q] F^{\otimes (J+P)},$$
where $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q = 2^J$, P is a positive integer and meets $2^{P-1} \leq Q \leq 2^P$, and t meets $1 \leq t \leq 2^P$.

Figure 9B:
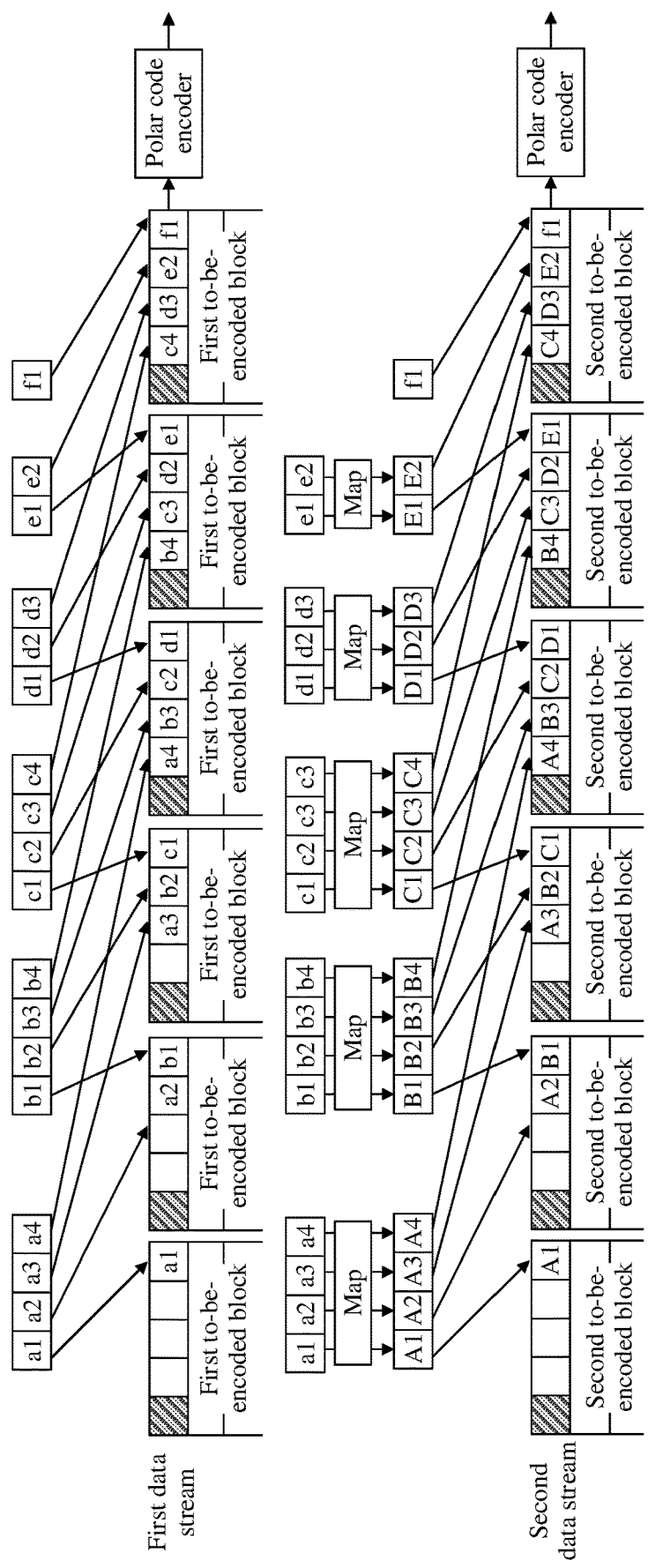
FIG. 9b is a schematic diagram of another first to-be-encoded block and another second to-be-encoded block according to an embodiment.

FIG. 9b is a schematic diagram of another first data stream and another second data stream according to an embodiment. For Q information bit subblocks in each information bit block, an arrangement order of information bit subblocks in second to-be-encoded blocks shown in FIG. 9b is the same as the arrangement order of the information bit subblocks in the first to-be-encoded blocks shown in FIG. 6d. However, each information bit subblock is a mapped information bit subblock, as shown in FIG. 9b. M=6, and Q=4.

For example, six information bit blocks in FIG. 9b are respectively ($a_1,a_2,a_3,a_4$), ($b_1,b_2,b_3,b_4$), ($c_1,c_2,c_3,c_4$), ($d_1,d_2,d_3$), ($e_1,e_2$), and ($f_1$). Because $2^{P-1} \leq Q \leq 2^P$, it may be determined that P=2. In this case, each of three mapped information bit blocks includes four information bit subblocks, and the mapped information bit block and the information bit block before mapping meets the following relationship:

$$[A_1,A_2,A_3,A_4]=[a_1,a_2,a_3,a_4]*F$$

$$[B_1,B_2,B_3,B_4]=[b_1,b_2,b_3,b_4]*F$$

$$[C_1,C_2,C_3,C_4]=[c_1,c_2,c_3,c_4]*F.$$

$$[D_1,D_2,D_3,D_4]=[0,d_1,d_2,d_3]*F$$

$$[E_1,E_2,E_3,E_4]=[0,0,e_1,e_2]*F$$

The first communication device places four information bit subblocks in each mapped information bit block into Q second to-be-encoded blocks in the first order, as shown in FIG. 9b.

It should be noted that if a quantity of information bit subblocks in each information bit block is not a power of 2, when the information bit block is processed, zero padding processing needs to be performed, so that a complete polar code generator matrix is used during mapping of the information bit block. Optionally, if zero padding processing is not performed on the information bit block, a submatrix of the polar code generator matrix is used during mapping of the information bit block.

The first communication device may separately perform polar code encoding on M second to-be-encoded blocks, to obtain M second encoded blocks.

It may be understood that for analysis on a code rate of the second encoded block, refer to analysis on the code rate of the first encoded block in the foregoing embodiment. Details are not described herein again.

S406: The first communication device simultaneously sends a first data stream and a second data stream to the second communication device. Correspondingly, the second communication device simultaneously receives the first data stream and the second data stream that are sent by the first communication device.

S407: The second communication device performs combined decoding on the first data stream and the second data stream, to obtain decoded data.

The first communication device may send one or more data streams to the second communication device through one or more antennas by using a MIMO technology. Each data stream includes M encoded blocks. The first communication device simultaneously sends the first data stream and the second data stream to the second communication device. The first data stream includes the M first encoded blocks, and the second data stream includes the M second encoded blocks.

It should be noted that when the first communication device simultaneously sends the first data stream and the second data stream to the second communication device, the first data stream and the second data stream are combined into one aggregated data stream during channel transmission. In addition, the aggregated data stream further includes a noise signal and the like. Correspondingly, when the second communication device simultaneously receives the first data stream and the second data stream, the second communication device receives the aggregated data stream obtained by combining the first data stream and the second data stream.

After receiving the aggregated data stream obtained by combining the first data stream and the second data stream, the second communication device may perform combined decoding on the aggregated data stream to obtain the decoded data. The combined decoding described in this embodiment includes the following two phases.

The first phase of combined decoding includes detection performed by the second communication device to distinguish between a plurality of data streams, noise signals, and the like. For example, the second communication device in this embodiment may use an MMSE-SIC detector. The second communication device puts the aggregated data stream into an MMSE-SIC detector, to obtain the two data streams included in the aggregated data stream and an order of SNRs (or code rates) of the data streams.

The second phase of combined decoding is an interactive process. The second communication device first performs polar code decoding on an encoded block in a data stream with a highest SNR (or code rate), to decode some parts. Then, the second communication device performs polar code decoding on an encoded block in a data stream with a second highest SNR (or code rate). When the encoded block in the data stream with the second highest SNR (or code rate) is decoded, the some decoded parts obtained during decoding the encoded block in the data stream with the highest SNR (or code rate) may be used, and vice versa.

According to the Shannon theorem, when the aggregated data stream received by the second communication device includes the first data stream and the second data stream, if a sum of channel capacities of the first data stream and the second data stream is greater than or equal to a code rate R, the second communication device can implement reliable decoding on the first data stream and the second data stream at all times in the combined decoding manner described in this embodiment.

The second communication device may obtain a first target data stream if the sum of channel capacities of the first data stream and the second data stream is greater than or equal to the code rate R. The first target data stream is a data stream with a highest SNR (or code rate) in a first to-be-decoded data stream, and the first to-be-decoded data stream includes the first data stream and the second data stream.

The second communication device obtains, through decoding, $k_1$ information bit subblocks $[a_1, a_2, \ldots, a_{k_1}]$ in one information bit block included in the first target data stream, where $k_1$ meets $1 \leq k_1 \leq Q$.

The second communication device obtains first reconstructed information obtained after encoding and reconstructing the $k_1$ information bit subblocks $[a_1, a_2, \ldots, a_{k_1}]$.

The second communication device removes the first reconstructed information from the first to-be-decoded data stream.

The second communication device obtains, through decoding, $k_2$ information bit subblocks $[a_{Q-k_2}, a_{Q-k_2+1}, \ldots, a_Q]$ in the information bit block included in a second target data stream, where $k_1$ and $k_2$ meet $1 \leq k_2 \leq Q$ and $k_1+k_2 \geq Q$. The second target data stream is a data stream with a lowest SNR (or code rate) in the first to-be-decoded data stream.

The second communication device obtains Q information bit subblocks that are $[a_1, a_2, \ldots, a_Q]$ and that are included in the information bit block.

Figure 10:
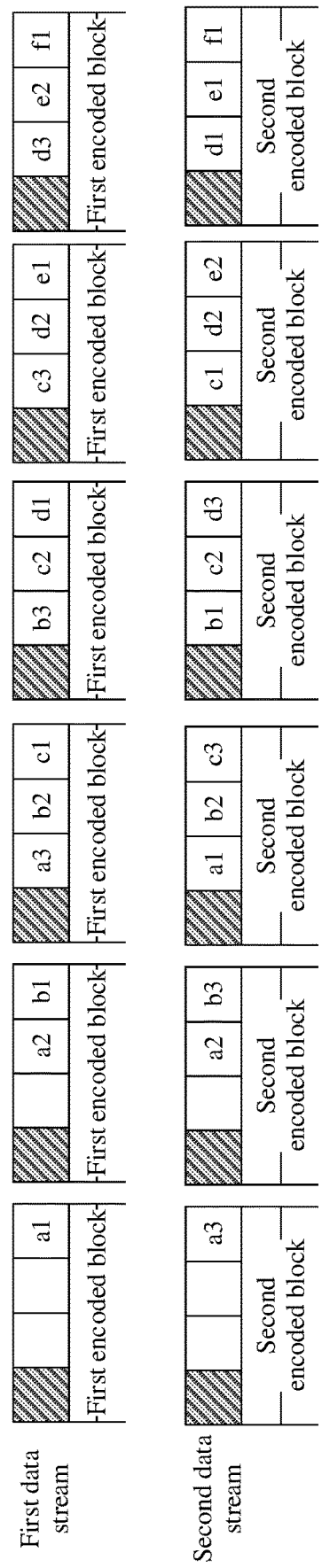
FIG. 10 is a schematic diagram of a first data stream and a second data stream according to an embodiment.

For example, a first data stream and a second data stream that are sent by the first communication device are shown in FIG. 10. It is assumed that the first data stream is sent on a first channel, and a channel capacity of the first channel is greater than or equal to 2R/3. It is assumed that the second data stream is sent on a second channel, and a channel capacity of the second channel is greater than or equal to R/3.

The order of the first encoded blocks in FIG. 10 is consistent with the order of the first encoded blocks in FIG. 8*b*. For Q information bit subblocks in each information bit block, an arrangement order of information bit subblocks in second encoded blocks shown in FIG. 10 is a reverse order to the arrangement order of the information bit subblocks in the first encoded blocks shown in FIG. 8*b*.

In the first data stream, a code rate of a $1^{st}$ encoded block is R/3, a code rate of a $2^{nd}$ encoded block is 2R/3, and code rates of $3^{rd}$, $4^{th}$, $5^{th}$, and $6^{th}$ packets are R. After polar code encoding, the encoded blocks and packets are sent to the second communication device through a 2×2 MIMO channel. Similarly, in the second data stream, a code rate of a $1^{st}$ encoded block is R/3, a code rate of a $2^{nd}$ encoded block is 2R/3, and code rates of $3^{rd}$, $4^{th}$, $5^{th}$, and $6^{th}$ packets are R. After polar code encoding, the encoded blocks and packets are sent to the second communication device through a 2×2 MIMO channel.

Correspondingly, after receiving the first data stream and the second data stream, the second communication device performs the following combined decoding:

The second communication device puts the received aggregated data stream into an MMSE-SIC detector. The detector first decodes a data stream with a highest SNR (or code rate). It is assumed that the first data stream is the data stream with the highest SNR (or code rate). In this case, the second communication device performs polar code decoding on the first data stream. According to the Shannon theorem, code rates of the $1^{st}$ encoded block and the $2^{nd}$ encoded block in the first data stream are both less than or equal to the channel capacity of the first channel. In this case, the second communication device may obtain $a_1$, $a_2$, and $b_1$ by decoding the first data stream.

The second communication device encodes and reconstructs the obtained $a_1$, $a_2$, and $b_1$, to obtain reconstructed first reconstructed information, feeds back the first reconstructed information to the MMSE-SIC detector, and removes interference caused by known bits from the aggregated data stream. For example, after the first reconstructed information is removed from the aggregated data stream, the aggregated data stream may be updated, and the updated aggregated data stream does not include the interference caused by known bits. In this case, when detection is performed again by the second communication device, some interference can be reduced.

The second communication device puts the updated aggregated data stream into an MMSE-SIC detector, and the detector decodes a data stream with a lowest SNR (or code rate). It may be understood that, in this example, the first communication device sends only two data streams. In this case, the second communication device obtains a data stream with a lowest SNR (or code rate) during the second detection, and the data stream with the lowest SNR (or code rate) is the second data stream.

The second communication device performs polar code decoding on the second data stream. According to the Shannon theorem, if the code rate of a $1^{st}$ encoded block in the second data stream is less than or equal to the channel capacity of the second channel, the second communication device may obtain $a_3$ by decoding the second data stream.

After $a_2$ is obtained, a code rate of a $2^{nd}$ encoded block in the second data stream is reduced to R/3. According to the Shannon theorem, if the code rate of the $2^{nd}$ encoded block in the second data stream is less than or equal to the channel capacity of the second channel, the second communication device may obtain $b_3$ by decoding the second data stream.

After obtaining $a_3$, a code rate of a $3^{rd}$ encoded block in the first data stream is reduced to 2R/3. According to the Shannon theorem, the code rate of the $3^{rd}$ encoded block in the first data stream is less than or equal to the channel capacity of the first channel. In this case, the second communication device may obtain $b_2$ and q by decoding the first data stream.

After $b_2$ and $a_1$ are obtained, a code rate of a $3^{rd}$ encoded block in the second data stream is reduced to R/3. According to the Shannon theorem, the code rate of the $3^{rd}$ encoded block in the second data stream is less than or equal to the channel capacity of the first channel. In this case, the second communication device may obtain $c_3$ by decoding the second data stream.

After $b_3$ is obtained, a code rate of a $4^{th}$ encoded block in the first data stream is reduced to 2R/3. According to the Shannon theorem, the code rate of the $4^{th}$ encoded block in the first data stream is less than or equal to the channel capacity of the first channel. In this case, the second communication device may obtain $c_2$ and $d_1$ by decoding the first data stream.

After $b_1$ and $c_2$ are obtained, a code rate of a $4^{th}$ encoded block in the second data stream is reduced to R/3. According to the Shannon theorem, the code rate of the $4^{th}$ encoded block in the second data stream is less than or equal to the channel capacity of the first channel. In this case, the second communication device may obtain $d_3$ by decoding the second data stream.

After $c_3$ is obtained, a code rate of a $5^{th}$ encoded block in the first data stream is reduced to 2R/3. According to the Shannon theorem, the code rate of the $5^{th}$ encoded block in the first data stream is less than or equal to the channel capacity of the first channel. In this case, the second communication device may obtain $d_2$ and $e_1$ by decoding the first data stream.

After $d_2$ and $c_1$ are obtained, a code rate of a $5^{th}$ encoded block in the second data stream is reduced to R/3. According to the Shannon theorem, the code rate of the $5^{th}$ encoded block in the second data stream is less than or equal to the channel capacity of the first channel. In this case, the second communication device may obtain $e_2$ by decoding the second data stream.

After $d_3$ is obtained, a code rate of a $6^{th}$ encoded block in the first data stream is reduced to 2R/3. According to the Shannon theorem, the code rate of the $6^{th}$ encoded block in the first data stream is less than or equal to the channel capacity of the first channel. In this case, the second communication device may obtain $e_2$ and $f_1$ by decoding the first data stream.

After $d_1$ and $e_1$ are obtained, a code rate of a $6^{th}$ encoded block in the second data stream is reduced to R/3. According to the Shannon theorem, the code rate of the $6^{th}$ encoded block in the second data stream is less than or equal to the channel capacity of the first channel. In this case, the second communication device may obtain $f_1$ by decoding the second data stream.

In conclusion, all information bits $a_1, a_2, a_3, b_1, b_2, b_3, c_1, c_2, c_3, d_1, d_2, d_3, e_1, e_2, f_1$ included in the first data stream and the second data stream that are simultaneously transmitted by the first communication device can be obtained by decoding. In other words, reliable transmission of all information bits is implemented.

It should be noted that, during polar code decoding, decoding should be preferentially performed on a bit stream with a higher code rate. Otherwise, interference caused by another bitstream with a lower code rate cannot be avoided.

It should be noted that the combined decoding may further include the following special combined decoding: It is assumed that the channel capacity of the first channel on which the first communication device sends the first data stream is zero, and the channel capacity of the second channel on which the second data stream is sent is greater than or equal to the code rate R. Alternatively, the channel capacity of the first channel on which the first communication device sends the first data stream is greater than or equal to the code rate R, and the channel capacity of the second channel on which the second data stream is sent is zero. In the foregoing two possible cases, because the sum of the channel capacities of the first data stream and the second data stream is greater than or equal to the code rate R, the second communication device may decode all original data. It can be understood that the foregoing special cases also meet the condition of combined decoding, and finally correct decoding is implemented.

An embodiment may provide a data processing method. The method is implemented through interaction between a first communication device and a second communication device. The first communication device may simultaneously send a first data stream and a second data stream to the second communication device. A plurality of information bit subblocks in M first encoded blocks in the first data stream are arranged in a first order. A plurality of information bit subblocks in M second encoded blocks in the second data stream are arranged in a second order. The second order and the first order meet a mapping relationship. When combined decoding is performed, a decoding result obtained each time may be removed from the two data streams as known information. This reduces interference of the known information and helps implement correct decoding.

Figure 11A:
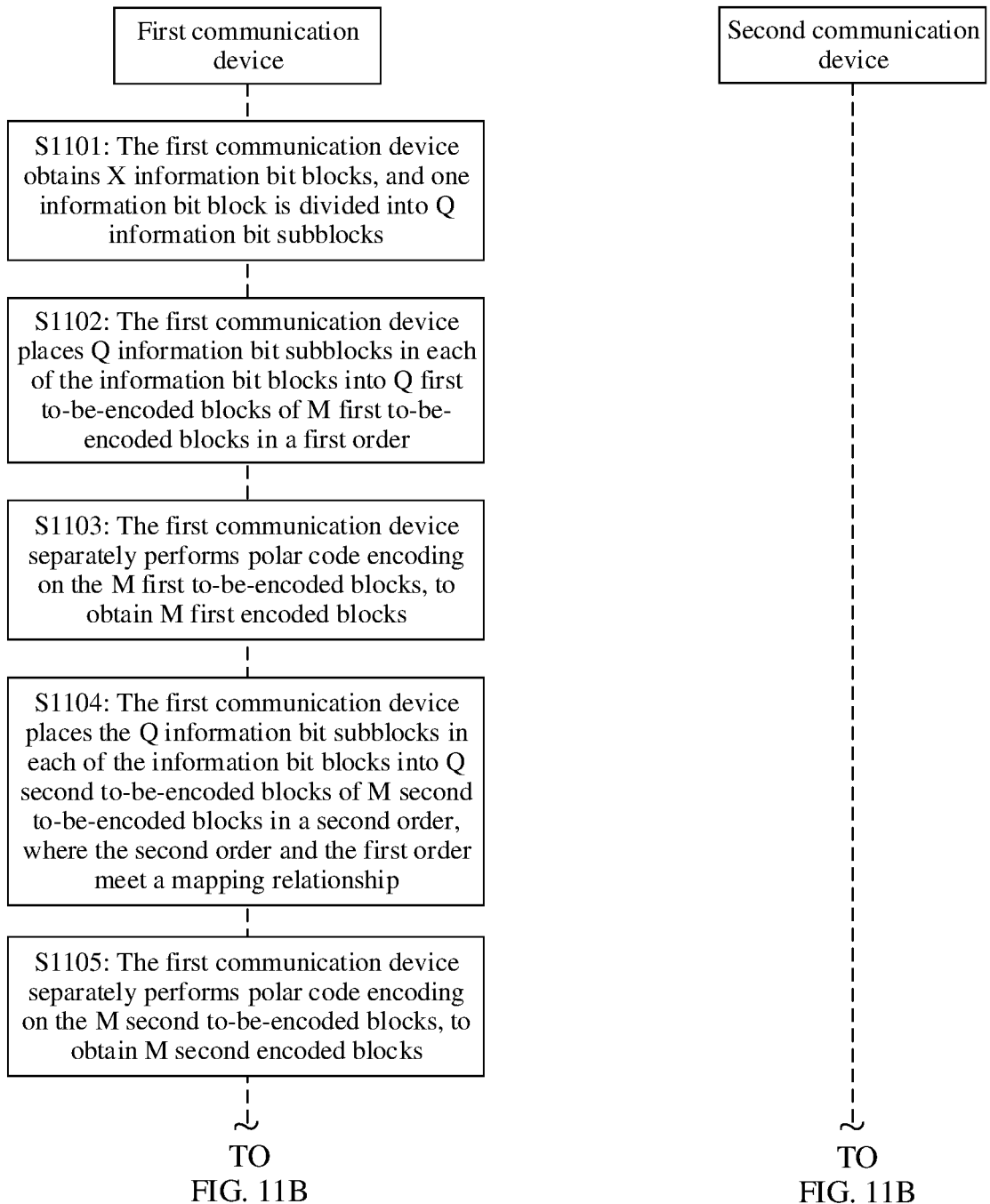
FIG. 11A and FIG. 11B are a schematic flowchart of another data processing method according to an embodiment.
Figure 11B:
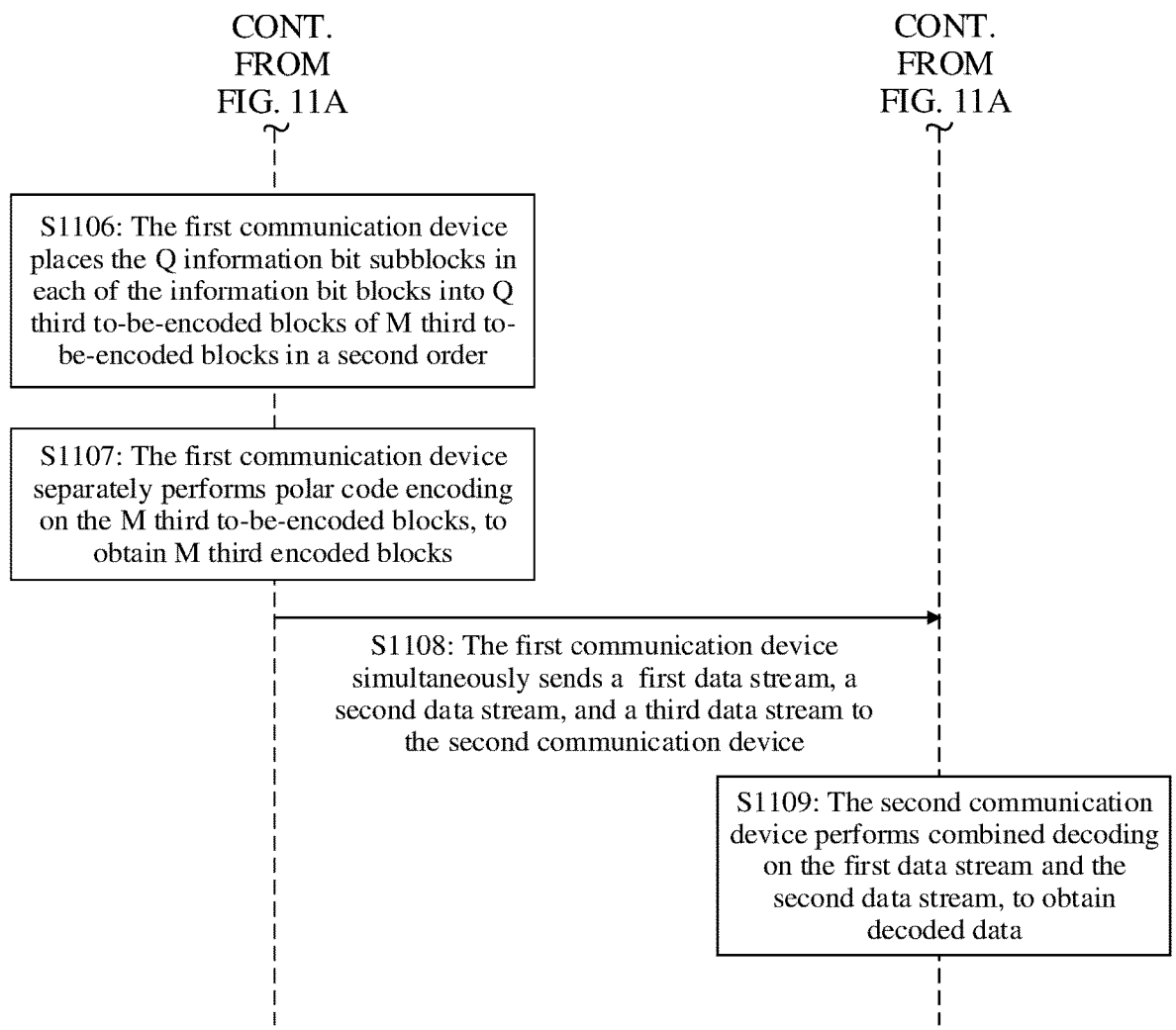

Based on the description in the embodiment shown in FIG. 4, the following describes in detail a case in which the first communication device simultaneously sends three data streams to the second communication device, and the second communication device simultaneously receives the three data streams and performs combined decoding on the three data streams. FIG. 11A and FIG. 11B show another data processing method according to an embodiment. The data processing method may be performed through interaction between a first communication device and a second communication device and includes S1101 to S1109. Implementations of S1101 to S1105 are similar to those of S401 to S405 in the embodiment in FIG. 4, and details are not described herein again. S1106 to S1109 may include:

S1106: The first communication device places Q information bit subblocks in each of the information bit blocks into Q third to-be-encoded blocks of M third to-be-encoded blocks in a second order.

S1107: The first communication device separately performs polar code encoding on the M third to-be-encoded blocks, to obtain M third encoded blocks.

According to the description in S404, the second order and the first order meet a mapping relationship. The second order is that a $q^{th}$ information bit subblock in each of the information bit blocks is located at a $(Q-q)*K/Q+1^{th}$ reliable location to a $(Q-q+1)*K/Q^{th}$ reliable location in a third to-be-encoded block in which the $q^{th}$ information bit subblock is located. Alternatively, the first order and the second order meet the following mapping relationship:

$$[A_1, A_2, \ldots, A_{2^P}] = [0, 0, \ldots, 0, a_1, a_2, \ldots, a_Q] F^{\otimes (J+P)}.$$

In this case, the third data stream sent by the first communication device includes M third encoded blocks. The third encoded block is data obtained after polar code encoding is performed on the third to-be-encoded block. The first communication device places the Q information bit subblocks in each of the information bit blocks into the Q third to-be-encoded blocks of the M third to-be-encoded blocks in the second order.

Figure 12A:
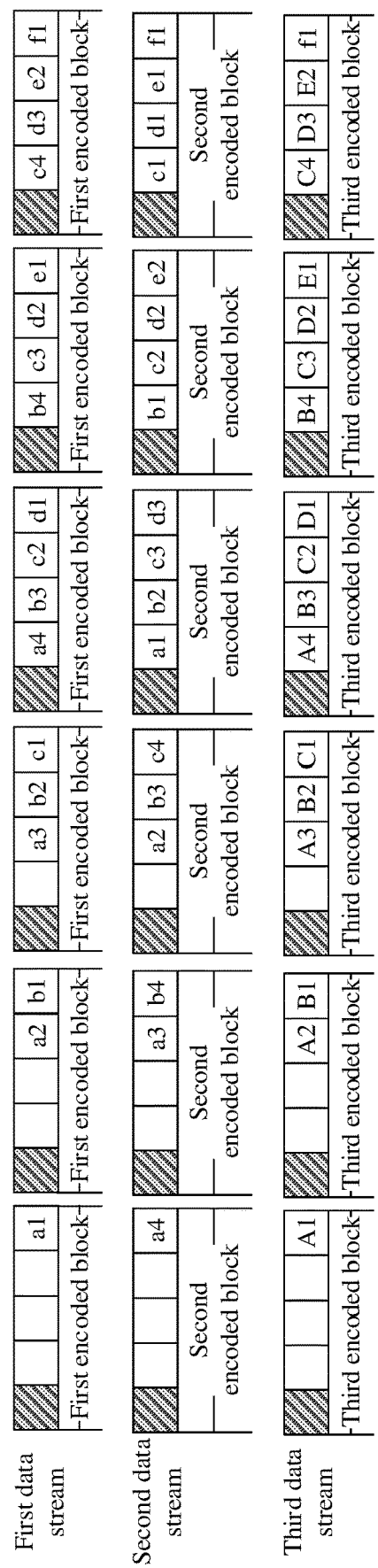
FIG. 12a is a schematic diagram of three data streams simultaneously sent by a first communication device according to an embodiment.

It should be noted that when the first communication device simultaneously sends three data streams, the second order used by the M second encoded blocks in the second data stream is different from the second order used by the M third encoded blocks in the third data stream. FIG. 12a is a schematic diagram of to-be-encoded blocks corresponding to three data streams that are simultaneously sent by a first communication device according to an embodiment. If a second order used by a second to-be-encoded block corresponding to the second data stream is a reversed order, a second order used by a third to-be-encoded block corresponding to the third data stream is that mapped information bit blocks are placed into the third to-be-encoded block according to a first order.

Figure 12B:
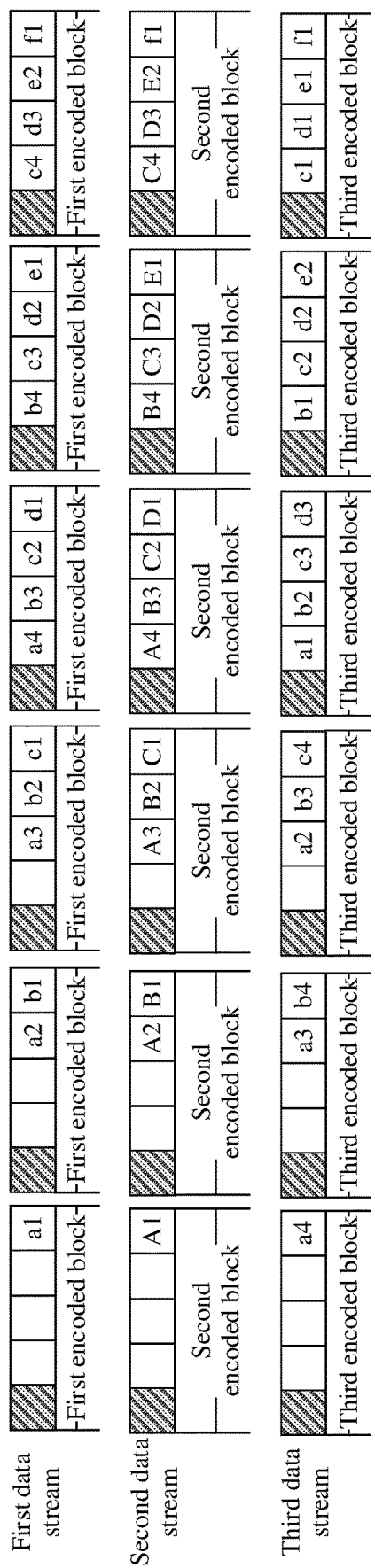
FIG. 12b is a schematic diagram of three data streams simultaneously sent by another first communication device according to an embodiment.

Optionally, FIG. 12b is a schematic diagram of to-be-encoded blocks corresponding to three data streams simultaneously sent by another first communication device according to an embodiment. The second order used by the second to-be-encoded block corresponding to the second data stream is that mapped information bit blocks are placed into the second to-be-encoded block in the first order. In this case, the second order used by the third to-be-encoded block corresponding to the third data stream is a reversed order.

The first communication device may separately perform polar code encoding on M third to-be-encoded blocks, to obtain M third encoded blocks. It may be understood that for analysis on a code rate of the third encoded block, refer to analysis on the code rate of the first encoded block in the foregoing embodiment. Details are not described herein again.

S1108: The first communication device simultaneously sends a first data stream, a second data stream and a third data stream to the second communication device. Correspondingly, the second communication device simultaneously receives the first data stream, the second data stream, and the third data stream that are sent by the first communication device.

S1109: The second communication device performs combined decoding on the first data stream and the second data stream, to obtain decoded data.

According to S407, the first communication device may send one or more data streams to the second communication device through one or more antennas by using a MIMO technology. Similarly, when the first communication device simultaneously sends the first data stream, the second data stream, and the third data stream to the second communication device, the first data stream, the second data stream, and the third data stream are combined into one aggregated data stream during channel transmission. In addition, the aggregated data stream further includes a noise signal and the like. Correspondingly, when the second communication device simultaneously receives the first data stream, the second data stream, and the third data stream, the second communication device receives the aggregated data stream obtained by combining the first data stream, the second data stream, and the third data stream.

After receiving the aggregated data stream obtained by combining the first data stream, the second data stream, and the third data stream, the second communication device may perform combined decoding on the aggregated data stream to obtain decoded data. Similar to combined decoding of the first data stream and the second data stream in FIG. 4, combined decoding described in this embodiment also includes the following two phases.

The first phase of combined decoding includes detection performed by the second communication device to distinguish between a plurality of data streams, noise signals, and the like. For example, the second communication device in this embodiment puts the aggregated data stream into an MMSE-SIC detector, to obtain the three data streams included in the aggregated data stream and an order of SNRs (or code rates) of the data streams.

The second phase of combined decoding is an interactive process. The second communication device first performs polar code decoding on an encoded block in a data stream with a highest SNR (or code rate), to decode some parts. Then, the second communication device performs polar code decoding on an encoded block in a data stream with a second highest SNR (or code rate). When the encoded block in the data stream with the second highest SNR (or code rate) is decoded, the some decoded parts obtained during decoding the encoded block in the data stream with the highest SNR (or code rate) may be used, and vice versa.

The second communication device first decodes the first encoded block and may decode some parts. Then, the second encoded block is decoded, and the some parts decoded during decoding of the first encoded block may be used during decoding of the second encoded block. Finally, the third encoded block is decoded, and the some parts decoded during decoding of the first encoded block and the second encoded block may be used during decoding of the third encoded block.

According to the Shannon theorem, when the aggregated data stream received by the second communication device includes the first data stream, the second data stream, and the third data stream, if a sum of channel capacities of the first data stream, the second data stream, and the third data stream is greater than or equal to a code rate R, the second communication device can implement reliable decoding on the first data stream, the second data stream, and the third data stream at all times in the combined decoding manner described in this embodiment.

A first target data stream may be obtained if a sum of channel capacities of the first data stream, the second data stream, and the third data stream is greater than or equal to a code rate R. The first target data stream is a data stream with a highest signal-to-noise ratio in a first to-be-decoded data stream, and the first to-be-decoded data stream includes the first data stream, the second data stream, and the third data stream.

$k_1$ information bit subblocks $[a_1, a_2, \ldots, a_{k_1}]$ in one information bit block included in the first target data stream are obtained through decoding, where $k_1$ meets $1 \leq k_1 < Q$.

First reconstructed information is obtained after encoding and reconstructing the $k_1$ information bit subblocks $[a_1, a_2, \ldots, a_{k_1}]$.

A second to-be-decoded data stream is obtained. The second to-be-decoded data stream is a data stream obtained after the first reconstructed information is removed from the first to-be-decoded data stream.

$k_2$ information bit subblocks $[a_Q, a_{Q-1}, \ldots, a_{Q-k_2+1}]$ in the information bit block included in a second target data stream are obtained through decoding, where $k_1$ and $k_2$ meet $k_1 + k_2 < Q$. The second target data stream is a data stream with a second highest signal-to-noise ratio in the first to-be-decoded data stream.

Second reconstructed information is obtained after encoding and reconstructing the $k_2$ information bit subblocks $[a_Q, a_{Q-1}, \ldots, a_{Q-k_2+1}]$.

The second reconstructed information is removed from the second to-be-decoded data stream.

$k_3$ information bit subblocks $[A_1, A_2, \ldots, A_{k_3}]$ in the information bit block included in a third target data stream are obtained through decoding, where $k_1$, $k_2$, and $k_3$ meet $k_1 + k_2 + k_3 \geq Q$. The third target data stream is a data stream with a lowest signal-to-noise ratio in the first to-be-decoded data stream.

$k_3$ information bit subblocks that are $[a_{k_1+1}, a_{k_1+1}, \ldots, a_{Q-k_2}]$ and that correspond to the $k_3$ information bit subblocks before mapping are obtained based on the mapping relationship between the first order and the second order.

Q information bit subblocks that are $[a_1, a_2, \ldots, a_Q]$ and that are included in the information bit block are obtained.

For example, the first data stream, the second data stream, and the third data stream that are sent by the first communication device are shown in FIG. 12*a*. It is assumed that the first data stream is sent on a first channel, and a channel capacity of the first channel is greater than or equal to R/2. It is assumed that the second data stream is sent on a second channel, and a channel capacity of the second channel is greater than or equal to R/4. It is assumed that the third data stream is sent on a third channel, and a channel capacity of the third channel is greater than or equal to R/4.

For the mapping relationship in FIG. 12*a*, because a quantity of information bit subblocks included in each information bit block is exactly a power of 2, an information bit block after mapping and an information bit block before mapping meets the following relationship:

$$[A_1, A_2, A_3, A_4] = [a_1, a_2, a_3, a_4] * F$$

$$[B_1, B_2, B_3, B_4] = [b_1, b_2, b_3, b_4] * F$$

$$[C_1, C_2, C_3, C_4] = [c_1, c_2, c_3, c_4] * F$$

$$[D_1, D_2, D_3, D_4] = [0, d_1, d_2, d_3] * F$$

$$[E_1, E_2, E_3, E_4] = [0, 0, e_1, e_2] * F$$

It should be noted that if a quantity of information bit subblocks included in each information bit block is not a power of 2, when the information bit subblocks are processed, zero padding processing needs to be performed, so that a complete polar code generator matrix is used during mapping of the information bit block. Alternatively, if zero padding processing is not performed on the information bit block, a submatrix of a polar code generator matrix is used during mapping of the information bit block.

In the first data stream, a code rate of a $1^{st}$ encoded block is R/4, a code rate of a $2^{nd}$ encoded block is 2R/4, a code rate of a $3^{rd}$ encoded block is 3R/4, and code rates of $4^{th}$, $5^{th}$, and $6^{th}$ packets are R. After polar code encoding, the encoded blocks and packets are sent to the second communication device through a 3×3 MIMO channel. Similarly, in the second data stream, a code rate of a $1^{st}$ encoded block is R/4, a code rate of a $2^{nd}$ encoded block is 2R/4, a code rate of a $3^{rd}$ encoded block is 3R/4, and code rates of $4^{th}$, $5^{th}$, and $6^{th}$ packets are R. After polar code encoding, the encoded blocks and packets are sent to the second communication device through a 3×3 MIMO channel. Similarly, in the third data stream, a code rate of a $1^{st}$ encoded block is R/4, a code rate of a $2^{nd}$ encoded block is 2R/4, a code rate of a $3^{rd}$ encoded block is 3R/4, and code rates of $4^{th}$, $5^{th}$, and $6^{th}$ packets are R. After polar code encoding, the encoded blocks and packets are sent to the second communication device through a 3×3 MIMO channel.

Correspondingly, after receiving the first data stream, the second data stream, and the third data stream, the second communication device performs the following combined decoding:

The second communication device puts the received aggregated data stream into an MMSE-SIC detector. The detector first decodes a data stream with a highest SNR (or code rate). It is assumed that the first data stream is the data stream with the highest SNR (or code rate). In this case, the second communication device performs polar code decoding on the first data stream. According to the Shannon theorem, code rates of a $1^{st}$ encoded block and a $2^{nd}$ second encoded block in the first data stream are both less than or equal to the channel capacity of the first channel. In this case, the second communication device may obtain $a_1$, $a_2$, and $b_1$ by decoding the first data stream.

The second communication device encodes and reconstructs the obtained $a_1$, $a_2$, and $b_1$, to obtain reconstructed first reconstructed information, feeds back the first reconstructed information to the MMSE-SIC detector, and removes interference caused by known bits from the aggregated data stream. For example, after the first reconstructed information is removed from the aggregated data stream, the aggregated data stream may be updated, and the updated aggregated data stream does not include the interference caused by known bits. In this case, when detection is performed again by the second communication device, some interference can be reduced.

The second communication device puts the updated aggregated data stream into an MMSE-SIC detector, and the detector decodes a data stream with a second highest SNR (or code rate). It is assumed that the second data stream is a data stream with a second highest SNR (or code rate). In this case, the second communication device performs polar code decoding on the second data stream. According to the Shannon theorem, if the code rate of a $1^{st}$ encoded block in the second data stream is less than or equal to the channel capacity of the second channel, the second communication device may obtain $a_4$ by decoding the second data stream.

The second communication device encodes and reconstructs the obtained $a_3$, to obtain reconstructed second reconstructed information, feeds back the second reconstructed information to the MMSE-SIC detector, and removes interference caused by known bits from the aggregated data stream. For example, after the second reconstructed information is removed again from the updated aggregated data stream, the aggregated data stream may be updated again, and the updated aggregated data stream does not include the interference caused by known bits. In this case, when detection is performed again by the second communication device, some interference can be reduced.

The second communication device puts the updated aggregated data stream into an MMSE-SIC detector, and the detector decodes a data stream with a third highest SNR (or code rate). It may be understood that, in this example, the first communication device sends three data streams in total. In this case, the data stream with the third highest SNR (or code rate) obtained by the second communication device during the third detection is a data stream with a lowest SNR (or code rate). In this example, the data stream with the lowest SNR (or code rate) is the third data stream.

The second communication device performs polar code decoding on the third data stream. According to the Shannon theorem, if the code rate of a $1^{st}$ encoded block in the third data stream is less than or equal to the channel capacity of the third channel, the second communication device may obtain A by decoding the third data stream.

After obtaining $a_1$, $a_2$, $a_4$, and $A_1$, the first communication device may obtain, through decoding, $a_3$, $A_2$, $A_3$, and $A_4$ according to an inter-bit relational expression $[A_1, A_2, A_3, A_4]=[a_1, a_2, a_3, a_4]*F$.

After $a_3$ and $A_2$ are obtained, a code rate of a $2^{nd}$ encoded block in the second data stream is reduced to R/4. According to the Shannon theorem, if the code rate of the $2^{nd}$ encoded block in the second data stream is less than or equal to the channel capacity of the second channel, the second communication device may obtain $b_4$ by decoding the second data stream. Similarly, a code rate of a $2^{nd}$ encoded block of the third data stream is reduced to R/4, and the second communication device may obtain $B_1$ by decoding the third data stream. Similarly, a code rate of a $3^{rd}$ encoded block of the first data stream is reduced to R/2, and the second communication device may obtain $b_2$ and $c_1$ by decoding the first data stream and.

After obtaining $b_1$, $b_2$, $b_4$, and $B_1$, the first communication device may obtain, through decoding, $b_3$, $B_2$, $B_3$, and $B_4$ according to an inter-bit relational expression $[B_1, B_2, B_3, B_4]=[b_1,b_2,b_3,b_4]*F$.

After $a_2$ and $b_3$ are obtained, a code rate of a $3^{rd}$ encoded block in the second data stream is reduced to R/4. According to the Shannon theorem, if the code rate R/4 of a $3^{rd}$ encoded block in the second data stream is less than or equal to the channel capacity of the second channel, the second communication device may obtain $c_4$ by decoding the second data stream. Similarly, after obtaining $A_3$ and $B_2$, the second communication device may obtain $C_1$ by decoding the third data stream. Similarly, after obtaining $a_4$ and $b_3$, the second communication device may obtain $c_2$ and $d_1$ by decoding the first data stream.

After obtaining $c_1$, $c_2$, $c_4$, and $C_1$, the first communication device may obtain, through decoding, $c_3$, $C_2$, $C_3$, and $C_4$ according to an inter-bit relational expression $[C_1,C_2,C_3,C_4]=[c_1,c_2,c_3,c_4]*F$.

After $a_1$, $b_2$, and $c_3$ are obtained, a code rate of a $4^{th}$ encoded block in the second data stream is reduced to R/4. According to the Shannon theorem, if the code rate R/4 of the $4^{th}$ encoded block in the second data stream is less than or equal to the channel capacity of the second channel, the second communication device may obtain $d_3$ by decoding the second data stream. Similarly, after obtaining $A_4$, $B_3$, and $C_2$, the second communication device may obtain $D_1$ by decoding the third data stream. Similarly, after obtaining $b_4$ and $c_3$, the second communication device may obtain $d_2$ and $e_1$ by decoding the first data stream.

After obtaining $d_1$, $d_2$, and $D_1$, the first communication device may obtain, through decoding, $d_3$, $D_2$, $D_3$, and $D_4$ according to an inter-bit relational expression $[D_1, D_2, D_3, D_4]=[0,d_1,d_2,d_3]*F$.

After $b_1$, $c_2$ and $d_2$ are obtained, a code rate of a $5^{th}$ encoded block in the second data stream is reduced to R/4. According to the Shannon theorem, if the code rate R/4 of the $5^{th}$ encoded block in the second data stream is less than or equal to the channel capacity of the second channel, the second communication device may obtain $e_2$ by decoding the second data stream. Similarly, after obtaining $B_4$, $C_3$ and $D_2$, the second communication device may obtain $E_1$ by decoding the third data stream. Similarly, after obtaining $c_4$ and $d_3$, the second communication device may obtain $e_2$ and $f_1$ by decoding the first data stream.

After obtaining $e_1$, $e_2$, and $E_1$, the first communication device may obtain, through decoding, $E_2$ according to an inter-bit relational expression $[E_1, E_2, E_3, E_4]=[0, 0, e_1, e_2]*F$.

In conclusion, all information bits $a_1, a_2, a_3, b_1, b_2, b_3, c_1, c_2, c_3, d_1, d_2, d_3, e_1, e_2, f_1$ included in the first data stream, the second data stream, and the third data stream that are simultaneously transmitted by the first communication device can be obtained through decoding. In other words, reliable transmission of all information bits is implemented.

It should be noted that the foregoing example provides only one possible code rate allocation manner, but a code rate allocation manner of each data stream is not limited to the foregoing example, and the following conditions need to be met:

It is assumed that the maximum capacities of the three bitstreams are $r_1=Rk_1/Q$, $r_2=Rk_2/Q$, $r_3=Rk_3/Q$ respectively, where $k_1$, $k_2$, $k_3 \in [0, 1, 2, \ldots Q]$ and $k_1+k_2+k_3=Q$. If $r_1+r_2+r_3 \geq R$, all bits can be successfully decoded. A larger value of Q indicates a smaller code rate loss.

It should be noted that, during polar code decoding, decoding should be preferentially performed on a bit stream with a higher code rate. Otherwise, interference caused by another bitstream with a lower code rate cannot be avoided.

An embodiment may provide a data processing method. The method is implemented through interaction between a first communication device and a second communication device. The first communication device may simultaneously send the first data stream, the second data stream, and the third data stream to the second communication device. A plurality of information bit subblocks in M first encoded blocks in the first data stream are arranged in a first order. A plurality of information bit subblocks in M second encoded blocks in the second data stream are arranged in a second order. The second order and the first order meet a mapping relationship. A plurality of information bit subblocks in M third encoded blocks in the third data stream are arranged in a second order. The second order used for the third encoded blocks is different from the second order used for the second encoded blocks. When combined decoding is performed, a decoding result obtained each time may be removed from the three data streams as known information. This reduces interference of the known information and helps implement correct decoding.

Figure 13:
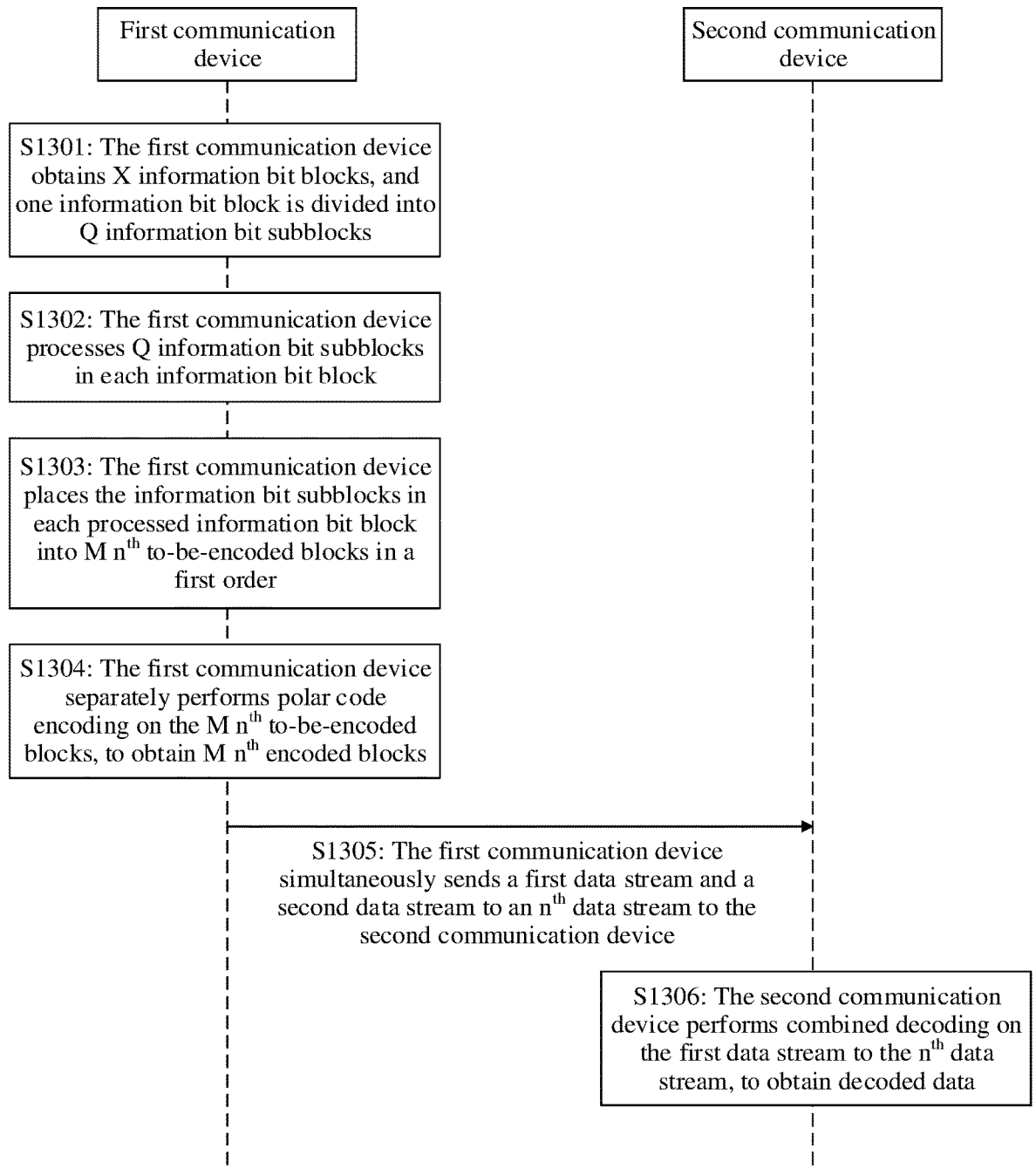
FIG. 13 is a schematic flowchart of still another data processing method according to an embodiment.

Based on the description in the embodiment shown in FIG. 4, the following describes in detail a case in which the first communication device simultaneously sends four or more data streams to the second communication device, and the second communication device simultaneously receives the four or more data streams and performs combined decoding on the four or more data streams. FIG. 13 shows still another data processing method according to an embodiment. The data processing method may be performed through interaction between a first communication device and a second communication device, and may include the following steps.

S1301: The first communication device obtains X information bit blocks, and one information bit block is divided into Q information bit subblocks.

S1302: The first communication device processes Q information bit subblocks in each information bit block.

S1303: The first communication device places the information bit subblocks in each processed information bit block into M $n^{th}$ to-be-encoded blocks in a first order.

S1304: The first communication device separately performs polar code encoding on the M $n^{th}$ to-be-encoded blocks, to obtain M $n^{th}$ encoded blocks.

When the first communication device simultaneously sends four or more data streams, because there is no UDM matrix in a binary field, the first communication device cannot process the information bit subblocks in the binary field. In this case, when processing each information bit block, the first communication device may map each information bit block $[a_1, a_2, \ldots, a_Q]$ from the binary field to a $2^w$ number system field, and any mapped information bit block meets $[\bar{a}_1, \bar{a}_2, \ldots, \bar{a}_Q]$. $\bar{a}_q$ is any information bit subblock in the any information bit block mapped from the binary field to a $2^w$ number system field, $\bar{a}_q$ is a $2^w$ number system sequence whose length is K/wQ, and w is a positive integer greater than 1.

The first communication device converts the mapped $[\bar{a}_1, \bar{a}_2, \ldots, \bar{a}_Q]$ by using a universal decoding matrix (UDM). The any mapped information bit block and a converted corresponding information bit block meet the following relationship:

$$[\bar{A}_{n,1}, \bar{A}_{n,2}, \ldots, \bar{A}_{n,Q}]=[\bar{a}_1, \bar{a}_2, \ldots, \bar{a}_Q]*H_n, \text{ where}$$

$\bar{A}_{n,q}$ is an information bit subblock corresponding to $\bar{a}_q$ after conversion, $H_n$ is a universal decoding matrix UDM of K/w×K/w in the $2^w$ number system field, n indicates an $n^{th}$ data stream, n meets $n \in [1, 2, \ldots, N]$, N is a total quantity of data streams sent by the first communication device, and N is a positive integer greater than 3.

The first communication device performs demapping on $[\bar{A}_{n,1}, \bar{A}_{n,2}, \ldots, \bar{A}_{n,Q}]$, and obtains a demapped corresponding information bit block that meets $[A_{n,1}, A_{n,2}, \ldots, A_{n,Q}]$. Demapped $A_{n,Q}$ is a binary sequence whose length is K/Q.

According to the foregoing processing procedure, when simultaneously sending four or more data streams, the first communication device may process the information bit subblocks, and then perform subsequent sorting and encoding.

The following uses n=4 as an example for description, where n=4 indicates that the first communication device simultaneously sends four data streams to the second communication device. In this case, the first communication device may separately place information bit subblocks in each processed information bit block into M first to-be-encoded blocks, M second to-be-encoded blocks, M third to-be-encoded blocks, and M fourth to-be-encoded blocks in a first order. Then, polar code coding is separately performed on the M first to-be-encoded blocks, the M second to-be-encoded blocks, the M third to-be-encoded blocks, and the M fourth to-be-encoded blocks. It may be understood that a case in which more times of transmission such as n=5 and n=6 are performed is similar to an implementation in which n=4. For details, refer to an implementation in which n=4.

Figure 14:
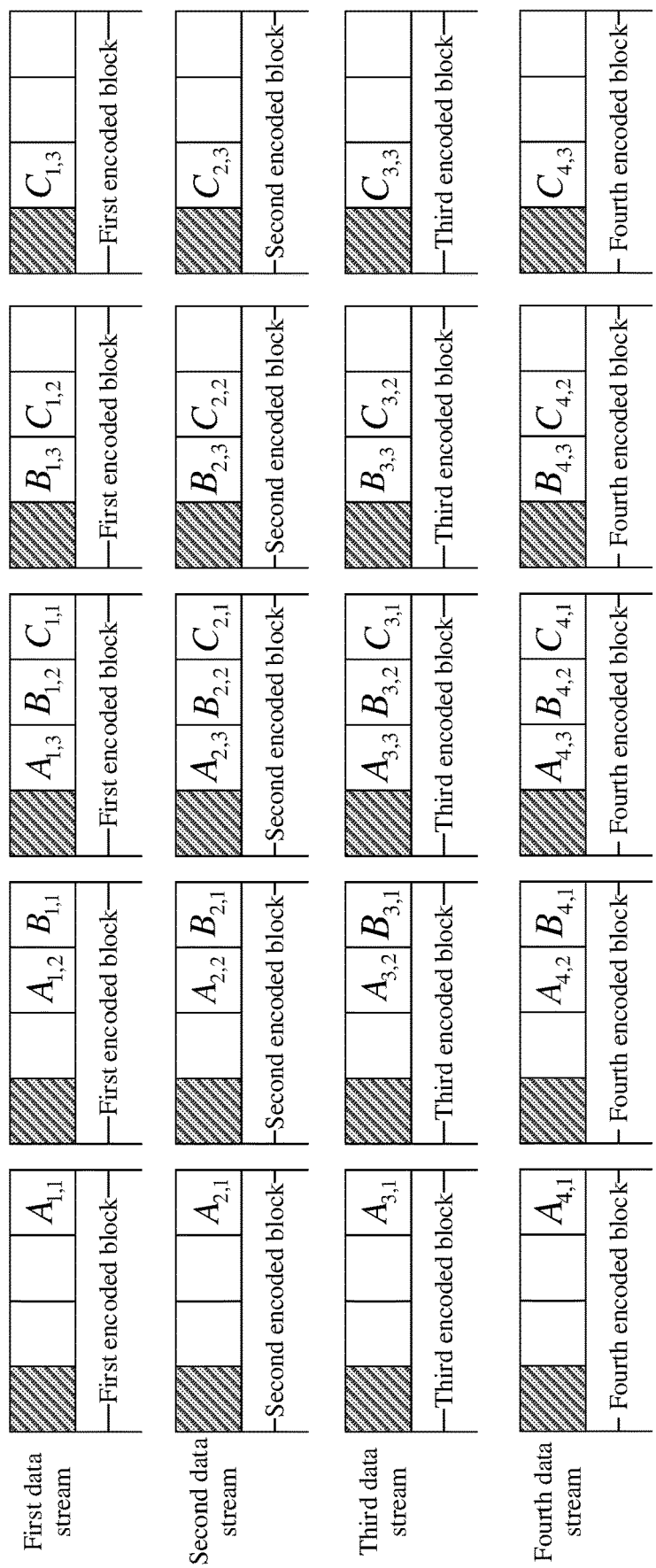
FIG. 14 is a schematic diagram of four data streams simultaneously sent by a first communication device according to an embodiment.

FIG. 14 is a schematic diagram of a first data stream, a second data stream, a third data stream, and a fourth data stream that are simultaneously sent by a first communication device according to an embodiment. Q=3, and M=5. The information bit subblocks in the first encoded block in the first data stream are arranged in the first order. For example, $A_{1,1}$, $A_{1,2}$, $A_{1,3}$ respectively indicates information bit subblocks in a first encoded block carried in the first data stream, and the information bit subblocks are information bit subblocks obtained after processing $a_1$, $a_2$, $a_3$ in original information bit subblocks.

The information bit subblocks in the second encoded block in the second data stream are arranged in the first order. For example, $A_{2,1}$, $A_{2,2}$, $A_{2,3}$ respectively indicates information bit subblocks in a second encoded block carried in the second data stream, and the information bit subblocks are information bit subblocks that are different from $A_{1,1}$, $A_{1,2}$, $A_{1,3}$ and that are obtained after processing $a_1$, $a_2$, $a_3$ in original information bit subblocks.

The information bit subblocks in the third encoded block of the third data stream are arranged in the first order. For example, $A_{3,1}$, $A_{3,2}$, $A_{3,3}$ respectively indicates information bit subblocks in a third encoded block carried in the third data stream, and the information bit subblocks are information bit subblocks that are different from $A_{1,1}$, $A_{1,2}$, $A_{1,3}$ and $A_{2,1}$, $A_{2,2}$, $A_{2,3}$ and that are obtained after processing $a_1$, $a_2$, $a_3$ in original information bit subblocks.

The information bit subblocks in the fourth encoded block of the fourth data stream are arranged in the first order. For example, $A_{4,1}$, $A_{4,2}$, $A_{4,3}$ respectively indicates information bit subblocks in a fourth encoded block carried in the fourth data stream, and the information bit subblocks are information bit subblocks that are different from $A_{1,1}$, $A_{1,2}$, $A_{1,3}$, $A_{2,1}$, $A_{2,2}$, $A_{2,3}$, and $A_{3,1}$, $A_{3,2}$, $A_{3,3}$ and that are obtained after processing $a_1$, $a_2$, $a_3$ in original information bit subblocks.

S1305: The first communication device simultaneously sends a first data stream and a second data stream to an $n^{th}$ data stream to the second communication device. Correspondingly, the second communication device simultaneously receives the first data stream and the second data stream to the $n^{th}$ data stream that are sent by the first communication device.

S1306: The second communication device performs combined decoding on the first data stream to the $n^{th}$ data stream, to obtain decoded data.

The following still uses n=4 for description. The second communication device may perform combined decoding on the four simultaneously received data streams.

For example, if a sum of channel capacities of the first data stream, the second data stream, the third data stream, and the fourth data stream is greater than or equal to a code rate R. The second communication device obtains, through decoding, $k_1$ information bit subblocks $[A_{1,1}, A_{1,2}, \ldots, A_{1,k_1}]$ in one information bit block included in the first target data stream, where $k_1$ meets $1 \leq k_1 \leq Q$. The first target data stream is a data stream with a highest signal-to-noise ratio in a first to-be-decoded data stream, and the first to-be-decoded data stream includes the first data stream, the second data stream, the third data stream, and the fourth data stream.

The second communication device obtains first reconstructed information obtained after encoding and reconstructing the $k_1$ information bit subblocks $[A_{1,1}, A_{1,2}, \ldots, A_{1,k_1}]$.

The second communication device obtains a second to-be-decoded data stream. The second to-be-decoded data stream is a data stream obtained after the first reconstructed information is removed from the first to-be-decoded data stream.

The second communication device obtains $[\overline{A}_{1,1}, \overline{A}_{1,2}, \ldots, \overline{A}_{1,k_1}]$ based on $[A_{1,1}, A_{1,2}, \ldots, A_{1,k_1}]$.

The second communication device obtains, through decoding, $k_2$ information bit subblocks $[A_{2,1}, A_{2,2}, \ldots, A_{2,k_2}]$ in the information bit block included in a second target data stream, where $k_1$ and $k_2$ meet $1 \leq k_2 \leq Q$ and $k_1 + k_2 < Q$. The second target data stream is a data stream with a second highest signal-to-noise ratio in the first to-be-decoded data stream.

The second communication device obtains second reconstructed information obtained after encoding and reconstructing the $k_2$ information bit subblocks $[A_{2,1}, A_{2,2}, \ldots, A_{2,k_2}]$.

The second communication device obtains a third to-be-decoded data stream. The third to-be-decoded data stream is a data stream obtained after the second reconstructed information is removed from the second to-be-decoded data stream.

The second communication device obtains $[\overline{A}_{2,1}, \overline{A}_{2,2}, \ldots, \overline{A}_{2,k_2}]$ based on $[A_{2,1}, A_{2,2}, \ldots, A_{2,k_2}]$.

The second communication device obtains, through decoding, $k_3$ information bit subblocks $[A_{3,1}, A_{3,2}, \ldots, A_{3,k_3}]$ in the information bit block included in a third target data stream, where $k_3$ meets $1 \leq k_3 \leq Q$, and $k_1$, $k_2$, and $k_3$ meet $k_1 + k_2 + k_3 < Q$. The third target data stream is a data stream with a third highest signal-to-noise ratio in the first to-be-decoded data stream.

The second communication device obtains third reconstructed information obtained after encoding and reconstructing the $k_3$ information bit subblocks $[A_{3,1}, A_{3,2}, \ldots, A_{3,k_3}]$.

The second communication device obtains a fourth to-be-decoded data stream. The fourth to-be-decoded data stream is a data stream obtained after the third reconstructed information is removed from the third to-be-decoded data stream.

The second communication device obtains $[\overline{A}_{3,1}, \overline{A}_{3,2}, \ldots, \overline{A}_{3,k_3}]$ based on $[A_{3,1}, A_{3,2}, \ldots, A_{3,k_3}]$.

The second communication device obtains, through decoding, $k_4$ information bit subblocks $[A_{4,1}, A_{4,2}, \ldots, A_{4,k_4}]$ in the information bit block included in a fourth target data stream, where $k_4$ meets $1 \leq k_4 \leq Q$, and $k_1$, $k_2$, $k_3$, and $k_4$ meet $k_1 + k_2 + k_3 + k_4 \geq Q$. The fourth target data stream is a data stream with a lowest signal-to-noise ratio in the first to-be-decoded data stream.

The second communication device may obtain $[\overline{A}_{4,1}, \overline{A}_{4,2}, \ldots, \overline{A}_{4,k_4}]$ based on $[A_{4,1}, A_{4,2}, \ldots, A_{4,k_4}]$.

The second communication device may obtain $[\overline{a}_1, \overline{a}_2, \ldots, \overline{a}_Q]$ based on $[\overline{A}_{1,1}, \overline{A}_{1,2}, \ldots, \overline{A}_{1,k_1}]$, $[\overline{A}_{2,1}, \overline{A}_{2,2}, \ldots, \overline{A}_{2,k_2}]$, $[\overline{A}_{3,1}, \overline{A}_{3,2}, \ldots, \overline{A}_{3,k_3}]$, $[\overline{A}_{4,1}, \overline{A}_{4,2}, \ldots, \overline{A}_{4,k_4}]$, and a property of the UDM.

The second communication device further demaps $[\overline{a}_1, \overline{a}_2, \ldots, \overline{a}_Q]$ and obtains Q information bit subblocks that are $[a_1, a_2, \ldots, a_Q]$ and that are included in the information bit block.

For example, it is assumed that the first data stream is sent on a first channel, and a channel capacity of the first channel is greater than or equal to R/4. It is assumed that the second data stream is sent on a second channel, and a channel capacity of the second channel is greater than or equal to R/4. It is assumed that the third data stream is sent on a third channel, and a channel capacity of the third channel is greater than or equal to R/4. It is assumed that the fourth data stream is sent on a fourth channel, and a channel capacity of the fourth channel is greater than or equal to R/4. In this case, according to the foregoing decoding procedure, the second communication device can correctly decode the plurality of received data streams.

An embodiment may provide a data processing method. The method is implemented through interaction between a first communication device and a second communication device. The first communication device may simultaneously send the first data stream and the second data stream to the $n^{th}$ data stream to the second communication device. The first communication device may process to-be-sent original data, separately place processed to-be-encoded blocks into the M $n^{th}$ to-be-encoded blocks in the first order, and then perform polar code encoding on the to-be-encoded blocks. When combined decoding is performed, a decoding result obtained each time may be removed from the n data streams as known information. This reduces interference of the known information and helps implement correct decoding.

The following describes in detail an apparatus and a device with reference to FIG. 15 to FIG. 18.

Figure 15:
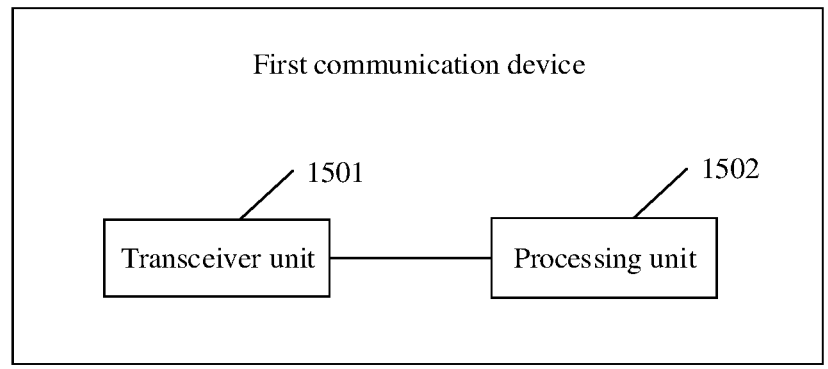
FIG. 15 is a schematic diagram of a structure of a communication device according to an embodiment.

An embodiment may provide a communication device. As shown in FIG. 15, the communication device is configured to implement the method performed by the first communication device in the foregoing method embodiments, and may include:

a transceiver unit 1501, configured to obtain X information bit blocks, where one information bit block includes K information bits, one information bit block is divided into Q information bit subblocks, and one information bit subblock is a binary sequence whose length is K/Q; and a processing unit 1502, configured to place Q information bit subblocks in each of the information bit blocks into Q first to-be-encoded blocks of M first to-be-encoded blocks in a first order, where the first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located, q meets 1≤q≤Q, and M meets M=X+Q−1.

The processing unit 1502 is further configured to separately perform polar code encoding on the M first to-be-encoded blocks, to obtain M first encoded blocks.

The processing unit 1502 is further configured to place the Q information bit subblocks in each of the information bit blocks into Q second to-be-encoded blocks of M second to-be-encoded blocks in a second order. The second order and the first order meet a mapping relationship.

The processing unit 1502 is further configured to separately perform polar code encoding on the M second to-be-encoded blocks, to obtain M second encoded blocks.

The transceiver unit 1501 is further configured to simultaneously send a first data stream and a second data stream to a second communication device. The first data stream includes the M first encoded blocks, and the second data stream includes the M second encoded blocks.

In an implementation, the second order is that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

In an implementation, the first order and the second order meet the following mapping relationship:

$$[A_1, A_2, \ldots, A_{2^P}] = [0, 0, \ldots, 0, a_1, a_2, \ldots, a_Q] F^{\otimes (J+P)},$$
where $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q = 2^J$, P is a positive integer and meets $2^{P-1} \leq Q \leq 2^P$, and t meets $1 \leq t \leq 2^P$.

In an implementation, the processing unit 1502 is further configured to:

place the Q information bit subblocks in each of the information bit blocks into Q third to-be-encoded blocks of M third to-be-encoded blocks in a second order, where the second order used for the third to-be-encoded blocks is different from the second order used for the second to-be-encoded blocks; and separately perform polar code encoding on the M third to-be-encoded blocks, to obtain M third encoded blocks.

That the transceiver unit 1501 is configured to simultaneously send a first data stream and a second data stream to a second communication device and may include:

simultaneously sending the first data stream, the second data stream, and a third data stream to the second communication device, where the third data stream includes the M third encoded blocks.

In an implementation, the processing unit 1502 is further configured to:

map the Q information bit subblocks in each of the information bit blocks from a binary field to a $2^w$ number system field, to obtain any mapped information bit block [$\bar{a}_1, \bar{a}_2, \ldots, \bar{a}_Q$], where $\bar{a}_q$ is any information bit subblock in the any mapped information bit block, $\bar{a}_q$ is a sequence whose length is K/wQ, and w is a positive integer greater than 1;

convert Q information bit subblocks in each mapped information bit block, where Q information bit subblocks in any mapped information bit block and corresponding Q information bit subblocks after conversion meet the following relationship:

$$[\bar{A}_{n,1}, \bar{A}_{n,2}, \ldots, \bar{A}_{n,Q}] = [\bar{a}_1, \bar{a}_2, \ldots, \bar{a}_Q] * H_n, \text{ where}$$

$\bar{A}_{n,q}$ is an information bit subblock corresponding to $\bar{a}_q$ after conversion, $H_n$ is a universal decoding matrix UDM of K/w×K/w in the $2^w$ number system field, n indicates an $n^{th}$ data stream, n meets n∈[1, 2, ..., N], N is a total quantity of data streams sent by the first communication device, and N is a positive integer greater than 3;

perform demapping on [$\bar{A}_{n,1}, \bar{A}_{n,2}, \ldots, \bar{A}_{n,Q}$], to obtain an information bit block that is [$A_{n,1}, A_{n,2}, \ldots, A_{n,Q}$] and that corresponds to [$\bar{A}_{n,1}, \bar{A}_{n,2}, \ldots, \bar{A}_{n,Q}$] after demapping, where $A_{n,Q}$ is a binary sequence whose length is K/Q;

place Q information bit subblocks in any demapped information bit block into M $n^{th}$ to-be-encoded blocks in the first order; and separately perform polar code encoding on the M $n^{th}$ to-be-encoded blocks, to obtain M $n^{th}$ encoded blocks.

The transceiver unit 1501 may be configured to simultaneously send a first data stream and a second data stream to a second communication device and may include:

simultaneously sending the first data stream and the second data stream to the $n^{th}$ data stream to the second communication device, where the $n^{th}$ data stream includes the M $n^{th}$ encoded blocks.

In an implementation, any encoded block carries at least one information bit subblock and at most Q information bit subblocks, and the encoded block includes the first encoded block and the second encoded block.

In an implementation, each of the encoded blocks is sequentially arranged based on identifiers of the encoded blocks, and a $1^{st}$ encoded block carries one information bit subblock. A quantity of information bit blocks carried in the $1^{st}$ encoded block to a $Q^{th}$ encoded block increases by one in an arrangement order of the encoded blocks, and the $Q^{th}$ encoded block carries Q information bit subblocks. A quantity of information bit subblocks carried in a $(Q+1)^{th}$ encoded block to an $M^{th}$ encoded block decreases by one in the arrangement order of the encoded blocks, and the $M^{th}$ encoded block carries one information bit subblock.

In an implementation, Q is a quantization order of a code rate R, and Q is a positive integer. A code rate of an $i^{th}$ encoded block is $r_i = i \times R/Q$, and i meets 1≤i≤Q. A code rate of a $j^{th}$ encoded block is $r_j = (M-j+1) \times R/Q$, and j meets Q+1≤j≤M.

Figure 16:
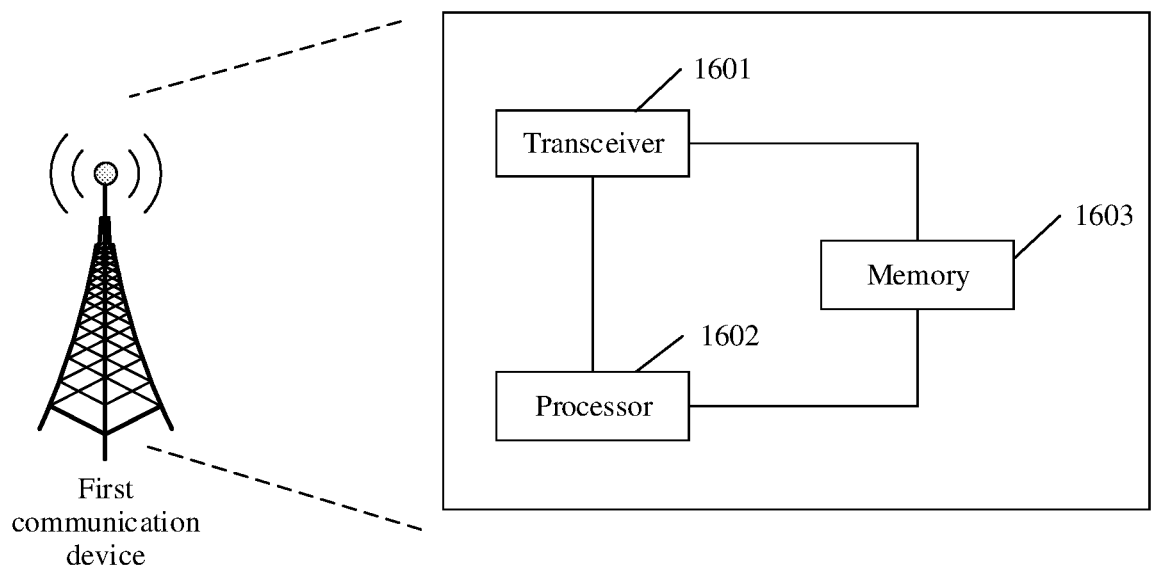
FIG. 16 is a schematic diagram of a structure of another communication device according to an embodiment.

In an implementation, related functions implemented by the units in FIG. 15 may be implemented by using a transceiver and a processor. FIG. 16 is a schematic diagram of a structure of another communication device according to an embodiment. The communication device may be a device (for example, a chip) that has a data processing function described in the embodiments. The communication device may include a transceiver 1601, at least one processor 1602, and a memory 1603. The transceiver 1601, the processor 1602, and the memory 1603 may be connected to each other through one or more communication buses or may be connected to each other in another manner.

The transceiver 1601 may be configured to send data or receive data. It may be understood that the transceiver 1601 is a general term and may include a receiver and a transmitter. For example, the receiver is configured to obtain an information bit block. For another example, the transmitter is configured to simultaneously send a first data stream and a second data stream.

The processor 1602 may be configured to process data of the communication device, or process information to be sent by the transceiver 1601. For example, the processor 1602 may invoke program code stored in the memory 1603, to sort information bit subblocks in a first to-be-encoded block. The processor 1602 may include one or more processors. For example, the processor 1602 may be one or more central processing units (CPU), one or more network processors (NP), one or more hardware chips, or any combination thereof. When the processor 1602 is one CPU, the CPU may be a single-core CPU or may be a multi-core CPU.

The memory 1603 is configured to store the program code and the like. The memory 1603 may include a volatile memory, such as a random access memory (RAM). The memory 1603 may also include a non-volatile memory, such as a read-only memory (ROM), a flash memory, a hard disk drive (HDD), or a solid-state drive (SSD). The memory 1603 may further include a combination of the foregoing types of memories.

The processor 1602 and the memory 1603 may be coupled through an interface or may be integrated together. This is not limited in this embodiment.

The transceiver 1601 and the processor 1602 may be configured to implement the data processing method in the embodiments. Implementations may be as follows:

The transceiver 1601 is configured to obtain X information bit blocks. One information bit block includes K information bits, one information bit block is divided into Q information bit subblocks, and one information bit subblock is a binary sequence whose length is K/Q.

The processor 1602 is configured to place Q information bit subblocks in each of the information bit blocks into Q first to-be-encoded blocks of M first to-be-encoded blocks in a first order. The first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located, q meets $1 \leq q \leq Q$, and M meets M=X+Q−1.

The processor 1602 is further configured to separately perform polar code encoding on the M first to-be-encoded blocks, to obtain M first encoded blocks.

The processor 1602 is further configured to place the Q information bit subblocks in each of the information bit blocks into Q second to-be-encoded blocks of M second to-be-encoded blocks in a second order. The second order and the first order meet a mapping relationship.

The processor 1602 is further configured to separately perform polar code encoding on the M second to-be-encoded blocks, to obtain M second encoded blocks.

The transceiver 1602 is further configured to simultaneously send a first data stream and a second data stream to a second communication device. The first data stream includes the M first encoded blocks, and the second data stream includes the M second encoded blocks.

In an implementation, the second order is that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

In an implementation, the first order and the second order meet the following mapping relationship:

$$[A_1, A_2, \ldots, A_{2^P}] = [0, 0, \ldots, 0, a_1, a_2, \ldots, a_Q] F^{\otimes (J+P)},$$

where $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q = 2^J$, P is a positive integer and meets $2^{P-1} \leq Q \leq 2^P$, and t meets $1 \leq t \leq 2^P$.

In an implementation, the processor 1602 is further configured to:

place the Q information bit subblocks in each of the information bit blocks into Q third to-be-encoded blocks of M third to-be-encoded blocks in a second order, where the second order used for the third to-be-encoded blocks is different from the second order used for the second to-be-encoded blocks; and separately perform polar code encoding on the M third to-be-encoded blocks, to obtain M third encoded blocks.

The transceiver 1601 may be configured to simultaneously send a first data stream and a second data stream to a second communication device and may include:

simultaneously sending the first data stream, the second data stream, and a third data stream to the second communication device, where the third data stream includes the M third encoded blocks.

In an implementation, the processor 1602 is further configured to:

map the Q information bit subblocks in each of the information bit blocks from a binary field to a $2^w$ number system field, to obtain any mapped information bit block [$\bar{a}_1, \bar{a}_2, \ldots, \bar{a}_Q$], where $\bar{a}_q$ is any information bit subblock in the any mapped information bit block, $\bar{a}_q$ is a sequence whose length is K/wQ, and w is a positive integer greater than 1;

convert Q information bit subblocks in each mapped information bit block, where Q information bit subblocks in any mapped information bit block and corresponding Q information bit subblocks after conversion meet the following relationship:

$$[\bar{A}_{n,1}, \bar{A}_{n,2}, \ldots, \bar{A}_{n,Q}] = [\bar{a}_1, \bar{a}_2, \ldots, \bar{a}_Q] * H_n, \text{ where}$$

$\bar{A}_{n,q}$ is an information bit subblock corresponding to after conversion, $H_n$ is a universal decoding matrix UDM of K/w×K/w in the $2^w$ number system field, n indicates an $n^{th}$ data stream, n meets $n \in [1, 2, \ldots, N]$, N is a total quantity of data streams sent by the first communication device, and N is a positive integer greater than 3;

perform demapping on [$\bar{A}_{n,1}, \bar{A}_{n,2}, \ldots, \bar{A}_{n,Q}$], to obtain an information bit block that is [$A_{n,1}, A_{n,2}, \ldots, A_{n,Q}$] and that corresponds to [$\bar{A}_{n,1}, \bar{A}_{n,2}, \ldots, \bar{A}_{n,Q}$] after demapping, where $A_{n,Q}$ is a binary sequence whose length is K/Q;

place Q information bit subblocks in any demapped information bit block into M $n^{th}$ to-be-encoded blocks in the first order; and separately perform polar code encoding on the M $n^{th}$ to-be-encoded blocks, to obtain M $n^{th}$ encoded blocks.

The transceiver 1601 may be configured to simultaneously send a first data stream and a second data stream to a second communication device and may include:

simultaneously sending the first data stream and the second data stream to the $n^{th}$ data stream to the second communication device, where the $n^{th}$ data stream includes the M $n^{th}$ encoded blocks.

In an implementation, any encoded block carries at least one information bit subblock and at most Q information bit subblocks, and the encoded block includes the first encoded block and the second encoded block.

In an implementation, each of the encoded blocks is sequentially arranged based on identifiers of the encoded blocks, and a $1^{st}$ encoded block carries one information bit subblock. A quantity of information bit blocks carried in the $1^{st}$ encoded block to a $Q^{th}$ encoded block increases by one in an arrangement order of the encoded blocks, and the $Q^{th}$ encoded block carries Q information bit subblocks. A quantity of information bit subblocks carried in a $(Q+1)^{th}$ encoded block to an $M^{th}$ encoded block decreases by one in the arrangement order of the encoded blocks, and the $M^{th}$ encoded block carries one information bit subblock.

In an implementation, Q is a quantization order of a code rate R, and Q is a positive integer. A code rate of an $i^{th}$ encoded block is $r_i = i \times R/Q$, and i meets $1 \leq i \leq Q$. A code rate of a $j^{th}$ encoded block is $r_j = (M-j+1) \times R/Q$, and j meets $Q+1 \leq j \leq M$.

Figure 17:
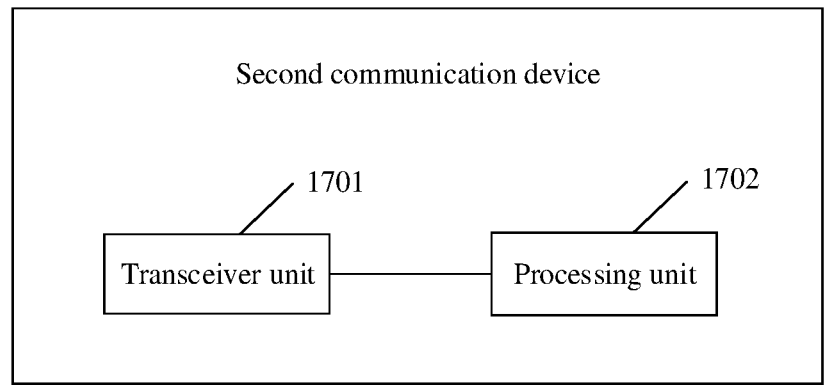
FIG. 17 is a schematic diagram of a structure of still another communication device according to an embodiment.

An embodiment may provide a communication device. As shown in FIG. 17, the communication device is configured to perform the method performed by the second communication device in the foregoing method embodiments, and may include:

The transceiver unit 1701 is configured to receive a first data stream and a second data stream that are simultaneously sent by a first communication device. The first data stream includes M first encoded blocks, and the second data stream includes M second encoded blocks.

The M first encoded blocks are obtained by performing polar code encoding on M first to-be-encoded blocks. The M first to-be-encoded blocks carry X information bit blocks, and each of the information bit blocks is divided into Q information bit subblocks. The Q information bit subblocks in each of the information bit blocks are placed into Q first to-be-encoded blocks of the M first to-be-encoded blocks in a first order. The first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located, q meets $1 \leq q \leq Q$, and M meets $M = X + Q - 1$.

The M second encoded blocks are obtained by performing polar code encoding on M second to-be-encoded blocks. The Q information bit subblocks in each of the information bit blocks are placed into Q second to-be-encoded blocks of the M second to-be-encoded blocks in a second order. The second order and the first order meet a mapping relationship.

The processing unit 1702 is configured to perform combined decoding on the first data stream and the second data stream, to obtain decoded data.

In an implementation, the second order is that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

In an implementation, the first order and the second order meet the following mapping relationship:

$$[A_1, A_2, \ldots, A_{2^P}] = [0, 0, \ldots, 0, a_1, a_2, \ldots, a_Q] F^{\otimes(J+P)},$$

where $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q = 2^J$, P is a positive integer and meets $2^{P-1} \leq Q \leq 2^P$, and t meets $1 \leq t \leq 2^P$.

In an implementation, the processing unit 1702 may be configured to perform combined decoding on the first data stream and the second data stream to obtain decoded data and may include:

obtaining a first target data stream if a sum of channel capacities of the first data stream and the second data stream is greater than or equal to a code rate R, where the first target data stream is a data stream with a highest signal-to-noise ratio in a first to-be-decoded data stream, and the first to-be-decoded data stream includes the first data stream and the second data stream;

obtaining, through decoding, $k_1$ information bit subblocks $[a_1, a_2, \ldots, a_{k_1}]$ in one information bit block included in the first target data stream, where $k_1$ meets $1 \leq k \leq Q$;

obtaining first reconstructed information obtained after encoding and reconstructing the $k_1$ information bit subblocks $[a_1, a_2, \ldots, a_{k_1}]$;

removing the first reconstructed information from the first to-be-decoded data stream;

obtaining, through decoding, $k_2$ information bit subblocks $[a_{Q-k_2}, a_{Q-k_2+1}, \ldots, a_Q]$ in the information bit block included in a second target data stream, where $k_1$ and $k_2$ meet $1 \leq k_2 \leq Q$ and $k_1 + k_2 \geq Q$, and the second target data stream is a data stream with a lowest signal-to-noise ratio in the first to-be-decoded data stream; and obtaining Q information bit subblocks that are $[a_1, a_2, \ldots, a_Q]$ and that are included in the information bit block.

In an implementation, the transceiver unit 1701 may be configured to receive the first data stream and the second data stream that are simultaneously sent by the first communication device and may include:

receiving the first data stream, the second data stream, and a third data stream that are simultaneously sent by the first communication device, where the third data stream includes M third encoded blocks, the M third encoded blocks are obtained by performing polar code encoding on M third to-be-encoded blocks, the Q information bit subblocks in each of the information bit blocks are placed into Q third to-be-encoded blocks of the M third to-be-encoded blocks in a second order, and the second order used for the third to-be-encoded blocks is different from the second order used for the second to-be-encoded blocks.

The processing unit 1702 may be configured to perform combined decoding on the first data stream and the second data stream to obtain decoded data and may include:

obtaining a first target data stream if a sum of channel capacities of the first data stream, the second data stream, and the third data stream is greater than or equal to a code rate R, where the first target data stream is a data stream with a highest signal-to-noise ratio in a first to-be-decoded data stream, and the first to-be-decoded data stream includes the first data stream, the second data stream, and the third data stream;

obtaining, through decoding, $k_1$ information bit subblocks $[a_1, a_2, \ldots, a_{k_1}]$ in one information bit block included in the first target data stream, where $k_1$ meets $1 \leq k < Q$;

obtaining first reconstructed information obtained after encoding and reconstructing the $k_1$ information bit subblocks $[a_1, a_2, \ldots, a_{k_1}]$;

obtaining a second to-be-decoded data stream, where the second to-be-decoded data stream is a data stream obtained after the first reconstructed information is removed from the first to-be-decoded data stream;

obtaining, through decoding, $k_2$ information bit subblocks $[a_Q, a_{Q-1}, \ldots, a_{Q-k_2+1}]$ in the information bit block included in a second target data stream, where $k_1$ and $k_2$ meet $k_1+k_2<Q$, and the second target data stream is a data stream with a second highest signal-to-noise ratio in the first to-be-decoded data stream;

obtaining second reconstructed information obtained after encoding and reconstructing the $k_2$ information bit subblocks $[a_Q, a_{Q-1}, \ldots, a_{Q-k_2+1}]$;

removing the second reconstructed information from the second to-be-decoded data stream;

obtaining, through decoding, $k_3$ information bit subblocks $[A_1, A_2, \ldots, A_{k_3}]$ in the information bit block included in a third target data stream, where $k_1$, $k_2$, and $k_3$ meet $k_1+k_2+k_3 \geq Q$, and the third target data stream is a data stream with a lowest signal-to-noise ratio in the first to-be-decoded data stream;

obtaining, based on the mapping relationship between the first order and the second order, $k_3$ information bit subblocks that are $[a_{k_1+1}, a_{k_1-1}, \ldots, a_{Q-k_2}]$ and that correspond to the $k_3$ information bit subblocks before mapping; and obtaining Q information bit subblocks that are $[a_1, a_2, \ldots, a_Q]$ and that are included in the information bit block.

In an implementation, the transceiver unit 1701 may be configured to receive the first data stream and the second data stream that are simultaneously sent by the first communication device and may include:

receiving the first data stream and the second data stream to an $n^{th}$ data stream that are simultaneously sent by the first communication device, where the $n^{th}$ data stream includes M $n^{th}$ encoded blocks, and the M $n^{th}$ encoded blocks are obtained by performing polar code encoding on M $n^{th}$ to-be-encoded blocks, Q information bit subblocks in each processed information bit block are placed into Q $n^{th}$ to-be-encoded blocks of the M $n^{th}$ to-be-encoded blocks in the first order.

Processing on each of the information bit blocks meets the following condition:

Q information bit subblocks in each of the information bit blocks are mapped from a binary field to a $2^w$ number system field, any mapped information bit block meets $[\bar{a}_1, \bar{a}_2, \ldots, \bar{a}_Q]$, where $\bar{a}_q$ is any information bit subblock in the any mapped information bit block, $\bar{a}_q$ is a $2^w$ number system sequence whose length is $K/wQ$, and $w$ is a positive integer greater than 1.

The any mapped information bit block and a corresponding information bit block after conversion meet the following relationship:

$$[\bar{A}_{n,1}, \bar{A}_{n,2}, \ldots, \bar{A}_{n,Q}] = [\bar{a}_1, \bar{a}_2, \ldots, \bar{a}_Q] * H_n, \text{ where}$$

$\bar{A}_{n,q}$ is an information bit subblock corresponding to after conversion, $H_n$ is a universal decoding matrix UDM of $K/w \times K/w$ in the $2^w$ number system field, n indicates an $n^{th}$ data stream, n meets $n \in [1, 2, \ldots, N]$, N is a total quantity of data streams sent by the first communication device, and N is a positive integer greater than 3.

A corresponding information bit block after $[\bar{A}_{n,1}, \bar{A}_{n,2}, \ldots, \bar{A}_{n,Q}]$ is demapped meets $[A_{n,1}, A_{n,2}, \ldots, A_{n,Q}]$, where $A_{n,Q}$ is a binary sequence whose length is K/Q.

In an implementation, any encoded block carries at least one information bit subblock and at most Q information bit subblocks, and the encoded block includes the first encoded block and the second encoded block.

In an implementation, each of the encoded blocks is sequentially arranged based on identifiers of the encoded blocks, and a $1^{st}$ encoded block carries one information bit subblock. A quantity of information bit blocks carried in the $1^{st}$ encoded block to a $Q^{th}$ encoded block increases by one in an arrangement order of the encoded blocks, and the $Q^{th}$ encoded block carries Q information bit subblocks. A quantity of information bit subblocks carried in a $(Q+1)^{th}$ encoded block to an $M^{th}$ encoded block decreases by one in the arrangement order of the encoded blocks, and the $M^{th}$ encoded block carries one information bit subblock.

In an implementation, Q is a quantization order of a code rate R, and Q is a positive integer. A code rate of an $i^{th}$ encoded block is $r_i = i \times R/Q$, and i meets $1 \leq i \leq Q$. A code rate of a $j^{th}$ encoded block is $r_j = (M-j+1) \times R/Q$, and j meets $Q+1 \leq j \leq M$.

Figure 18:
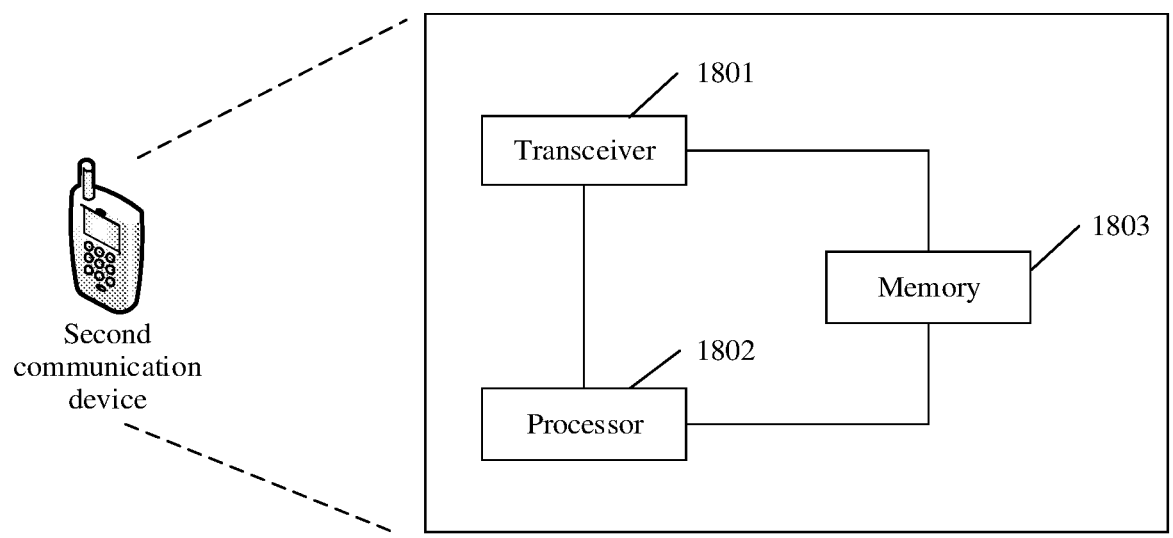
FIG. 18 is a schematic diagram of a structure of yet another communication device according to an embodiment.

In an implementation, related functions implemented by the units in FIG. 17 may be implemented by using a transceiver and a processor. FIG. 18 is a schematic diagram of a structure of yet another communication device according to an embodiment. The communication device may be a device (for example, a chip) that has a data processing function described in the embodiments. The communication device may include a transceiver 1801, at least one processor 1802, and a memory 1803. The transceiver 1801, the processor 1802, and the memory 1803 may be connected to each other through one or more communication buses or may be connected to each other in another manner.

The transceiver 1801 may be configured to send data or receive data. It may be understood that the transceiver 1801 is a general term and may include a receiver and a transmitter. For example, the receiver is configured to obtain an information bit block. For another example, the transmitter is configured to simultaneously send a first data stream and a second data stream.

The processor 1802 may be configured to process data of the communication device, or process data received by the transceiver 1801. For example, the processor 1802 may invoke program code stored in the memory 1803, to implement combined decoding on the plurality of received data. The processor 1802 may include one or more processors. For example, the processor 1802 may be one or more CPU, one or more NP, one or more hardware chips, or any combination thereof. When the processor 1802 is one CPU, the CPU may be a single-core CPU or may be a multi-core CPU.

The memory 1803 is configured to store the program code and the like. The memory 1803 may include a volatile memory, such as a RAM. The memory 1803 may also include a non-volatile memory, such as a ROM, a flash memory, a HDD, or an SSD. The memory 1803 may further include a combination of the foregoing types of memories.

The processor 1802 and the memory 1803 may be coupled through an interface or may be integrated together. This is not limited in this embodiment.

The transceiver 1801 and the processor 1802 may be configured to implement the data processing method in the embodiments.

The transceiver 1801 is configured to receive the first data stream and the second data stream that are simultaneously sent by a first communication device. The first data stream includes M first encoded blocks, and the second data stream includes M second encoded blocks.

The M first encoded blocks are obtained by performing polar code encoding on M first to-be-encoded blocks. The M first to-be-encoded blocks carry X information bit blocks, and each of the information bit blocks is divided into Q information bit subblocks. The Q information bit subblocks in each of the information bit blocks are placed into Q first to-be-encoded blocks of the M first to-be-encoded blocks in a first order. The first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located, q meets 1≤q≤Q, and M meets M=X+Q−1.

The M second encoded blocks are obtained by performing polar code encoding on M second to-be-encoded blocks. The Q information bit subblocks in each of the information bit blocks are placed into Q second to-be-encoded blocks of the M second to-be-encoded blocks in a second order. The second order and the first order meet a mapping relationship.

The processor 1802 is configured to perform combined decoding on the first data stream and the second data stream, to obtain decoded data.

In an implementation, the second order is that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

In an implementation, the first order and the second order meet the following mapping relationship:

$$[A_1, A_2, \ldots, A_{2^P}] = [0, 0, \ldots, 0, a_1, a_2, \ldots, a_Q] F^{\otimes (J+P)},$$
where $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q = 2^J$, P is a positive integer and meets $2^{P-1} \leq Q \leq 2^P$, and t meets $1 \leq t \leq 2^P$.

In an implementation, the processor 1802 may be configured to perform combined decoding on the first data stream and the second data stream to obtain decoded data and may include:

obtaining a first target data stream if a sum of channel capacities of the first data stream and the second data stream is greater than or equal to a code rate R, where the first target data stream is a data stream with a highest signal-to-noise ratio in a first to-be-decoded data stream, and the first to-be-decoded data stream includes the first data stream and the second data stream;

obtaining, through decoding, $k_1$ information bit subblocks $[a_1, a_2, \ldots, a_{k_1}]$ in one information bit block included in the first target data stream, where $k_1$ meets $1 \leq k \leq Q$;

obtaining first reconstructed information obtained after encoding and reconstructing the $k_1$ information bit subblocks $[a_1, a_2, \ldots, a_{k_1}]$;

removing the first reconstructed information from the first to-be-decoded data stream;

obtaining, through decoding, $k_2$ information bit subblocks $[a_{Q-k_2}, a_{Q-k_2+1}, \ldots, a_Q]$ in the information bit block included in a second target data stream, where $k_1$ and $k_2$ meet $1 \leq k_2 \leq Q$ and $k_1 + k_2 \geq Q$, and the second target data stream is a data stream with a lowest signal-to-noise ratio in the first to-be-decoded data stream; and obtaining Q information bit subblocks that are $[a_1, a_2, \ldots, a_Q]$ and that are included in the information bit block.

In an implementation, the transceiver 1801 may be configured to receive the first data stream and the second data stream that are simultaneously sent by the first communication device and may include:

receiving the first data stream, the second data stream, and a third data stream that are simultaneously sent by the first communication device, where the third data stream includes M third encoded blocks, the M third encoded blocks are obtained by performing polar code encoding on M third to-be-encoded blocks, the Q information bit subblocks in each of the information bit blocks are placed into Q third to-be-encoded blocks of the M third to-be-encoded blocks in a second order, and the second order used for the third to-be-encoded blocks is different from the second order used for the second to-be-encoded blocks.

The processor 1802 may be configured to perform combined decoding on the first data stream and the second data stream to obtain decoded data and may include:

obtaining a first target data stream if a sum of channel capacities of the first data stream, the second data stream, and the third data stream is greater than or equal to a code rate R, where the first target data stream is a data stream with a highest signal-to-noise ratio in a first to-be-decoded data stream, and the first to-be-decoded data stream includes the first data stream, the second data stream, and the third data stream;

obtaining, through decoding, $k_1$ information bit subblocks $[a_1, a_2, \ldots, a_{k_1}]$ in one information bit block included in the first target data stream, where $k_1$ meets $1 \leq k < Q$;

obtaining first reconstructed information obtained after encoding and reconstructing the $k_1$ information bit subblocks $[a_1, a_2, \ldots, a_{k_1}]$;

obtaining a second to-be-decoded data stream, where the second to-be-decoded data stream is a data stream obtained after the first reconstructed information is removed from the first to-be-decoded data stream;

obtaining, through decoding, $k_2$ information bit subblocks $[a_Q, a_{Q-1}, \ldots, a_{Q-k_2+1}]$ in the information bit block included in a second target data stream, where $k_1$ and $k_2$ meet $k_1 + k_2 < Q$, and the second target data stream is a data stream with a second highest signal-to-noise ratio in the first to-be-decoded data stream;

obtaining second reconstructed information obtained after encoding and reconstructing the $k_2$ information bit subblocks $[a_Q, a_{Q-1}, \ldots, a_{Q-k_2+1}]$;

removing the second reconstructed information from the second to-be-decoded data stream;

obtaining, through decoding, $k_3$ information bit subblocks $[A_1, A_2, \ldots, A_{k_3}]$ in the information bit block included in a third target data stream, where $k_1$, $k_2$, and $k_3$ meet $k_1 + k_2 + k_3 \geq Q$, and the third target data stream is a data stream with a lowest signal-to-noise ratio in the first to-be-decoded data stream;

obtaining, based on the mapping relationship between the first order and the second order, $k_3$ information bit subblocks that are $[a_{k_1+1}, a_{k_1+1}, \ldots, a_{Q-k_2}]$ and that correspond to the $k_3$ information bit subblocks before mapping; and obtaining Q information bit subblocks that are $[a_1, a_2, \ldots, a_Q]$ and that are included in the information bit block.

In an implementation, the transceiver 1801 may be configured to receive the first data stream and the second data stream that are simultaneously sent by the first communication device and may include:

receiving the first data stream and the second data stream to an $n^{th}$ data stream that are simultaneously sent by the first communication device, where the $n^{th}$ data stream includes M $n^{th}$ encoded blocks, and the M $n^{th}$ encoded blocks are obtained by performing polar code encoding on M $n^{th}$ to-be-encoded blocks, Q information bit subblocks in each processed information bit block are placed into Q $n^{th}$ to-be-encoded blocks of the M $n^{th}$ to-be-encoded blocks in the first order.

Processing on each of the information bit blocks meets the following condition:

Q information bit subblocks in each of the information bit blocks are mapped from a binary field to a $2^w$ number system field, any mapped information bit block meets $[\bar{a}_1, \bar{a}_2, \ldots, \bar{a}_Q]$, where $\bar{a}_q$ is any information bit subblock in the any mapped information bit block, $\bar{a}_q$ is a $2^w$ number system sequence whose length is K/wQ, and w is a positive integer greater than 1.

The any mapped information bit block and a corresponding information bit block after conversion meet the following relationship:

$$[\bar{A}_{n,1}, \bar{A}_{n,2}, \ldots, \bar{A}_{n,Q}] = [\bar{a}_1, \bar{a}_2, \ldots, \bar{a}_Q] * H_n, \text{ where}$$

$\bar{A}_{n,q}$ is an information bit subblock corresponding to after conversion, $H_n$ is a universal decoding matrix UDM of K/w×K/w in the $2^w$ number system field, n indicates an $n^{th}$ data stream, n meets n∈[1, 2, ..., N], N is a total quantity of data streams sent by the first communication device, and N is a positive integer greater than 3.

A corresponding information bit block after $[\bar{A}_{n,1}, \bar{A}_{n,2}, \ldots, \bar{A}_{n,Q}]$ is demapped meets $[A_{n,1}, A_{n,2}, \ldots, A_{n,Q}]$, where $A_{n,Q}$ is a binary sequence whose length is K/Q.

In an implementation, any encoded block carries at least one information bit subblock and at most Q information bit subblocks, and the encoded block includes the first encoded block and the second encoded block.

In an implementation, each of the encoded blocks is sequentially arranged based on identifiers of the encoded blocks, and a $1^{st}$ encoded block carries one information bit subblock. A quantity of information bit blocks carried in the $1^{st}$ encoded block to a $Q^{th}$ encoded block increases by one in an arrangement order of the encoded blocks, and the $Q^{th}$ encoded block carries Q information bit subblocks. A quantity of information bit subblocks carried in a $(Q+1)^{th}$ encoded block to an $M^{th}$ encoded block decreases by one in the arrangement order of the encoded blocks, and the $M^{th}$ encoded block carries one information bit subblock.

In an implementation, Q is a quantization order of a code rate R, and Q is a positive integer. A code rate of an $i^{th}$ encoded block is $r_i = i \times R/Q$, and i meets $1 \le i \le Q$. A code rate of a $j^{th}$ encoded block is $r_j = (M-j+1) \times R/Q$, and j meets $Q+1 \le j \le M$.

An embodiment may provide a communication apparatus. The communication apparatus includes an input interface, an output interface, and a logic circuit. The input interface is configured to input to-be-processed data. The logic circuit processes the to-be-processed data according to the method in the foregoing method embodiments, to obtain processed data. The output interface is configured to output the processed data.

In an implementation, the to-be-processed data input by the input interface includes the to-be-encoded blocks and information bit subblocks in each to-be-encoded block in the foregoing method embodiments. The to-be-encoded blocks include a first to-be-encoded block and a second to-be-encoded block to an $n^{th}$ to-be-encoded block.

In an implementation, the logic circuit may process the to-be-processed data according to the method in the foregoing embodiments to obtain processed data and may include:

The logic circuit sorts the information bit subblocks in the to-be-encoded block according to the method in the foregoing method embodiments, and encodes the to-be-encoded block, to obtain an encoded block corresponding to each to-be-encoded block. M encoded blocks form one data stream.

In an implementation, the processed data output by the output interface includes a plurality of data streams in the foregoing method embodiments. The plurality of data streams may include a first data stream and a second data stream to an $n^{th}$ data stream.

In an implementation, the to-be-processed data input by the input interface includes a plurality of data streams in the foregoing method embodiments. The plurality of data streams may include a first data stream and a second data stream to an $n^{th}$ data stream.

In an implementation, the logic circuit may process the to-be-processed data according to the method in the foregoing embodiments to obtain processed data and may include:

The logic circuit performs combined decoding on the plurality of data streams according to the method in the foregoing method embodiments, to obtain a to-be-encoded block corresponding to each data stream.

In an implementation, the processed data output by the output interface includes the to-be-encoded blocks and information bit subblocks in each to-be-encoded block in the foregoing method embodiments. The to-be-encoded blocks include a first to-be-encoded block and a second to-be-encoded block to an $n^{th}$ to-be-encoded block.

An embodiment may provide a communication system. The communication system includes the first communication device and the second communication device described in the foregoing embodiments.

An embodiment may provide a non-transitory computer-readable storage medium. The non-transitory computer-readable storage medium may store a program or instructions. When the program is run or the instructions are run on a computer, the computer is enabled to perform the data processing method in the embodiments.

An embodiment may provide a chip or a chip system. The chip or the chip system includes at least one processor and an interface. The interface is interconnected to the at least one processor through a line. The at least one processor is configured to run a computer program or instructions, to perform the data processing method in the embodiments.

The interface in the chip may be an input/output interface, a pin, a circuit, or the like.

The chip system in the foregoing aspects may be a SOC, a baseband chip, or the like. The baseband chip may include a processor, a channel encoder, a digital signal processor, a modem, an interface module, and the like.

In an implementation, the chip or the chip system may further include at least one memory that may store instructions. The memory may be a storage unit inside the chip, for example, a register or a cache, or may be a storage unit (for example, a read-only memory or a random access memory) of the chip.

All or some of the foregoing embodiments may be implemented by using software, hardware, firmware, or any combination thereof. When the software is used to implement the embodiments, all or some of the embodiments may be implemented in a form of a computer program product.

The computer program product includes one or more computer instructions. When the computer instructions are loaded and executed on a computer, the procedure or functions according to the embodiments are all or partially generated. The computer may be a general-purpose computer, a dedicated computer, a computer network, or another programmable apparatus. The computer instructions may be stored in a non-transitory computer-readable storage medium or may be transmitted from a non-transitory computer-readable storage medium to another non-transitory computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The non-transitory computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a high-density digital video disc (DVD)), a semiconductor medium (for example, an SSD), or the like.

A person of ordinary skill in the art may be aware that, in combination with the examples described in the embodiments, units and algorithm steps can be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and constraint conditions of the solutions. A person skilled in the art may use different methods to implement the described functions for each particular application, but it should not be considered that the implementation goes beyond the scope of the embodiments.

The foregoing descriptions are merely implementations, but are not intended to limit the scope of the embodiments. Any variation or replacement readily figured out by a person skilled in the art shall fall within the scope of the embodiments.

What is claimed is:

1. A data processing method, applied to a first communication device, comprising:
obtaining X information bit blocks, wherein one information bit block comprises K information bits, one information bit block is divided into Q information bit subblocks, and one information bit subblock is a binary sequence whose length is K/Q;
placing Q information bit subblocks in each of the information bit blocks into Q first to-be-encoded blocks of M first to-be-encoded blocks in a first order, wherein the first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located, q meets $1 \leq q \leq Q$, and M meets M=X+Q−1;
separately performing polar code encoding on the M first to-be-encoded blocks, to obtain M first encoded blocks;
placing the Q information bit subblocks in each of the information bit blocks into Q second to-be-encoded blocks of M second to-be-encoded blocks in a second order, wherein the second order and the first order meet a mapping relationship;
separately performing polar code encoding on the M second to-be-encoded blocks, to obtain M second encoded blocks; and
simultaneously sending a first data stream and a second data stream to a second communication device, wherein the first data stream comprises the M first encoded blocks, and the second data stream comprises the M second encoded blocks.

2. The data processing method according to claim 1, wherein the second order is that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

3. The data processing method according to claim 1, wherein the first order and the second order meet the following mapping relationship:

$$[A_1, A_2, \ldots, A_{2^P}] = [0, 0, \ldots, 0, a_1, a_2, \ldots, a_Q] F^{\otimes(J+P)},$$
wherein $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q = 2^J$, P is a positive integer and meets $2^{P-1} \leq Q \leq 2^P$, and t meets $1 \leq t \leq 2^P$.

4. The data processing method according to claim 1, further comprising:
placing the Q information bit subblocks in each of the information bit blocks into Q third to-be-encoded blocks of M third to-be-encoded blocks in a second order, wherein the second order used for the third to-be-encoded blocks is different from the second order used for the second to-be-encoded blocks; and
separately performing polar code encoding on the M third to-be-encoded blocks, to obtain M third encoded blocks; and
simultaneously sending the first data stream and the second data stream to the second communication device further comprises:
simultaneously sending the first data stream, the second data stream, and a third data stream to the second communication device, wherein the third data stream comprises the M third encoded blocks.

5. The data processing method according to claim 4, further comprising:
mapping the Q information bit subblocks in each of the information bit blocks from a binary field to a $2^w$ number system field, to obtain any mapped information bit block $[\bar{a}_1, \bar{a}_2, \ldots, \bar{a}_Q]$, wherein $\bar{a}_q$ is any information bit subblock in the any mapped information bit block, $\bar{a}_q$ is a sequence whose length is K/wQ, and w is a positive integer greater than 1;
converting Q information bit subblocks in each mapped information bit block, wherein Q information bit subblocks in any mapped information bit block and corresponding Q information bit subblocks after conversion meet the following relationship:

$$[\bar{A}_{n,1}, \bar{A}_{n,2}, \ldots, \bar{A}_{n,Q}] = [\bar{a}_1, \bar{a}_2, \ldots, \bar{a}_Q] * H_n, \text{ wherein}$$

$\bar{A}_{n,q}$ is an information bit subblock corresponding to $\bar{a}_q$ after conversion, $H_n$ is a universal decoding matrix (UDM) of K/w×K/w in the $2^w$ number system field, n indicates an $n^{th}$ data stream, n meets $n \in [1, 2, \ldots, N]$, N is a total quantity of data streams sent by the first communication device, and N is a positive integer greater than 3;

performing demapping on $[\overline{A}_{n,1}, \overline{A}_{n,2}, \ldots, \overline{A}_{n,Q}]$, to obtain an information bit block that is $[A_{n,1}, A_{n,2}, \ldots, A_{n,Q}]$ and that corresponds to $[\overline{A}_{n,1}, \overline{A}_{n,2}, \ldots, \overline{A}_{n,Q}]$ after demapping, wherein $A_{n,Q}$ is a binary sequence whose length is K/Q;

placing Q information bit subblocks in any demapped information bit block into M $n^{th}$ to-be-encoded blocks in the first order; and separately performing polar code encoding on the M $n^{th}$ to-be-encoded blocks, to obtain M $n^{th}$ encoded blocks; and simultaneously sending the first data stream and the second data stream to the second communication device further comprises:

simultaneously sending the first data stream and the second data stream to the $n^{th}$ data stream to the second communication device, wherein the $n^{th}$ data stream comprises the M $n^{th}$ encoded blocks.

6. The data processing method according to claim 1, wherein any of the encoded blocks carries at least one information bit subblock and at most Q information bit subblocks, and the encoded block comprises the first encoded block and the second encoded block.

7. The data processing method according to claim 6, wherein each of the encoded blocks is sequentially arranged based on identifiers of the encoded blocks, and a $1^{st}$ encoded block carries one information bit subblock; a quantity of information bit blocks carried in the $1^{st}$ encoded block to a $Q^{th}$ encoded block increases by one in an arrangement order of the encoded blocks, and the $Q^{th}$ encoded block carries Q information bit subblocks; and a quantity of information bit subblocks carried in a $(Q+1)^{th}$ encoded block to an $M^{th}$ encoded block decreases by one in the arrangement order of the encoded blocks, and the $M^{th}$ encoded block carries one information bit subblock.

8. The data processing method according to claim 7, wherein Q is a quantization order of a code rate R, and Q is a positive integer; a code rate of an $i^{th}$ encoded block is $r_i = i \times R/Q$, and i meets $1 \leq i \leq Q$; and a code rate of a $j^{th}$ encoded block is $r_j = (M-j+1) \times R/Q$, and j meets $Q+1 \leq j \leq M$.

9. A data processing method, applied to a second communication device, comprising:

receiving a first data stream and a second data stream that are simultaneously sent by a first communication device, wherein the first data stream comprises M first encoded blocks, the second data stream comprises M second encoded blocks, the M first encoded blocks are obtained by performing polar code encoding on M first to-be-encoded blocks, the M first to-be-encoded blocks carry X information bit blocks, each of the information bit blocks is divided into Q information bit subblocks, the Q information bit subblocks in each of the information bit blocks are placed into Q first to-be-encoded blocks of the M first to-be-encoded blocks in a first order, the first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located, q meets $1 \leq q \leq Q$, M meets $M=X+Q-1$, the M second encoded blocks are obtained by performing polar code encoding on M second to-be-encoded blocks, the Q information bit subblocks in each of the information bit blocks are placed into Q second to-be-encoded blocks of the M second to-be-encoded blocks in a second order, and the second order and the first order meet a mapping relationship; and performing combined decoding on the first data stream and the second data stream, to obtain decoded data.

10. The data processing method according to claim 9, wherein the second order is that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

11. The data processing method according to claim 9, wherein the first order and the second order meet the following mapping relationship:

$$[A_1, A_2, \ldots, A_{2^P}] = [0, 0, \ldots, 0, a_1, a_2, \ldots, a_Q]F^{\otimes(J+P)},$$

wherein $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q = 2^J$, P is a positive integer and meets $2^{P-1} \leq Q \leq 2^P$, and t meets $1 \leq t \leq 2^P$.

12. The data processing method according to claim 9, wherein performing the combined decoding on the first data stream and the second data stream; to obtain decoded data further comprises:

obtaining a first target data stream when a sum of channel capacities of the first data stream and the second data stream is greater than or equal to a code rate R, wherein the first target data stream is a data stream with a highest signal-to-noise ratio in a first to-be-decoded data stream, and the first to-be-decoded data stream comprises the first data stream and the second data stream;

obtaining, through decoding, $k_1$ information bit subblocks $[a_1, a_2, \ldots, a_{k_1}]$ in one information bit block comprised in the first target data stream, wherein $k_1$ meets $1 \leq k_1 \leq Q$;

obtaining first reconstructed information obtained after encoding and reconstructing the $k_1$ information bit subblocks $[a_1, a_2, \ldots, a_{k_1}]$;

removing the first reconstructed information from the first to-be-decoded data stream;

obtaining, through decoding, $k_2$ information bit subblocks $[a_{Q-k_2}, a_{Q-k_2+1}, \ldots, a_Q]$ in the information bit block comprised in a second target data stream, wherein $k_1$ and $k_2$ meet $1 \leq k_2 \leq Q$ and $k_1 + k_2 \geq Q$, and the second target data stream is a data stream with a lowest signal-to-noise ratio in the first to-be-decoded data stream; and obtaining Q information bit subblocks that are $[a_1, a_2, \ldots, a_Q]$ and that are comprised in the information bit block.

13. The data processing method according to claim 9, wherein receiving the first data stream and the second data stream that are simultaneously sent by the first communication device further comprises:

receiving the first data stream, the second data stream, and a third data stream that are simultaneously sent by the first communication device, wherein the third data stream comprises M third encoded blocks, the M third encoded blocks are obtained by performing polar code encoding on M third to-be-encoded blocks, the Q information bit subblocks in each of the information bit blocks are placed into Q third to-be-encoded blocks of the M third to-be-encoded blocks in a second order, and the second order used for the third to-be-encoded blocks is different from the second order used for the second to-be-encoded blocks; and performing the combined decoding on the first data stream and the second data stream to obtain decoded data further comprises:

obtaining a first target data stream when a sum of channel capacities of the first data stream, the second data stream, and the third data stream is greater than or equal to a code rate R, wherein the first target data stream is a data stream with a highest signal-to-noise ratio in a first to-be-decoded data stream, and the first to-be-decoded data stream comprises the first data stream, the second data stream, and the third data stream;

obtaining, through decoding, $k_1$ information bit subblocks $[a_1, a_2, \ldots, a_{k_1}]$ in one information bit block comprised in the first target data stream, wherein $k_1$ meets $1 \leq k_1 < Q$;

obtaining first reconstructed information obtained after encoding and reconstructing the $k_1$ information bit subblocks $[a_1, a_2, \ldots, a_{k_1}]$;

obtaining a second to-be-decoded data stream, wherein the second to-be-decoded data stream is a data stream obtained after the first reconstructed information is removed from the first to-be-decoded data stream;

obtaining, through decoding, $k_2$ information bit subblocks $[a_Q, a_{Q-1}, \ldots, a_{Q-k_2+1}]$ in the information bit block comprised in a second target data stream, wherein $k_1$ and $k_2$ meet $k_1+k_2 < Q$, and the second target data stream is a data stream with a second highest signal-to-noise ratio in the first to-be-decoded data stream;

obtaining second reconstructed information obtained after encoding and reconstructing the $k_2$ information bit subblocks $[a_Q, a_{Q-1}, \ldots, a_{Q-k_2+1}]$;

removing the second reconstructed information from the second to-be-decoded data stream;

obtaining, through decoding, $k_3$ information bit subblocks $[A_1, A_2, \ldots, A_{k_3}]$ in the information bit block comprised in a third target data stream, wherein $k_1$, $k_2$, and $k_3$ meet $k_1+k_2+k_3 \geq Q$, and the third target data stream is a data stream with a lowest signal-to-noise ratio in the first to-be-decoded data stream;

obtaining, based on the mapping relationship between the first order and the second order, $k_3$ information bit subblocks that are $[a_{k_1+1}, a_{k_1+1}, \ldots, a_{Q-k_2}]$ and that correspond to the $k_3$ information bit subblocks before mapping; and obtaining Q information bit subblocks that are $[a_1, a_2, \ldots, a_Q]$ and that are comprised in the information bit block.

14. The data processing method according to claim 9, wherein receiving the first data stream and the second data stream that are simultaneously sent by the first communication device further comprises:

receiving the first data stream and the second data stream to an $n^{th}$ data stream that are simultaneously sent by the first communication device, wherein the $n^{th}$ data stream comprises M $n^{th}$ encoded blocks, and the M $n^{th}$ encoded blocks are obtained by performing polar code encoding on M $n^{th}$ to-be-encoded blocks, Q information bit subblocks in each processed information bit block are placed into Q $n^{th}$ to-be-encoded blocks of the M $n^{th}$ to-be-encoded blocks in the first order;

processing on each of the information bit blocks meets the following condition:

Q information bit subblocks in each of the information bit blocks are mapped from a binary field to a $2^w$ number system field, any mapped information bit block meets $[\bar{a}_1, \bar{a}_2, \ldots, \bar{a}_Q]$, wherein $\bar{a}_q$ is any information bit subblock in the any mapped information bit block, $\bar{a}_q$ is a $2^w$ number system sequence whose length is K/wQ, and w is a positive integer greater than 1;

the any mapped information bit block and a corresponding information bit block after conversion meet the following relationship:

$[\bar{A}_{n,1}, \bar{A}_{n,2}, \ldots, \bar{A}_{n,Q}] = [\bar{a}_1, \bar{a}_2, \ldots, \bar{a}_Q] * H_n$, wherein $\bar{A}_{n,q}$ is an information bit subblock corresponding to $\bar{a}_q$ after conversion, $H_n$ is a universal decoding matrix (UDM) of K/w×K/w in the $2^w$ number system field, n indicates the $n^{th}$ data stream, n meets $n \in [1, 2, \ldots, N]$, N is a total quantity of data streams sent by the first communication device, and N is a positive integer greater than 3; and a corresponding information bit block after $[\bar{A}_{n,1}, \bar{A}_{n,2}, \ldots, \bar{A}_{n,Q}]$ is demapped meets $[A_{n,1}, A_{n,2}, \ldots, A_{n,Q}]$, wherein $A_{n,Q}$ is a binary sequence whose length is K/Q.

15. The data processing method according to claim 9, wherein any of the encoded blocks carries at least one information bit subblock and at most Q information bit subblocks, and the encoded block comprises the first encoded block and the second encoded block.

16. The data processing method according to claim 15, wherein each of the encoded blocks is sequentially arranged based on identifiers of the encoded blocks, and a $1^{st}$ encoded block carries one information bit subblock; a quantity of information bit blocks carried in the $1^{st}$ encoded block to a $Q^{th}$ encoded block increases by one in an arrangement order of the encoded blocks, and the $Q^{th}$ encoded block carries Q information bit subblocks; and a quantity of information bit subblocks carried in a $(Q+1)^{th}$ encoded block to an $M^{th}$ encoded block decreases by one in the arrangement order of the encoded blocks, and the $M^{th}$ encoded block carries one information bit subblock.

17. The data processing method according to claim 16, wherein Q is a quantization order of a code rate R, and Q is a positive integer; a code rate of an $i^{th}$ encoded block is $r_i = i \times R/Q$, and i meets $1 \leq i \leq Q$; and a code rate of a $j^{th}$ encoded block is $r_j = (M-j+1) \times R/Q$, and j meets $Q+1 \leq j \leq M$.

18. A communication system, comprising:

a first communication device, configured to perform:

obtaining X information bit blocks, wherein one information bit block comprises K information bits, one information bit block is divided into Q information bit subblocks, and one information bit subblock is a binary sequence whose length is K/Q;

placing Q information bit subblocks in each of the information bit blocks into Q first to-be-encoded blocks of M first to-be-encoded blocks in a first order, wherein the first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located, q meets $1 \leq q \leq Q$, and M meets $M = X+Q-1$;

separately performing polar code encoding on the M first to-be-encoded blocks, to obtain M first encoded blocks;

placing the Q information bit subblocks in each of the information bit blocks into Q second to-be-encoded blocks of M second to-be-encoded blocks in a second order, wherein the second order and the first order meet a mapping relationship;

separately performing polar code encoding on the M second to-be-encoded blocks, to obtain M second encoded blocks; and simultaneously sending a first data stream and a second data stream to a second communication device, wherein the first data stream comprises the M first encoded blocks, and the second data stream comprises the M second encoded blocks; and a second communication device, configured to perform:

receiving a first data stream and a second data stream that are simultaneously sent by the first communication device, wherein the first data stream comprises M first encoded blocks, the second data stream comprises M second encoded blocks, the M first encoded blocks are obtained by performing polar code encoding on M first to-be-encoded blocks, the M first to-be-encoded blocks carry X information bit blocks, each of the information bit blocks is divided into Q information bit subblocks, the Q information bit subblocks in each of the information bit blocks are placed into Q first to-be-encoded blocks of the M first to-be-encoded blocks in a first order, the first order is that a $q^{th}$ information bit subblock in each of the information bit blocks is located at a $(q-1)*K/Q+1^{th}$ reliable location to a $q*K/Q^{th}$ reliable location in a first to-be-encoded block in which the $q^{th}$ information bit subblock is located, q meets $1 \leq q \leq Q$, M meets $M=X+Q-1$, the M second encoded blocks are obtained by performing polar code encoding on M second to-be-encoded blocks, the Q information bit subblocks in each of the information bit blocks are placed into Q second to-be-encoded blocks of the M second to-be-encoded blocks in a second order, and the second order and the first order meet a mapping relationship; and performing combined decoding on the first data stream and the second data stream, to obtain decoded data.

19. The communication system according to claim 18, wherein the second order is that a $q^{th}$ information bit subblock in each of the information bit blocks is located at a $(Q-q)*K/Q+1^{th}$ reliable location to a $(Q-q+1)*K/Q^{th}$ reliable location in a second to-be-encoded block in which the $q^{th}$ information bit subblock is located.

20. The communication system according to claim 18, wherein the first order and the second order meet the following mapping relationship:

$$[A_1, A_2, \ldots, A_{2^P}] = [0, 0, \ldots, 0, a_1, a_2, \ldots, a_Q] F^{\otimes(J+P)},$$

wherein $a_q$ is any information bit subblock of Q information bit subblocks in any information bit block, $A_t$ is an information bit subblock corresponding to the any information bit subblock after mapping, F is a polar code generator matrix, J is a positive integer and meets $K/Q=2^J$, P is a positive integer and meets $2^{P-1} \leq Q \leq 2^P$, and t meets $1 \leq t \leq 2^P$.

* * * * *